US010352967B2

(12) United States Patent
Steuer et al.

(10) Patent No.: US 10,352,967 B2
(45) Date of Patent: Jul. 16, 2019

(54) NON-CONTACT ELECTRICAL PARAMETER MEASUREMENT SYSTEMS

(71) Applicant: Fluke Corporation, Everett, WA (US)

(72) Inventors: Ronald Steuer, Hinterbruhl (AT); Peter Radda, Vitis (AT); Ricardo Rodriguez, Mill Creek, WA (US); David L. Epperson, Everett, WA (US); Patrick Scott Hunter, Seattle, WA (US); Paul Andrew Ringsrud, Langley, WA (US); Clark N. Huber, Everett, WA (US); Christian Karl Schmitzer, Brunn/Gebirge (AT); Jeffrey Worones, Seattle, WA (US); Michael F. Gallavan, Edmonds, WA (US)

(73) Assignee: FLUKE CORPORATION, Everett, WA (US)

( * ) Notice: Subject to any disclaimer, the term of this patent is extended or adjusted under 35 U.S.C. 154(b) by 82 days.

(21) Appl. No.: 15/625,745

(22) Filed: Jun. 16, 2017

(65) Prior Publication Data
US 2018/0136257 A1 May 17, 2018

Related U.S. Application Data

(60) Provisional application No. 62/421,124, filed on Nov. 11, 2016.

(51) Int. Cl.
G01R 15/12 (2006.01)
G01R 15/20 (2006.01)
(Continued)

(52) U.S. Cl.
CPC ............ G01R 15/125 (2013.01); G01R 1/22 (2013.01); G01R 15/14 (2013.01); G01R 15/16 (2013.01);
(Continued)

(58) Field of Classification Search
CPC .... G01R 1/04; G01R 1/06788; G01R 31/021; G01R 1/20; G01R 15/186; G01R 15/12;
(Continued)

(56) References Cited

U.S. PATENT DOCUMENTS 4,074,193 A 2/1978 Kohler
4,173,970 A 11/1979 Momin
(Continued)

FOREIGN PATENT DOCUMENTS

DE 23 63 933 A1 6/1975
EP 0 218 221 A2 4/1987
(Continued)

OTHER PUBLICATIONS

Hioki, "3258 : Safety HiTESTER," Revised Edition 5, Hioki E. E. Corporation, Nagano Japan, 2 pages.
(Continued)

Primary Examiner — Vinh P Nguyen
(74) Attorney, Agent, or Firm — Seed IP Law Group LLP

(57) ABSTRACT

Systems and methods provide measurement of alternating current (AC) electrical parameters in an insulated wire without requiring a galvanic connection between the insulated wire and a test probe. Measurement systems or instruments may include a housing that includes both a non-contact voltage sensor and a non-contact current sensor. The measurement system obtains measurements from the voltage sensor and the current sensor during a measurement time interval and processes the measurements to determine AC electrical parameters of the insulated wire. The AC electrical parameters may be presented to an operator via a visual indicator device (e.g., display, lights). The AC electrical parameters may additionally or alternatively be communicated to an external device via a wired and/or wireless communications interface. The measurement system may
(Continued)

include an alignment feedback sensor that provides feedback to a user regarding the mechanical alignment of the insulated wire relative to the voltage sensor and the current sensor.

20 Claims, 45 Drawing Sheets

(51) Int. Cl.
    *G01R 15/16*    (2006.01)
    *G01R 19/25*    (2006.01)
    *G01R 1/22*    (2006.01)
    *G01R 15/14*    (2006.01)
    *G01R 19/00*    (2006.01)

(52) U.S. Cl.
    CPC ........... *G01R 15/207* (2013.01); *G01R 19/00* (2013.01); *G01R 19/25* (2013.01)

(58) Field of Classification Search
    CPC .... G01R 15/18; G01R 22/065; G01R 15/125; G01R 15/202; G01R 19/165; G01R 31/02; G01R 31/025; G01R 15/16; G01R 15/181; G01R 15/00; G01R 15/148; G01R 19/00; G01R 19/155; G01R 19/25; G01R 1/07; G01R 31/3682; G01R 19/0092; G01R 19/16595; G01R 1/02; G01R 21/006; G01R 27/02; G01R 31/045; G01R 31/3277; G01R 13/00; G01R 15/08; G01R 15/142; G01R 1/0416; G01R 21/1331; G01R 22/063; G01R 22/10; G01R 23/02; G01R 31/022; G01R 31/024; G01R 31/086; G01R 31/3842; H04B 10/808; G06F 11/221; G06F 1/263; G06F 1/266; G06F 1/3203; G08C 17/02; G08C 17/04; G08C 23/04; H01F 7/1877; H02M 2001/0009
    See application file for complete search history.

(56) References Cited

U.S. PATENT DOCUMENTS

| | | | |
|---|---|---|---|
| 4,584,523 A | 4/1986 | Elabd | |
| 4,689,752 A | 8/1987 | Fernandes et al. | |
| 4,709,339 A * | 11/1987 | Fernandes | G01K 1/024 |
| | | | 324/127 |
| 5,124,642 A | 6/1992 | Marx | |
| 5,349,289 A | 9/1994 | Shirai | |
| 5,473,244 A | 12/1995 | Libove et al. | |
| 5,583,444 A | 12/1996 | Nakamura et al. | |
| 5,973,501 A | 10/1999 | Reichard | |
| 6,014,027 A | 1/2000 | Reichard | |
| 6,043,640 A | 3/2000 | Lauby et al. | |
| 6,091,237 A * | 7/2000 | Chen | G01R 15/125 |
| | | | 324/126 |
| 6,118,270 A | 9/2000 | Singer et al. | |
| 6,177,800 B1 | 1/2001 | Kubby et al. | |
| 6,664,708 B2 | 12/2003 | Shlimak et al. | |
| 6,812,685 B2 | 11/2004 | Steber et al. | |
| 6,825,649 B2 | 11/2004 | Nakano | |
| 6,995,565 B1 | 2/2006 | Tulloch et al. | |
| 7,084,643 B2 | 8/2006 | Howard et al. | |
| 7,164,263 B2 | 1/2007 | Yakymyshyn et al. | |
| 7,466,145 B2 | 12/2008 | Yanagisawa | |
| 8,054,061 B2 | 11/2011 | Prance et al. | |
| 8,222,886 B2 | 7/2012 | Yanagisawa | |
| 8,330,449 B2 * | 12/2012 | Greenberg | G01R 15/12 |
| | | | 324/115 |
| 8,680,845 B2 | 3/2014 | Carpenter et al. | |
| 8,755,210 B2 | 6/2014 | Kangas | |
| 8,803,506 B2 | 8/2014 | Yanagisawa | |
| 9,063,184 B2 | 6/2015 | Carpenter et al. | |
| 9,201,100 B2 | 12/2015 | Yanagisawa | |
| 9,615,147 B2 | 4/2017 | Radosavljevic et al. | |
| 9,651,584 B2 | 5/2017 | Gunn | |
| 9,915,689 B2 | 3/2018 | Matsuura et al. | |
| 2002/0167303 A1 | 11/2002 | Nakano | |
| 2007/0086130 A1 | 4/2007 | Sorensen | |
| 2009/0058398 A1 | 3/2009 | Ibuki | |
| 2010/0060300 A1 | 3/2010 | Müller et al. | |
| 2010/0090682 A1 | 4/2010 | Armstrong | |
| 2010/0283539 A1 | 11/2010 | Yanagisawa | |
| 2012/0068716 A1 | 3/2012 | Reed et al. | |
| 2012/0200291 A1 | 8/2012 | Carpenter et al. | |
| 2012/0259565 A1 | 10/2012 | Oshima et al. | |
| 2012/0274141 A1 | 11/2012 | Shibahara | |
| 2012/0290240 A1 | 11/2012 | Fukui | |
| 2013/0076343 A1 | 3/2013 | Carpenter et al. | |
| 2013/0124136 A1 | 5/2013 | Neeley et al. | |
| 2013/0147464 A1 | 6/2013 | Tan | |
| 2014/0035607 A1 | 2/2014 | Heydron et al. | |
| 2014/0062459 A1 | 3/2014 | El-Essawy et al. | |
| 2014/0062496 A1 | 3/2014 | Kwon et al. | |
| 2014/0268953 A1 | 9/2014 | Patel et al. | |
| 2015/0002138 A1 * | 1/2015 | Fox | G01R 15/142 |
| | | | 324/149 |
| 2015/0042320 A1 | 2/2015 | Cadugan et al. | |
| 2015/0305805 A1 | 10/2015 | Xiao et al. | |
| 2016/0047846 A1 | 2/2016 | Sharma et al. | |
| 2016/0080666 A1 | 3/2016 | Stuart et al. | |
| 2016/0080667 A1 | 3/2016 | Stuart et al. | |
| 2016/0109486 A1 | 4/2016 | Yanagisawa | |
| 2016/0119592 A1 | 4/2016 | Stuart et al. | |
| 2016/0187389 A1 | 6/2016 | Kshirsagar et al. | |
| 2017/0082664 A1 | 3/2017 | Yamada | |

FOREIGN PATENT DOCUMENTS

| | | |
|---|---|---|
| EP | 1 249 706 B1 | 9/2007 |
| JP | 6-28748 U | 4/1994 |
| JP | 9-184866 A | 7/1997 |
| JP | 2000-147035 A | 5/2000 |
| JP | 2006-242855 A | 9/2006 |
| JP | 2007-163414 A | 6/2007 |
| JP | 2007-163415 A | 6/2007 |
| JP | 2007-212204 A | 8/2007 |
| JP | 2007-256141 A | 10/2007 |
| JP | 2008-2925 A | 1/2008 |
| JP | 2008-14644 A | 1/2008 |
| JP | 2008-14645 A | 1/2008 |
| JP | 2008-20270 A | 1/2008 |
| JP | 2008-215900 A | 9/2008 |
| JP | 2008-261646 A | 10/2008 |
| JP | 2008-261783 A | 10/2008 |
| JP | 2008-261785 A | 10/2008 |
| JP | 2009-168696 A | 7/2009 |
| JP | 2010-25778 A | 2/2010 |
| JP | 2010-286347 A | 12/2010 |
| JP | 2011-122860 A | 6/2011 |
| JP | 2012-47677 A | 3/2012 |
| JP | 2012-137496 A | 7/2012 |
| JP | 2012-177571 A | 9/2012 |
| JP | 2014-44168 A | 3/2014 |
| JP | 2014-44169 A | 3/2014 |
| JP | 2014-106220 A | 6/2014 |
| JP | 2015-111087 A | 6/2015 |
| JP | 2016-3997 A | 1/2016 |

OTHER PUBLICATIONS

Huber et al., "Non-Contact Voltage Measurement Systems," U.S. Appl. No. 62/421,124, filed Nov. 11, 2016, 122 pages.
Mitchell Instrument Company Inc., clipping from the Mitchell Catalogue, undated, 1 page.
Neeley et al., "Maintenance Management Systems and Methods," U.S. Appl. No. 61/514,842, filed Aug. 3, 2011, 22 pages.
Ringsrud et al., "Non-Contact Voltage Measurement System," U.S. Appl. No. 15/345,256, filed Nov. 7, 2016, 39 pages.
Rodriguez et al., "Non-Contact Current Measurement System," U.S. Appl. No. 15/604,320, filed May 24, 2017, 66 pages.

(56) References Cited

OTHER PUBLICATIONS

Steuer et al., "Non-Contact Voltage Measurement System Using Multiple Capacitors," U.S. Appl. No. 15/412,891, filed Jan. 23, 2017, 35 pages.

Steuer et al., "Non-Contact Voltage Measurement System Using Reference Signal," U.S. Appl. No. 15/413,025, filed Jan. 23, 2017, 49 pages.

Stuart et al., "Combined Use of Digital Multimeter and Infrared Camera to Analyze and Diagnose Issues With Voltage Drop and Impedance," U.S. Appl. No. 62/051,930, filed Sep. 17, 2014, 3 pages.

Stuart et al., "Imaging System Employing Fixed, Modular Mobile, and Portable Infrared Cameras With Ability to Receive, Communicate, and Display Data and Images With Proximity Detection," U.S. Appl. No. 62/068,392, filed Oct. 24, 2014, 9 pages.

Stuart et al., "Infrared Cameras Used as a Method to Trigger Operation and/or Recording of Test and Measurement Devices," U.S. Appl. No. 62/076,088, filed Nov. 6, 2014, 14 pages.

Takahashi, "Clamp on Power Logger PW3365 : Safety Voltage Sensor PW9020," *Hioki Technical Notes* 1(1): 2015, 8 pages.

Tsang et al., "Dual capacitive sensors for non-contact AC voltage measurement," *Sensors and Actuators A 167*:261-266, 2011.

European Search Report, dated Aug. 23, 2018, for European Application No. 18177845.7-1202, 8 pages.

European Search Report, dated Nov. 30, 1987, for European Application No. 86113755.2, 3 pages.

\* cited by examiner

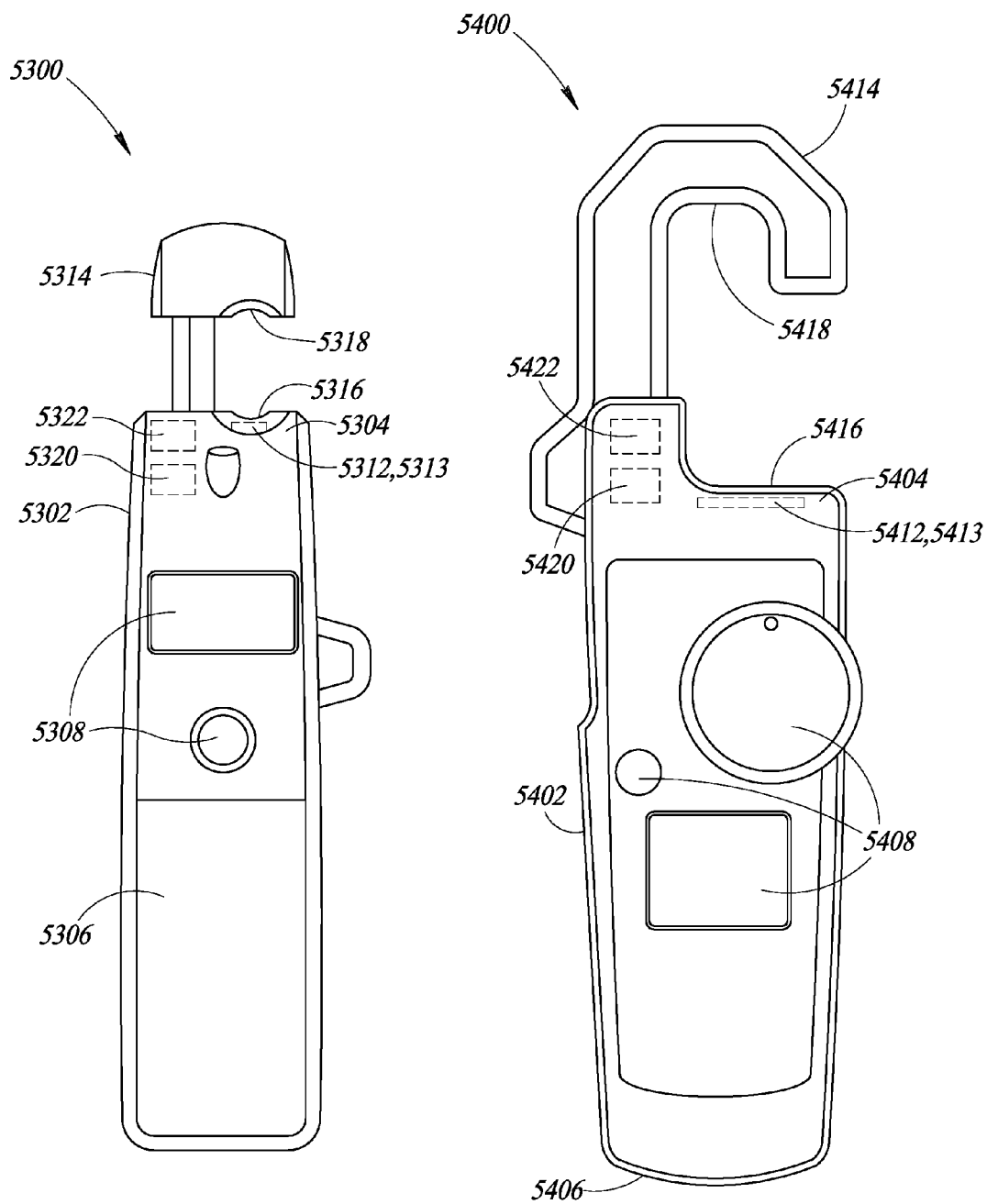

NON-CONTACT ELECTRICAL PARAMETER MEASUREMENT SYSTEMS

BACKGROUND

Technical Field

The present disclosure generally relates to measurement of electrical characteristics, and more particularly, to non-contact measurement of electrical parameters in electrical circuits.

Description of the Related Art

Voltmeters are instruments used for measuring voltage in an electric circuit. Instruments which measure more than one electrical characteristic are referred to as multimeters or digital multimeters (DMMs), and operate to measure a number of parameters generally needed for service, troubleshooting, and maintenance applications. Such parameters typically include alternating current (AC) voltage and current, direct current (DC) voltage and current, and resistance or continuity. Other parameters, such as power characteristics, frequency, capacitance, and temperature, may also be measured to meet the requirements of the particular application.

With conventional voltmeters or multimeters which measure AC voltage and/or current, it is necessary to bring at least one measurement electrode or probe into galvanic contact with a conductor, which often requires cutting away part of the insulation of an insulated electrical wire, breaking the circuit, and/or providing a terminal for measurement in advance. Besides requiring an exposed wire or terminal for galvanic contact, the step of touching probes to stripped wires or terminals can be relatively dangerous due to the risks of shock or electrocution.

BRIEF SUMMARY

A non-contact measurement system may be summarized as including: a housing comprising a front end; a voltage sensor positioned proximate the front end of the housing that, in operation, senses a voltage in an insulated wire without galvanically contacting the insulated wire; a current sensor positioned proximate the front end of the housing that, in operation, senses a current in the insulated wire without galvanically contacting the insulated wire; and at least one processor positioned in the housing, the at least one processor operatively coupled to the voltage sensor and the current sensor, wherein in operation the at least one processor: receives a voltage sensor signal from the voltage sensor obtained by the voltage sensor during a measurement time interval, the voltage sensor signal indicative of the voltage in the insulated wire; receives a current sensor signal from the current sensor obtained by the current sensor during the measurement time interval, the current sensor signal indicative of the current in the insulated wire; and determines at least one alternating current (AC) electrical parameter based at least in part on the received voltage sensor signal and current sensor signal.

The current sensor may include a magnetic field sensor. The voltage sensor may include one of a capacitive divider type voltage sensor, a reference signal type voltage sensor, or a multi-capacitor type voltage sensor. The voltage sensor may include a reference signal type voltage sensor that, in operation, senses a reference signal in the insulated wire without galvanically contacting the insulated wire, and wherein the at least one processor receives the reference signal and determines at least one characteristic of the current flowing through the insulated wire based at least in part on the received reference signal. The at least one AC electrical parameter may include at least one of power, phase, frequency, harmonics, or energy. In operation the at least one processor may determine a plurality of AC electrical parameters based at least in part on the received voltage sensor signal and current sensor signal.

The non-contact measurement system may further include a display operatively coupled to the at least one processor, in operation the at least one processor may cause the display to present the at least one AC electrical parameter.

In operation the at least one processor may causes the display to present at least one of a waveform or a graph associated with the at least one AC electrical parameter.

The non-contact measurement system may further include a communications interface operatively coupled to the at least one processor, in operation the at least one processor may send, via the communications interface, data to at least one external device, the data associated with at least one of the voltage sensor signal, the current sensor signal, or the determined at least one AC electrical parameter.

The communications interface may include a wireless communications interface operatively to wirelessly send the data to the at least one external device.

The non-contact measurement system may further include: at least one external device, including: a display; a communications interface that, in operation, receives the data sent by the communications interface of the non-contact measurement system; and at least one processor operatively coupled to the display and the communications interface, in operation the at least one processor: receives, via the communications interface, the data from the non-contact measurement system; and causes the display to present the at least one AC electrical parameter.

The non-contact measurement system may further include: an alignment feedback sensor operatively coupled to the at least one processor and positioned proximate a front end of a housing of the non-contact measurement system, in operation the alignment feedback sensor generates an alignment feedback sensor signal indicative of a present alignment of the insulated wire with respect to the voltage sensor and the current sensor; and an indicator device operatively coupled to the at least one processor, wherein in operation the at least one processor receives the alignment feedback sensor signal from the alignment feedback sensor, and causes the indicator device to provide an alignment indication to a user of the non-contact measurement system based at least in part on the received alignment feedback sensor signal.

The indicator device may include at least one of a visual indicator device or an audible indicator device. The indicator device may include at least one of a display or a plurality of lights, and in operation the at least one processor may cause the indicator device to provide an alignment indication to the user that includes a plurality of colors, each of the plurality of colors corresponding to a different level of alignment of the insulated wire with respect to the voltage sensor and the current sensor. In operation the at least one processor may cause the indicator device to provide an indication of measurement accuracy based at least in part on the received alignment feedback sensor signal. In operation the at least one processor may cause the indicator device to provide an indication of an energized circuit proximate the insulated wire under test based at least in part on the received alignment feedback sensor signal.

A method of operating a non-contact measurement system to determine at least one alternating current (AC) electrical parameter in an insulated wire may be summarized as including: sensing, via a voltage sensor positioned in a housing of the non-contact measurement system, a voltage in the insulated wire during a measurement time interval without galvanically contacting the insulated wire; sensing, via a current sensor positioned in the housing of the non-contact measurement system, a current in the insulated wire during the measurement time interval without galvanically contacting the insulated wire; and determining, via at least one processor positioned in the housing of the non-contact measurement system, at least one alternating current (AC) electrical parameter based at least in part on the sensed voltage and the sensed current.

Sensing the voltage may include sensing the voltage utilizing one of a capacitive divider type voltage sensor, a reference signal type voltage sensor, or a multi-capacitor type voltage sensor, and sensing the current may include sensing the current utilizing a magnetic field sensor. Determining at least one AC electrical parameter may include determining at least one of power, phase, frequency, harmonics, or energy based at least in part on the sensed voltage and the sensed current.

The method of operating a non-contact measurement system to determine at least one alternating current (AC) electrical parameter in an insulated wire may further include presenting an indication of the at least one AC electrical parameter to a user of the non-contact measurement system.

A non-contact measurement system may be summarized as including: a housing comprising a front end; a voltage sensor positioned proximate the front end that, in operation, senses a voltage in an insulated wire during a measurement time interval without galvanically contacting the insulated wire; a current sensor positioned proximate the front end that, in operation, senses a current in the insulated wire during a measurement time interval without galvanically contacting the insulated wire; an alignment feedback sensor positioned proximate the front end; an indicator device positioned on a surface of the housing; and at least one processor positioned in the housing, the at least one processor communicatively coupled to the voltage sensor, the current sensor, the alignment feedback sensor, and the indicator device, wherein, in operation, the at least one processor: determines at least one alternating current (AC) electrical parameter based at least in part on the sensed voltage and the sensed current; receives an alignment feedback sensor signal from the alignment feedback sensor, the alignment feedback sensor indicative of a present alignment of the insulated wire with respect to the voltage sensor and the current sensor; and causes the indicator device to provide an alignment indication to a user of the non-contact measurement system based at least in part on the received alignment feedback sensor signal.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

FIG. 45 is a front elevational view of another implementation of a non-contact current measurement system, according to one illustrated implementation.

FIG. 46 is a front elevational view of another implementation of a non-contact current measurement system, according to one illustrated implementation.

DETAILED DESCRIPTION

Figure 1A:
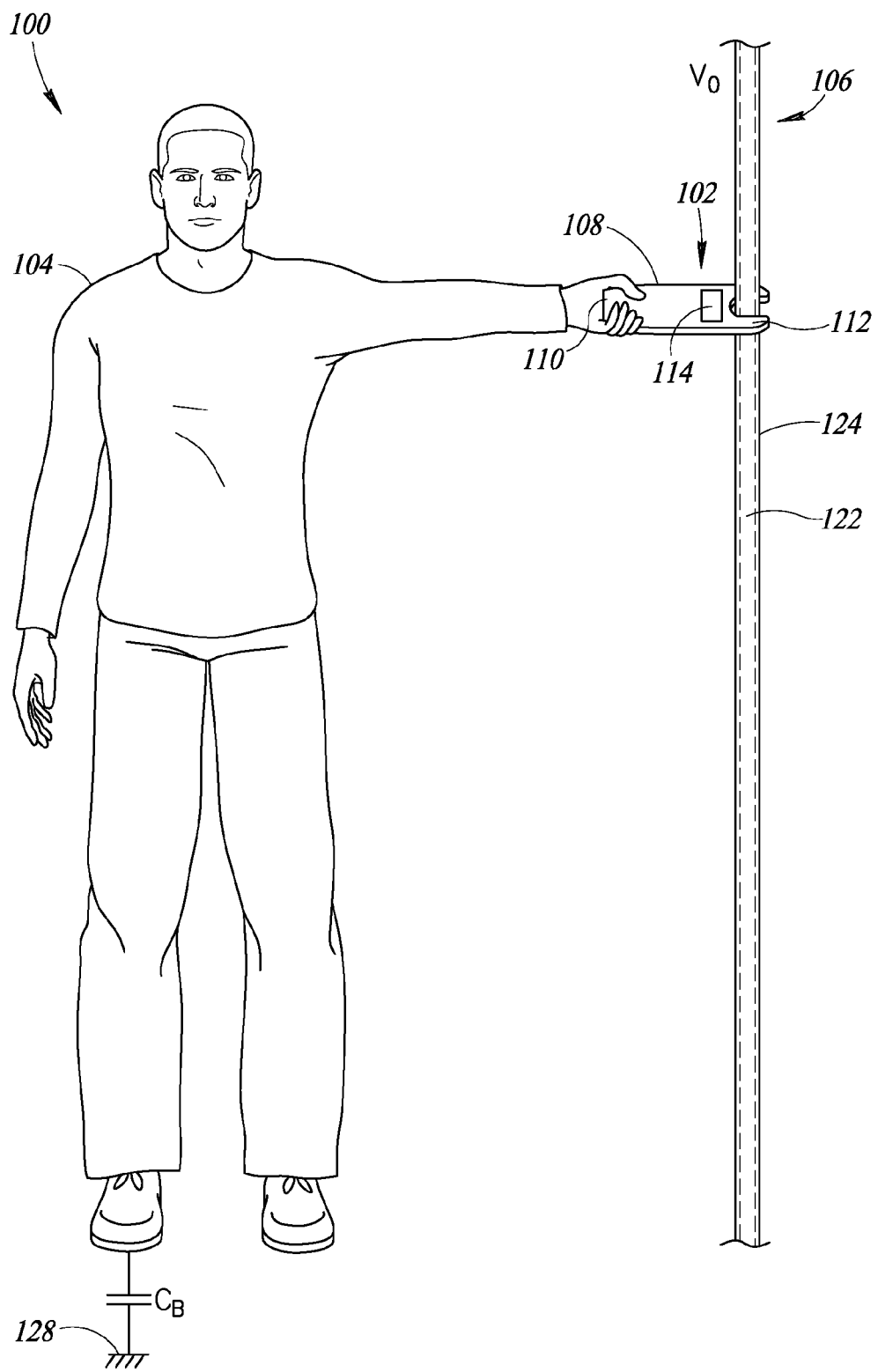
FIG. 1A is a pictorial diagram of an environment in which a non-contact voltage measurement system including a reference signal type voltage sensor may be used by an operator to measure AC voltage present in an insulated wire without requiring galvanic contact with the wire, according to one illustrated implementation.

Systems and methods of the present disclosure advantageously provide for measurement of one or more alternating current (AC) electrical parameters in an insulated wire without requiring a galvanic connection between the insulated wire and a test electrode or probe. Generally, "non-contact measurement systems" are disclosed herein which include a housing that includes both a non-contact current sensor and a non-contact voltage sensor. Non-limiting examples of types of non-contact current sensors include magnetic field sensors, such as anisotropic magnetoresistive (AMR) sensors, giant magnetoresistive (GMR) sensors, fluxgate sensors, squid sensors, fiber-optic sensors, optically pumped sensors, nuclear procession sensors, search-coil sensors, magnetotransistor sensors, magnetodiode sensors, magneto-optical sensors, Hall effect sensors, Rogowski coils, current transformers, or other types of magnetic field sensors. Non-limiting examples of types of non-contact voltage sensors capacitive divider type voltage sensors, reference signal type voltage sensors, multi-capacitor type voltage sensors, etc. Example implementations of the voltage and current sensors are discussed in further detail below.

The non-contact measurement systems discussed herein may include at least one processor that receives a voltage sensor signal and a current sensor signal from the voltage sensor and the current sensor, respectively. The voltage sensor signal is indicative of the voltage in the insulated wire, and the current sensor signal is indicative of the current in the insulated wire. The voltage and current sensor signals may be obtained by the respective voltage and current sensors during a common or overlapping measurement time interval, which may be relatively short in duration (e.g., 10 milliseconds (ms), 100 ms, 1 second, 10 seconds). For example, the voltage sensor and the current sensor may obtain measurements at least partially concurrent with each other. As another example, one of the voltage sensor and the current sensor may obtain a measurement substantially immediately after the other of the voltage sensor and the current sensor obtains a measurement, such that the measurements are obtained at nearly the same time and within a common measurement time interval. In some implementations, the voltage and current sensors may be operative to repeatedly obtain measurements at specified intervals (e.g., every 10 ms, every 100 ms, every 1 second, every 10 seconds). Generally, the voltage and current sensors both obtain their respective measurements within a measurement time interval that is sufficiently short such that pairs of the voltage and current measurements correspond to each other, which allows for derivation or determination of one or more AC electrical parameters (e.g., power, phase) using the obtained current and voltage measurements.

In at least some implementations, the determined AC electrical parameters may be presented to an operator via a visual indicator device (e.g., display, lights). The determined one or more AC electrical parameters may additionally or alternatively be communicated to an external device via a wired and/or wireless communications interface. The AC electrical parameters may include power, phase, frequency, harmonics, energy, etc. Additionally, as discussed further below with reference to FIG. 30, the non-contact measurement systems of the present disclosure may include an alignment feedback sensor that provides feedback regarding the mechanical alignment of the insulated wire relative to the voltage sensor and the current sensor. The alignment feedback may be provided to a user of the non-contact measurement system via an indicator device (e.g., display, light(s), speaker, buzzer). In at least some implementations, the alignment feedback sensor may also provide feedback relating to the presence of nearby energized circuits which the user may want to avoid.

Initially, examples of reference signal type non-contact voltage sensors or systems are discussed with reference to FIGS. 1-15. Then, examples of capacitive divider type voltage sensors or systems are discussed with reference to FIG. 16-22. Examples of multi-capacitor type voltage sensors or systems are then discussed with reference to FIGS. 23A-27. Examples of various non-contact measurement systems which may include at least some of the functionality disclosed herein are then discussed with reference to FIGS. 28-42B. Finally, examples of non-contact current measurement systems are discussed with reference to FIGS. 43-48. It is appreciated that the various features of the implementations discussed herein may be rearranged and/or combined in numerous ways to provide the desired functionality for a particular application.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise. In addition, the headings and Abstract of the Disclosure provided herein are for convenience only and do not interpret the scope or meaning of the implementations.

Reference Signal Type Non-Contact Voltage Measurement Systems

The following discussion provides systems and methods for measuring alternating current (AC) voltage of an insulated or blank uninsulated conductor (e.g., insulated wire) without requiring a galvanic connection between the conductor and a test electrode or probe. The implementations disclosed in this section may be referred to herein as "reference signal type voltage sensors" or systems. Generally, a non-galvanic contact (or "non-contact") voltage measurement system is provided which measures an AC voltage signal in an insulated conductor with respect to ground using a capacitive sensor. Such systems which do not require a galvanic connection are referred to herein as "non-contact." As used herein, "electrically coupled" includes both direct and indirect electrical coupling unless stated otherwise.

As discussed further below, the "reference signal" systems and methods discussed below may also be used to measure at least one physical dimension (e.g., insulation thickness) of an insulated wire without requiring a galvanic connection between the conductor of an insulated wire and the sensor or electrode ("reference signal sensor"). In at least some implementations, a non-contact current measurement system may utilize the reference signal method, with or without mechanical position feedback, to determine or estimate one or more physical dimensions (e.g., diameter of a conductor) of an insulated wire. Such feature may be advantageous for a number of reasons, including enabling the determination of current flowing through an insulated wire with greater accuracy than could be achieved without physical dimension information.

Figure 1B:
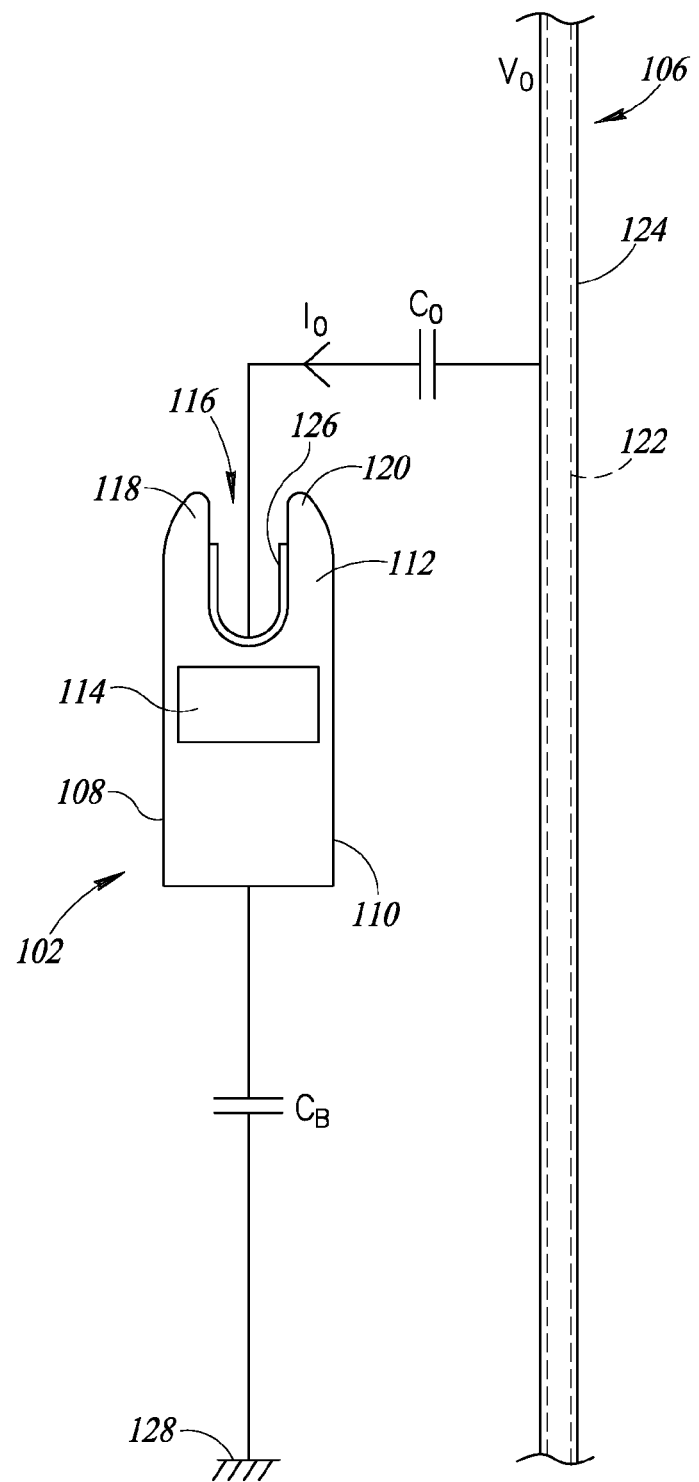
FIG. 1B is a top view of the non-contact voltage measurement system of FIG. 1A, showing a coupling capacitance formed between the insulated wire and a conductive sensor of the non-contact voltage measurement system, an insulated conductor current component, and a body capacitance between the non-contact voltage measurement system and the operator, according to one illustrated implementation.

FIG. 1A is a pictorial diagram of an environment 100 in which a non-contact voltage measurement system 102 that includes a reference signal type voltage sensor or system may be used by an operator 104 to measure AC voltage present in an insulated wire 106 without requiring galvanic contact between the non-contact voltage measurement system and the wire 106. FIG. 1B is a top plan view of the non-contact voltage measurement system 102 of FIG. 1A, showing various electrical characteristics of the non-contact voltage measurement system during operation. The non-contact voltage measurement system 102 includes a housing or body 108 which includes a grip portion or end 110 and a probe portion or end 112, also referred to herein as a front end, opposite the grip portion. The housing 108 may also include a user interface 114 which facilitates user interaction with the non-contact voltage measurement system 102. The user interface 114 may include any number of inputs (e.g., buttons, dials, switches, touch sensor) and any number of outputs (e.g., display, LEDs, speakers, buzzers). The non-contact voltage measurement system 102 may also include one or more wired and/or wireless communications interfaces (e.g., USB, Wi-Fi®, Bluetooth®).

In at least some implementations, as shown best in FIG. 1B, the probe portion 112 may include a recessed portion 116 defined by first and second extended portions 118 and 120. The recessed portion 116 receives the insulated wire 106 (see FIG. 1A). The insulated wire 106 includes a conductor 122 and an insulator 124 surrounding the conductor 122. The recessed portion 116 may include a sensor or electrode 126 which rests proximate the insulator 124 of the insulated wire 106 when the insulated wire is positioned within the recessed portion 116 of the non-contact voltage measurement system 102. Although not shown for clarity, the sensor 126 may be disposed inside of the housing 108 to prevent physical and electrical contact between the sensor and other objects.

As shown in FIG. 1A, in use the operator 104 may grasp the grip portion 110 of the housing 108 and place the probe portion 112 proximate the insulated wire 106 so that the non-contact voltage measurement system 102 may accurately measure the AC voltage present in the wire with respect to earth ground (or another reference node). Although the probe end 112 is shown as having the recessed portion 116, in other implementations the probe portion 112 may be configured differently. For example, in at least some implementations the probe portion 112 may include a selectively movable clamp, a hook, a flat or arcuate surface which includes the sensor, or other type of interface which allows a sensor of the non-contact voltage measurement system 102 to be positioned proximate the insulated wire 106. Examples of various probe portions and sensors are discussed below with reference to FIGS. 10-15.

The operator's body acting as a reference to earth/ground may only be in some implementations. The non-contact measurement functionality discussed herein is not limited to applications only measuring against earth. The outside reference may be capacitively coupled to any other potential. For example, if the outside reference is capacitively coupled to another phase in three phase systems, the phase-to-phase voltages are measured. In general, the concepts discussed herein are not limited to reference against earth only using a body capacitive coupling connected to a reference voltage and any other reference potential.

As discussed further below, in at least some implementations, the non-contact voltage measurement system 102 may utilize the body capacitance ($C_B$) between the operator 104 and ground 128 during the AC voltage measurement. Although the term ground is used for the node 128, the node is not necessarily earth/ground but could be connected in a galvanically isolated manner to any other reference potential by capacitive coupling.

The particular systems and methods used by the non-contact voltage measurement system 102 to measure AC voltage are discussed below with reference to FIGS. 2-15.

Figure 2:
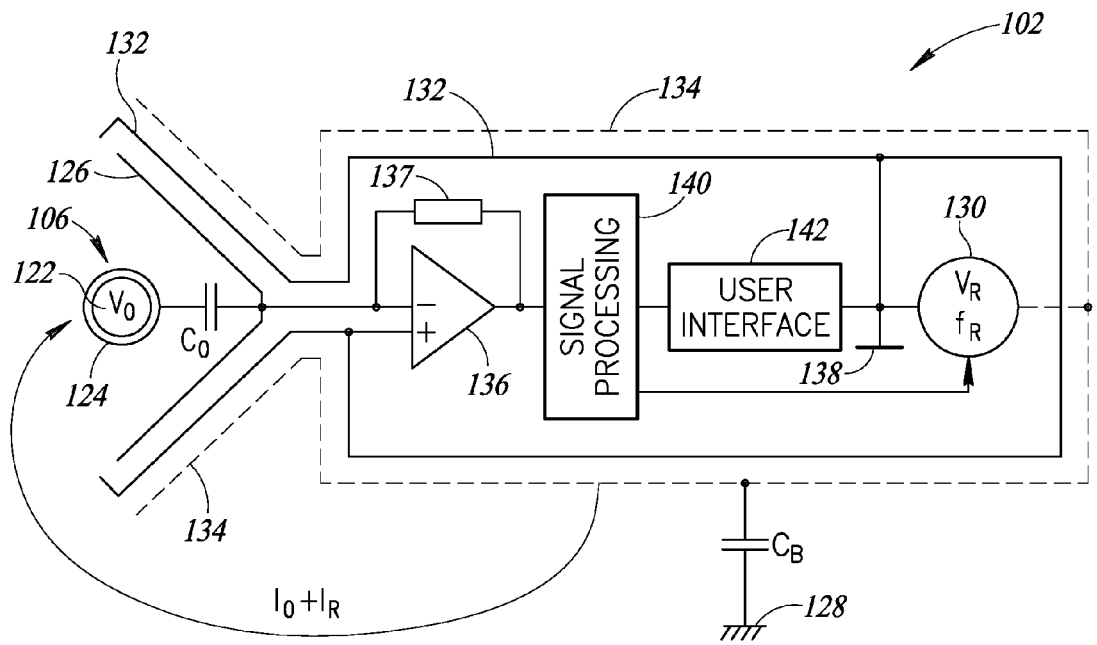
FIG. 2 is a schematic diagram of various internal components of a non-contact voltage measurement system, according to one illustrated implementation.

FIG. 2 shows a schematic diagram of various internal components of the non-contact voltage measurement system 102 also shown in FIGS. 1A and 1B. In this example, the conductive sensor 126 of the non-contact voltage measurement system 102 is substantially "V-shaped" and is positioned proximate the insulated wire 106 under test and capacitively couples with the conductor 122 of the insulated wire 106, forming a sensor coupling capacitor ($C_O$). The operator 104 handling the non-contact voltage measurement system 102 has a body capacitance ($C_B$) to ground. Thus, as shown in FIGS. 1B and 2, the AC voltage signal ($V_O$) in the wire 122 generates an insulated conductor current component or "signal current" ($I_O$) over the coupling capacitor ($C_O$) and the body capacitance ($C_B$), which are connected in series. In some implementations, the body capacitance ($C_B$) may also include a galvanically isolated test lead which generates a capacitance to ground or any other reference potential.

The AC voltage ($V_O$) in the wire 122 to be measured has a connection to an external ground 128 (e.g., neutral). The non-contact voltage measurement system 102 itself also has a capacitance to ground 128, which consists primarily of the body capacitance ($C_B$) when the operator 104 (FIG. 1) holds the non-contact voltage measurement system in his hand. Both capacitances $C_O$ and $C_B$ create a conductive loop and the voltage inside the loop generates the signal current ($I_O$). The signal current ($I_O$) is generated by the AC voltage signal ($V_O$) capacitively coupled to the conductive sensor 126 and loops back to the external ground 128 through the housing 108 of the non-contact voltage measurement system and the body capacitor ($C_B$) to ground 128. The current signal ($I_O$) is dependent on the distance between the conductive sensor 126 of the non-contact voltage measurement system 102 and the insulated wire 106 under test, the particular shape of the conductive sensor 126, and the size and voltage level ($V_O$) in the conductor 122.

To compensate for the distance variance and consequent coupling capacitor ($C_O$) variance which directly influences the signal current ($I_O$), the non-contact voltage measurement system 102 includes a common mode reference voltage source 130 which generates an AC reference voltage ($V_R$) which has a reference frequency ($f_R$) different from the signal voltage frequency ($f_O$).

To reduce or avoid stray currents, at least a portion of the non-contact voltage measurement system 102 may be surrounded by a conductive internal ground guard or screen 132 which causes most of the current to run through the conductive sensor 126 which forms the coupling capacitor ($C_O$) with the conductor 122 of the insulated wire 106. The internal ground guard 132 may be formed from any suitable conductive material (e.g., copper) and may be solid (e.g., foil) or have one or more openings (e.g., mesh).

Further, to avoid currents between the internal ground guard 132 and the external ground 128, the non-contact voltage measurement system 102 includes a conductive reference shield 134. The reference shield 134 may be formed from any suitable conductive material (e.g., copper) and may be solid (e.g., foil) or have one or more openings (e.g., mesh). The common mode reference voltage source 130 is electrically coupled between the reference shield 134 and the internal ground guard 132, which creates a common mode voltage having the reference voltage ($V_R$) and the reference frequency ($f_R$) for the non-contact voltage measurement system 102. Such AC reference voltage ($V_R$) drives an additional reference current ($I_R$) through the coupling capacitor ($C_O$) and the body capacitor ($C_B$).

The internal ground guard 132 which surrounds at least a portion of the conductive sensor 126 protects the conductive sensor against direct influence of the AC reference voltage ($V_R$) causing an unwanted offset of reference current ($I_R$) between the conductive sensor 126 and the reference shield 134. As noted above, the internal ground guard 132 is the internal electronic ground 138 for the non-contact voltage measurement system 102. In at least some implementations, the internal ground guard 132 also surrounds some or all of the electronics of the non-contact voltage measurement system 102 to avoid the AC reference voltage ($V_R$) coupling into the electronics.

As noted above, the reference shield 134 is utilized to inject a reference signal onto the input AC voltage signal ($V_O$) and as a second function minimizes the guard 132 to earth ground 128 capacitance. In at least some implementations, the reference shield 134 surrounds some or all of the housing 108 of the non-contact voltage measurement system 102. In such implementations, some or all of the electronics see the reference common mode signal which also generates the reference current ($I_R$) between the conductive sensor 126 and the conductor 122 in the insulated wire 106. In at least some implementations, the only gap in the reference shield 134 may be an opening for the conductive sensor 126 which allows the conductive sensor to be positioned proximate the insulated wire 106 during operation of the non-contact voltage measurement system 102.

The internal ground guard 132 and the reference shield 134 may provide a double layer screen around the housing 108 (see FIGS. 1A and 1B) of the non-contact voltage measurement system 102. The reference shield 134 may be disposed on an outside surface of the housing 108 and the internal ground guard 132 may function as an internal shield or guard. The conductive sensor 126 is shielded by the guard 132 against the reference shield 134 such that any reference current flow is generated by the coupling capacitor ($C_O$) between the conductive sensor 126 and the conductor 122 under test.

The guard 132 around the sensor 126 also reduces stray influences of adjacent wires close to the sensor.

As shown in FIG. 2, the non-contact voltage measurement system 102 may include an input amplifier 136 which operates as an inverting current-to-voltage converter. The input amplifier 136 has a non-inverting terminal electrically coupled to the internal ground guard 132 which functions as the internal ground 138 of the non-contact voltage measurement system 102. An inverting terminal of the input amplifier 136 may be electrically coupled to the conductive sensor 126. Feedback circuitry 137 (e.g., feedback resistor) may also be coupled between the inverting terminal and the output terminal of the input amplifier 136 to provide feedback and appropriate gain for input signal conditioning.

The input amplifier 136 receives the signal current ($I_O$) and reference current ($I_R$) from the conductive sensor 126 and converts the received currents into a sensor current voltage signal indicative of the conductive sensor current at the output terminal of the input amplifier. The sensor current voltage signal may be an analog voltage, for example. The analog voltage may be fed to a signal processing module 140 which, as discussed further below, processes the sensor current voltage signal to determine the AC voltage ($V_O$) in the conductor 122 of the insulated wire 106. The signal processing module 140 may include any combination of digital and/or analog circuitry.

The non-contact voltage measurement system 102 may also include a user interface 142 (e.g., display) communicatively coupled to the signal processing module 140 to present the determined AC voltage ($V_O$) or to communicate by an interface to the operator 104 of the non-contact voltage measurement system.

Figure 3:
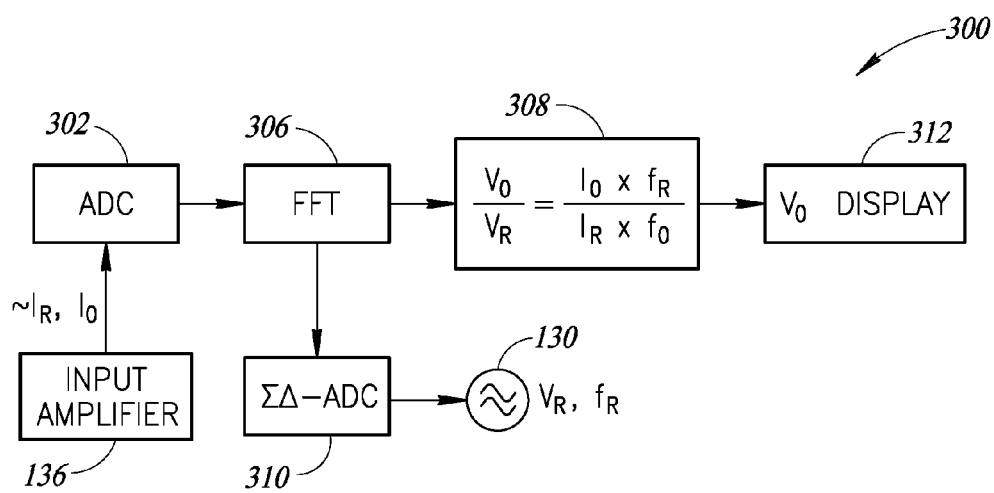
FIG. 3 is a block diagram which shows various signal processing components of a non-contact voltage measurement system, according to one illustrated implementation.
Figure 4:
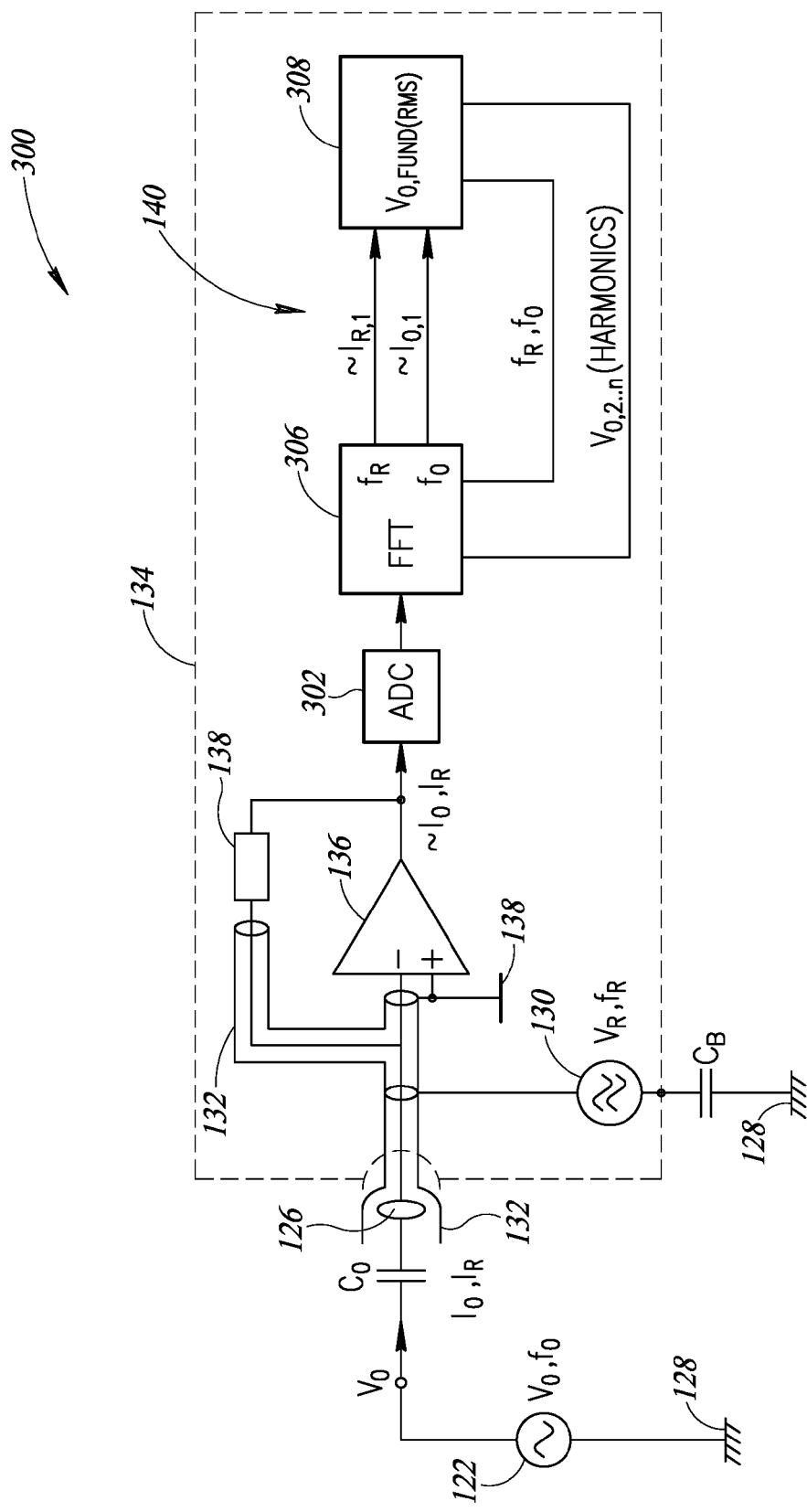
FIG. 4 is a schematic diagram of a non-contact voltage measurement system which implements a fast Fourier transform (FFT), according to one illustrated implementation.

FIG. 3 is a block diagram of a non-contact voltage measurement system 300 which shows various signal processing components of the non-contact voltage measurement system. FIG. 4 is a more detailed diagram of the non-contact voltage measurement system 300 of FIG. 3.

The non-contact voltage measurement system 300 may be similar or identical to the non-contact voltage measurement system 102 discussed above. Accordingly, similar or identical components are labeled with the same reference numerals. As shown, the input amplifier 136 converts the input current ($I_O+I_R$) from the conductive sensor 126 into a sensor current voltage signal which is indicative of the input current. The sensor current voltage signal is converted into digital form using an analog-to-digital converter (ADC) 302.

The AC voltage ($V_O$) in the wire 122 is related to the AC reference voltage ($V_R$) by Equation (1):

$$\frac{V_O}{V_R} = \frac{I_O \times f_R}{I_R \times f_O} \qquad (1)$$

where ($I_O$) is the signal current through the conductive sensor 126 due to the AC voltage ($V_O$) in the conductor 122, ($I_R$) is the reference current through the conductive sensor 126 due to the AC reference voltage ($V_R$), ($f_O$) is the frequency of the AC voltage ($V_O$) that is being measured, and ($f_R$) is the frequency of the reference AC voltage ($V_R$).

Figure 5:
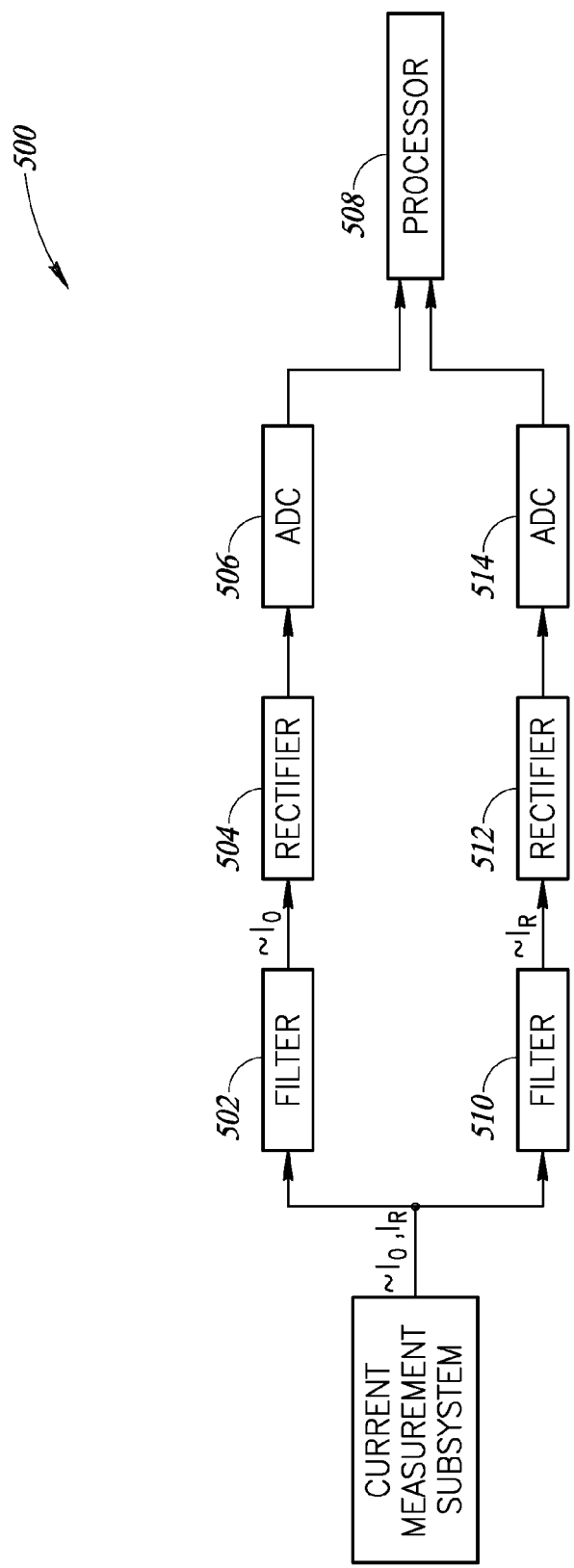
FIG. 5 is a block diagram of a non-contact voltage measurement system which implements analog electronic filters, according to another example for signal and reference signal separation.

The signals with indices "O," which are related to the AC voltage ($V_O$), have different characteristics like frequencies than the signals with indices "R," which are related to the common mode reference voltage source 130. In the implementation of FIG. 4, digital processing, such as circuitry implementing a fast Fourier transform (FFT) algorithm 306, may be used to separate signal magnitudes with different frequencies. In the implementation of FIG. 5 discussed below, analog electronic filters may also be used to separate "O" signal characteristics (e.g., magnitude, frequency) from "R" signal characteristics.

The currents ($I_O$) and ($I_R$) are dependent on the frequencies ($f_O$) and ($f_R$), respectively, due to the coupling capacitor ($C_O$). The currents flowing through the coupling capacitor ($C_O$) and the body capacitance ($C_B$) are proportional to the frequency and thus, the frequency ($f_O$) of the AC voltage ($V_O$) in the conductor 122 under test needs either to be measured to determine the ratio of the reference frequency ($f_R$) to the signal frequency ($f_O$), which is utilized in Equation (1) listed above or the reference frequency is already known because it is generated by the system itself.

After the input current ($I_O+I_R$) has been conditioned by the input amplifier 136 and digitized by the ADC 302, the frequency components of the digital sensor current voltage signal may be determined by representing the signal in the frequency domain using the FFT 306. When both of the frequencies ($f_O$) and ($f_R$) have been measured, frequency bins may be determined to calculate the fundamental magnitudes of the currents ($I_O$) and ($I_R$) from the FFT 306.

The magnitude of the current ($I_R$) and/or the current ($I_O$) may vary as a function of distance between the reference signal sensor or electrode (e.g., electrode 126) and the conductor 122 of the insulated wire 106. Thus, the system may compare the measured current ($I_R$) and/or the current ($I_O$) to expected respective currents to determine the distance between the reference signal sensor or electrode and the conductor 122. Since during measurement the insulated wire 106 may be positioned adjacent the reference signal sensor or electrode (e.g., via an adjustable clamp assembly), the distance between the reference signal sensor and the conductor 122 of the insulated wire 106 is approximately equal to the thickness of the insulation layer 124. As discussed below, a position feedback sensor operatively coupled to an adjustable clamp assembly provides the overall diameter of the insulated wire 106. Thus, using the determined overall diameter of the insulated wire and the determined thickness of the insulation layer 124, the system may accurately determine the diameter or gauge of the conductor 122 inside the insulated wire 106. This information, along with the magnetic field measured by a magnetic field sensor, may be used to by the system to accurately determine the magnitude of the current flowing through the conductor 122 inside the insulated wire 106.

Next, as indicated by a block 308, the ratio of the fundamental harmonics of the currents ($I_R$) and ($I_O$), designated $I_{R,1}$ and $I_{O,1}$, respectively may be corrected by the determined frequencies ($f_O$) and ($f_R$), and this factor may be used to calculate the measured original fundamental or RMS voltage by adding harmonics ($V_O$) in the wire 122, which is done by calculating the square root of the squared harmonics sum, and which may be presented to the user on a display 312.

The coupling capacitor ($C_O$) may generally have a capacitance value in the range of approximately 0.02 pF to 1 pF, for example, depending on the distance between the insulated conductor 106 and the conductive sensor 126, as well as the particular shape and dimensions of the sensor 126. The body capacitance ($C_B$) may have a capacitance value of approximately 20 pF to 200 pF, for example.

From Equation (1) above, it can be seen that the AC reference voltage ($V_R$) generated by the common mode reference voltage source 130 does not need to be in the same range as the AC voltage ($V_O$) in the conductor 122 to achieve similar current magnitudes for the signal current ($I_O$) and the reference current ($I_R$). The AC reference voltage ($V_R$) may be relatively low (e.g., less than 5 V) by selecting the reference frequency ($f_R$) to be relatively high. As an example, the reference frequency ($f_R$) may be selected to be 3 kHz, which is 50 times higher than a typical 120 VRMS AC voltage ($V_O$) having a signal frequency ($f_O$) of 60 Hz. In such case, the AC reference voltage ($V_R$) may be selected to be only 2.4 V (i.e., 120 V÷50) to generate the same reference current ($I_R$) as the signal current ($I_O$). In general, setting the reference frequency ($f_R$) to be N times the signal frequency ($f_O$) allows the AC reference voltage ($V_R$) to have a value that is (1/N) times the AC voltage ($V_O$) in the wire 122 to produce currents ($I_R$) and ($I_O$) which are in the same range as each other to achieve a similar uncertainty for $I_R$ and $I_O$.

Any suitable signal generator may be used to generate the AC reference voltage ($V_R$) having the reference frequency ($f_R$). In the example illustrated in FIG. 3, a Sigma-Delta digital-to-analog converter (Σ-Δ DAC) 310 is used. The Σ-Δ DAC 310 uses a bit stream to create a waveform (e.g., sinusoidal waveform) signal with the defined reference frequency ($f_R$) and AC reference voltage ($V_R$). In at least some implementations, the Σ-Δ DAC 310 may generate a waveform that is in phase with the window of the FFT 306 to reduce jitter.

In at least some implementations, the ADC 302 may have 14 bits of resolution. In operation, the ADC 302 may sample the output from the input amplifier 136 at a sampling frequency of 10.24 kHz for nominal 50 Hz input signals to provide $2^n$ samples (1024) in 100 ms (10 Hz bins for the FFT 306) ready for processing by the FFT 306. For 60 Hz input signals, the sampling frequency may be 12.288 kHz, for example, to get the same number of samples per cycle. The sampling frequency of the ADC 302 may be synchronized to full numbers of cycles of the reference frequency ($f_R$). The input signal frequency may be within a range of 40-70 Hz, for example. Depending on the measured frequency of the AC voltage ($V_O$), the bins for the AC voltage ($V_O$) may be determined using the FFT 306 and use a Hanning window function for further calculations to suppress phase shift jitter caused by incomplete signal cycles captured in the aggregation interval.

In one example, the common mode reference voltage source 130 generates an AC reference voltage ($V_R$) which has a reference frequency ($f_R$) of 2419 Hz. This frequency is in between the $40^{th}$ harmonic and the $41^{st}$ harmonic for 60 Hz signals, and between the $48^{th}$ harmonic and $49^{th}$ harmonic for 50 Hz signals. By providing an AC reference voltage ($V_R$) which has a reference frequency ($f_R$) that is not a harmonic of the expected AC voltage ($V_O$), the AC voltage ($V_O$) is less likely to influence measurement of the reference current ($I_R$).

In at least some implementations, the reference frequency ($f_R$) of the common mode reference voltage source 130 is selected to be a frequency that is least likely to be affected by harmonics of an AC voltage ($V_O$) in the conductor 122 under test. As an example, the common mode reference voltage source 130 may be switched off when the reference current ($I_R$) exceeds a limit, which may indicate that the conductive sensor 126 is approaching the conductor 122 under test. A measurement (e.g., 100 ms measurement) may be taken with the common mode reference voltage source 130 switched off to detect signal harmonics at a number (e.g., three, five) of candidate reference frequencies. Then, the magnitude of the signal harmonics in the AC voltage ($V_O$) may be determined at the number of candidate reference frequencies to identify which candidate reference frequency is likely to be least affected by the signal harmonics of the AC voltage ($V_O$). The reference frequency ($f_R$) may then be set to the identified candidate reference frequency. This switching of the reference frequency may avoid or reduce the impact of possible reference frequency components in the signal spectrum, which may increase the measured reference signal and reduce accuracy, and may create unstable results. Other frequencies besides 2419 Hz that have the same characteristics include 2344 Hz and 2679 Hz, for example.

FIG. 5 is a block diagram of a signal processing portion 500 of a non-contact voltage measurement system which implements electronic filters. The signal processing portion 500 may receive a sensor current voltage signal that is proportional to the conductive sensor 126 current ($I_O+I_R$) from a current measurement subsystem (e.g., input amplifier 136).

As discussed above, the signal current ($I_O$) has a different frequency than the reference current ($I_R$). To isolate the signal current ($I_O$) from the reference current ($I_R$), the signal processing portion 500 may include a first filter 502 which operates to pass the signal current ($I_O$) and reject the reference current ($I_R$). The filtered signal may then be rectified by a first rectifier 504 and digitized by a first ADC 506. The digitized signal may be fed to a suitable processor 508 for use in calculations, as discussed above. Similarly, to isolate the reference current ($I_R$) from the signal current ($I_O$), the signal processing portion 500 may include a second filter 510 which operates to pass the reference current ($I_R$) and reject the signal current ($I_O$). The filtered signal may then be rectified by a second rectifier 512 and digitized by a second ADC 514. The digitized signal may be fed to a suitable processor 508 for use in calculations. The first and second filters 502 and 510 may be any suitable analog filters, and may each include a number of discrete components (e.g., capacitors, inductors).

Figure 6:
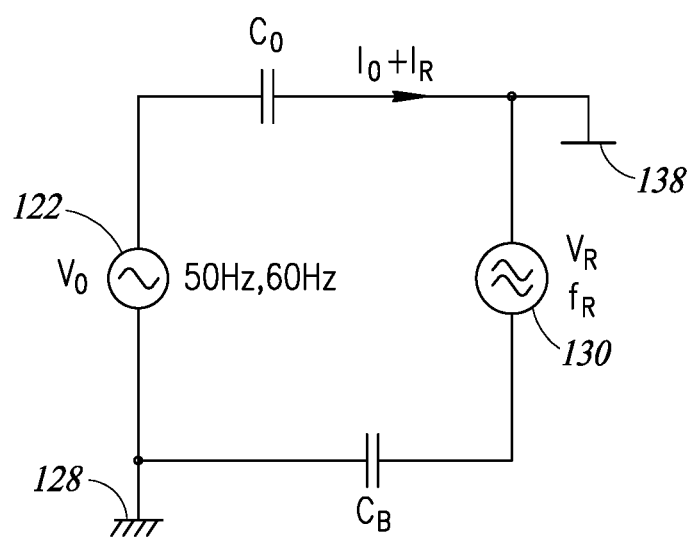
FIG. 6 is a schematic circuit diagram of a non-contact voltage measurement system, according to one illustrated implementation.

FIG. 6 is a schematic circuit diagram of portions of a non-contact voltage measurement system, such as any of the non-contact voltage measurement systems discussed above, showing the loop formed by the common mode reference voltage source 130, the body capacitance ($C_B$), the coupling capacitor ($C_O$), the wire 122, the external ground 128, and the internal ground 138.

Figure 7A:
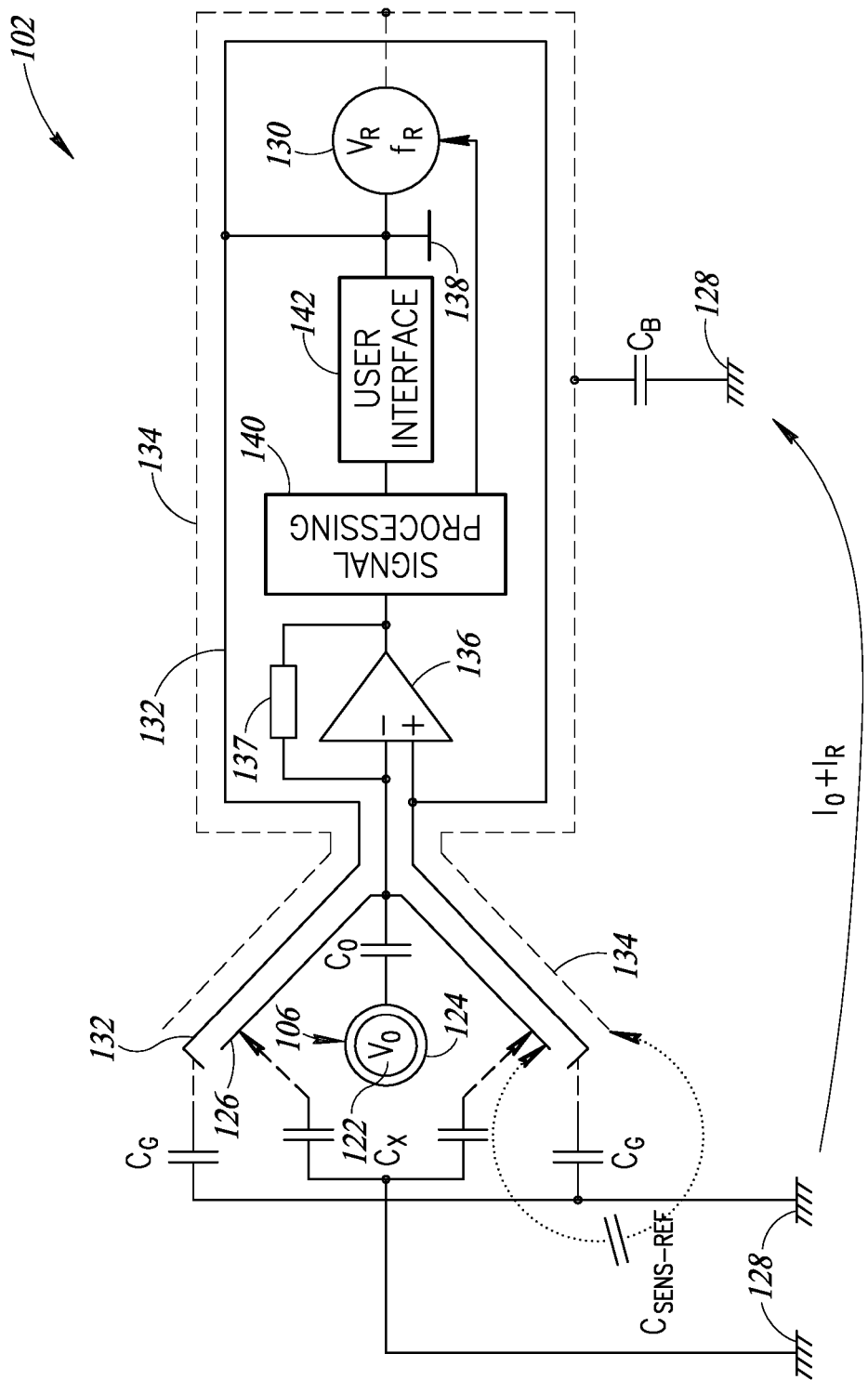
FIG. 7A is a schematic diagram of a non-contact voltage measurement system which shows various leakage and stray capacitances, according to one illustrated implementation.

FIG. 7A is a schematic diagram of the non-contact voltage measurement system 102, which shows various leakage and stray capacitances. Generally, removal of the influences of different stray capacitors seen by the system (e.g., sensor 126) cannot be completely achieved by special sensor design and screening methods even with sophisticated shielding techniques. As discussed above, implementations of the present disclosure utilize the common mode reference voltage source 130 to generate a reference voltage with a reference frequency ($f_R$) that is different from the measured signal frequency ($f_O$) to compensate for the stray capacitances seen by the system.

In particular, in addition to the coupling capacitor ($C_O$), FIG. 7A shows the body capacitance ($C_B$), a capacitance ($C_X$), a capacitance ($C_{SENS-REF}$), and a capacitance ($C_G$). The body capacitance ($C_B$) is in series with the coupling capacitor ($C_O$) and, in typical applications, the body capacitance ($C_B$) is much greater than the coupling capacitor ($C_O$). Thus, the body capacitance ($C_B$) only impacts the magnitudes of the currents ($I_O+I_R$), but does not impact the ratio ($I_O/I_R$) of the currents.

Figure 8:
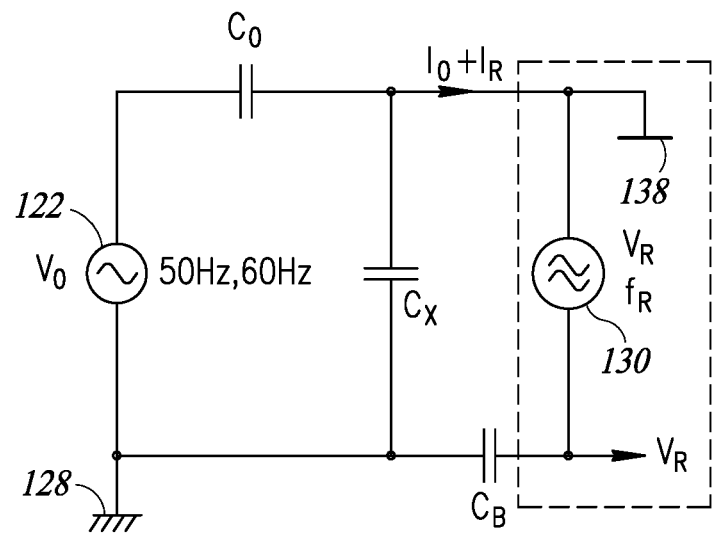
FIG. 8 is a schematic circuit diagram of a non-contact voltage measurement system which shows a capacitance between a sensor of the non-contact voltage measurement system and an external ground, according to one illustrated implementation.

As shown in FIGS. 7A and 8, the capacitance ($C_X$) is the sensor capacitance between the conductive sensor 126 and the external ground 128. The coupling capacitor ($C_O$) is not the only capacitance between the wire 122 and the sensor 126. There is also the capacitance ($C_X$) between the sensor 126 and the external ground 128, especially for thin wires which do not substantially cover the area of the sensor 126. The capacitance ($C_X$) has a capacitive voltage divider effect for the signal current ($I_O$), and may result in a lower voltage measurement for the AC voltage ($V_O$). The capacitance ($C_X$) therefore reduces the magnitudes of the currents ($I_O+I_R$). However, the reference current ($I_R$) is divided by the same ratio and, thus, also compensates for the stray capacitor ($C_X$), so the ratio ($I_O/I_R$) is not impacted. To also avoid any internal current flows to outside the non-contact voltage measurement system, as discussed above in at least some implementations the whole measurement system except for the sensing area may be shielded by the reference shield 134 from the outside environment and connected to the output of the common mode reference voltage source 130 to create the reference current ($I_R$).

As shown in FIG. 7A, the capacitance ($C_{SENS-REF}$) is the remaining capacitance between the reference shield 134 and the conductive sensor 126. The capacitance ($C_{SENS-REF}$) causes an offset for the sensor current ($I_O+I_R$) which is present even when the AC voltage ($V_O$) in the wire 106 is not being measured.

Figure 9A:
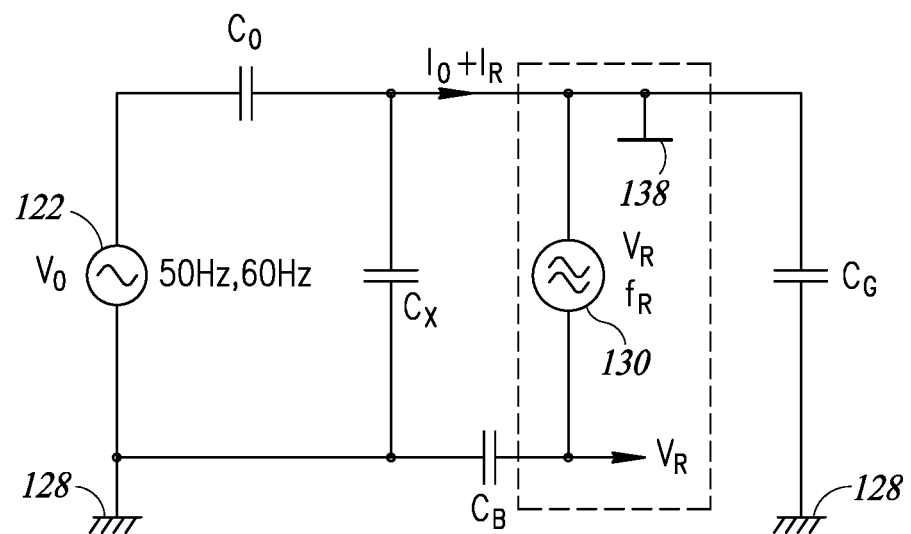
FIG. 9A is a schematic circuit diagram of a non-contact voltage measurement system which shows a capacitance between an internal ground guard of the non-contact voltage measurement system and an external ground, according to one illustrated implementation.
Figure 9B:
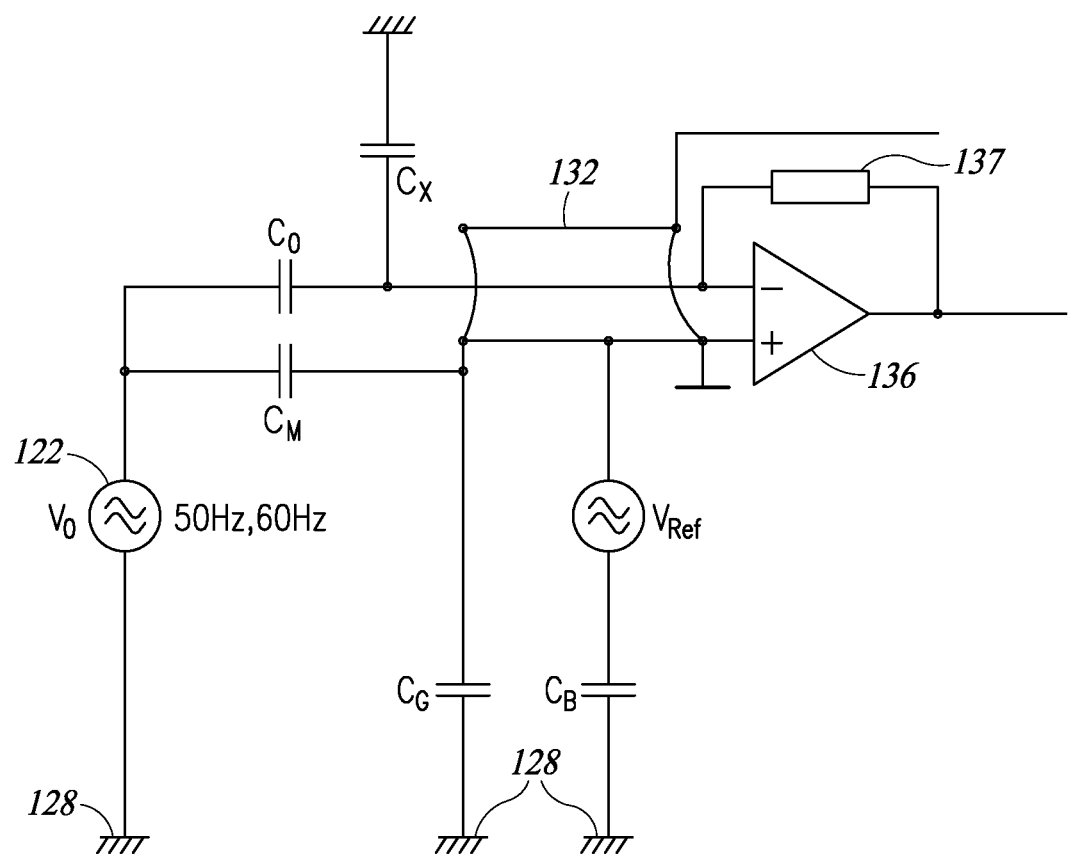
FIG. 9B is a schematic circuit diagram of a non-contact voltage measurement system which shows a capacitance between an internal ground guard of the non-contact voltage measurement system and an external ground, according to one illustrated implementation.

As shown in FIGS. 7A and 9A, the capacitance ($C_G$) is the capacitance between the internal ground 138 and the external ground 128 or reference potential. The capacitance ($C_G$) is a parallel path for the reference current ($I_R$), and reduces the reference current. Thus, the capacitance ($C_G$) causes an increase in the calculated result for the AC voltage ($V_O$) in the wire 106. See FIG. 9B, which shows the impact of the capacitance ($C_G$). In particular, the capacitance ($C_G$) influences $I_R$ and $I_O$ differently, and therefore influences the ratio $I_O/I_R$.

$$I_O = V_O \cdot f_O \frac{[(C_O // C_M) \text{ in series } (C_G // C_B)] \cdot C_O}{C_O // C_M} \quad (2)$$

$$== V_O \cdot f_O \cdot \frac{(C_O + C_M)(C_G + C_B) \cdot C_O}{(C_O + C_M + C_B + C_G) \cdot (C_O + C_M)} \Rightarrow \quad (3)$$

$$\frac{C_O \cdot (C_B + C_G)}{\Sigma C}$$

$$I_R = V_R \cdot f_R \cdot \frac{((C_B \text{ in series } (C_O // C_M // C_G)) \cdot C_O}{C_O // C_M // C_G} \quad (4)$$

$$== V_R \cdot f_R \cdot \frac{C_B \cdot (C_O + C_M + C_G) \cdot C_O}{(C_B + C_O + C_M + C_G) \cdot (C_O + C_M + C_G)} \Rightarrow \quad (5)$$

$$\frac{C_O \cdot C_B}{\Sigma C}$$

As can be seen from equations (2)-(5) above, the ratio $I_O/I_R$ depends on $C_B/C_G$. The capacitance $C_G$ is much smaller when a reference screen is around the whole enclosure and sensor of the non-contact voltage measurement system 102.

Figure 7B:
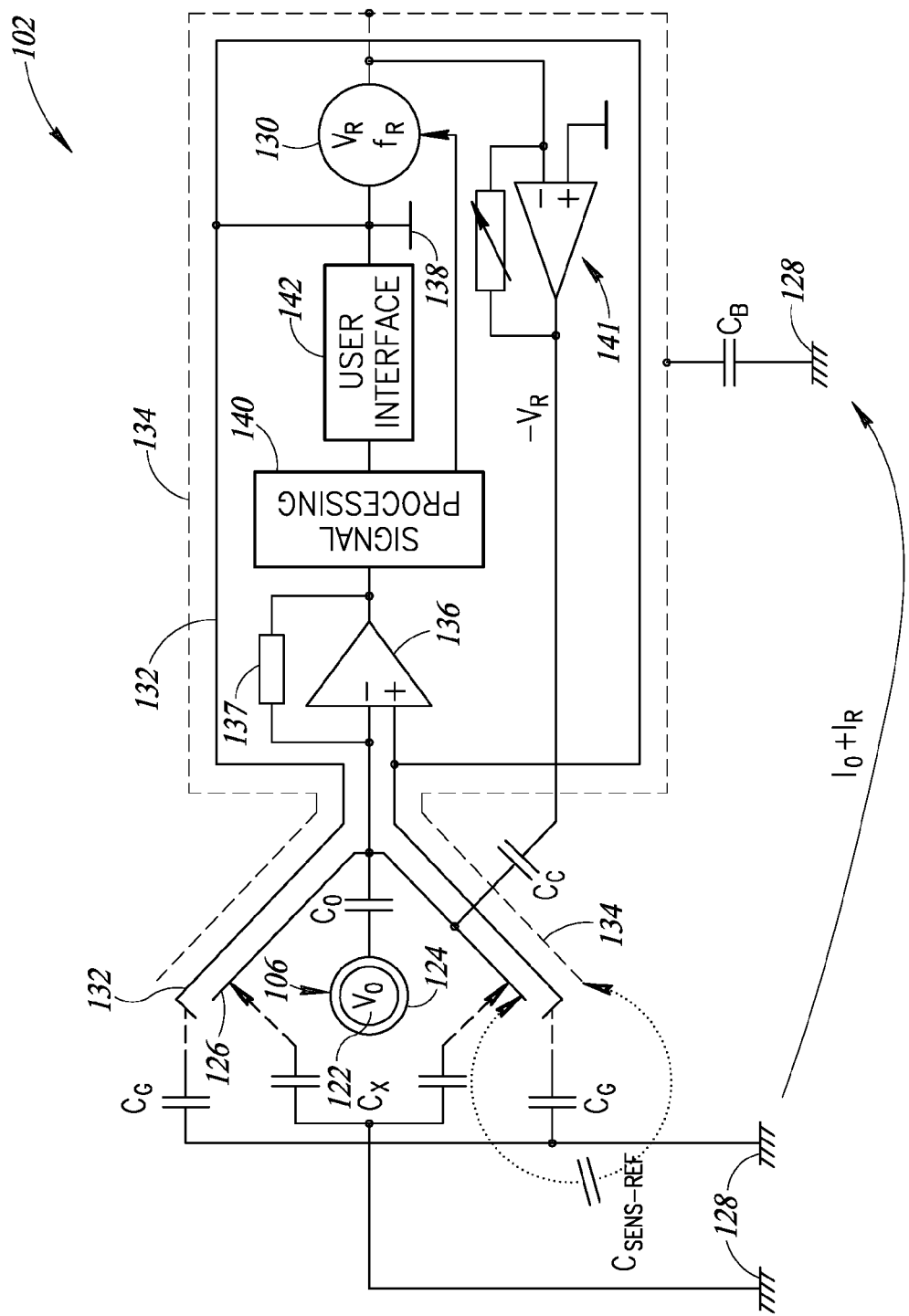
FIG. 7B is a schematic diagram of a non-contact voltage measurement system which shows various leakage and stray capacitances and includes compensation for a reference voltage signal, according to one illustrated implementation.
Figure 7C:
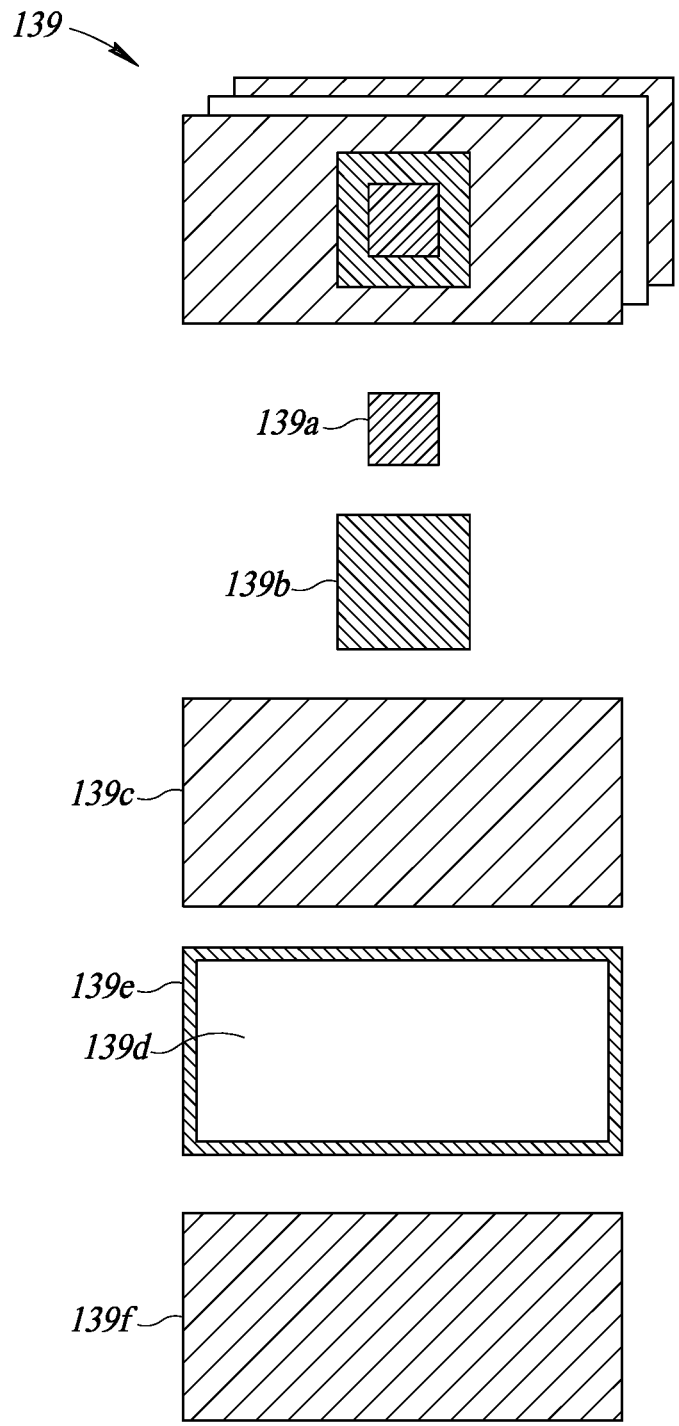
FIG. 7C shows an example sensor arrangement for the system of FIG. 7B, according to one illustrated implementation.

FIG. 7B shows an implementation which provides compensation for the impact that the reference voltage ($V_R$) has on the sensor 126 by using an inverted reference signal (−$V_R$) and an arrangement which couples the inverted reference signal to the sensor 126. FIG. 7C shows an example sensor arrangement which includes the inverted reference signal compensation.

In FIG. 7B, an adjustable inverting amplifier 141 is used to provide an inverted reference signal (−$V_R$) to the sensor 126 to compensate for the impact that the reference voltage (+$V_R$) has on the sensor. This may be achieved by a capacitive coupling ($C_C$) positioned proximate the sensor 126. The capacitive coupling ($C_C$) may be in the form of a wire, screen, shield, etc., positioned proximate the sensor. The compensation may be particularly advantageous when the insulated conductor 106 has a relatively small diameter because, in such instances, the reference voltage ($V_R$) from the reference shield 134 may have the greatest impact on the sensor 126.

FIG. 7C shows an example sensor arrangement 139 for use in an implementation which provides the aforementioned reference signal compensation. The sensor arrangement 139 includes a sensor 139a, an insulating layer 139b (e.g., Kapton® tape), an internal ground guard 139c, an inverted reference signal layer 139d (−$V_R$), an insulating layer 139e, and a reference signal layer 139f (+$V_R$).

Figure 10:
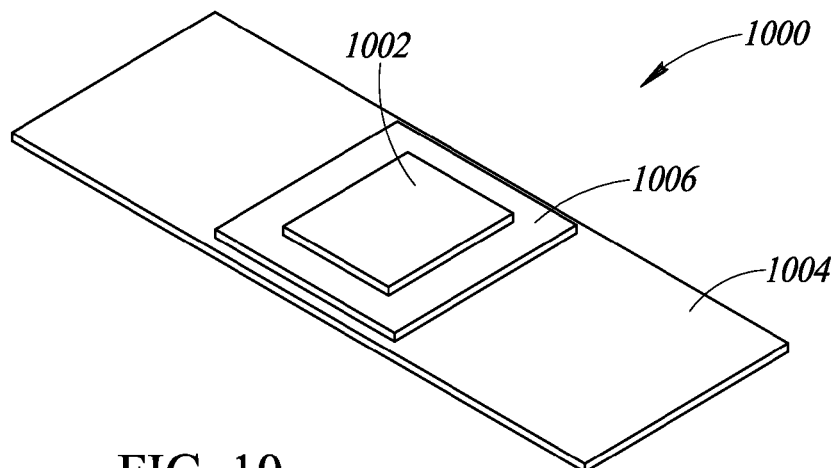
FIG. 10 is a perspective view of a sensor and internal ground guard assembly of a non-contact voltage measurement system, according to one illustrated implementation.

FIG. 10 is a perspective view of an example sensor and guard assembly 1000 for a non-contact voltage measurement system, such as any of the non-contact voltage measurement systems discussed above. In this example, the sensor and guard assembly 1000 comprises a conductive sensor 1002, an internal ground guard 1004, and an isolating layer 1006 disposed between the sensor and the internal ground guard. Generally, the sensor assembly 1000 should provide good coupling capacitance ($C_O$) between the sensor 1002 and the wire under test and should suppress the capacitance to other adjacent wires and the capacitance to the external ground. The sensor assembly 1000 should also minimize the capacitance ($C_{SENS-REF}$) between the sensor 1002 and the reference shield (e.g., reference shield 134).

As a simple example, the sensor 1002, guard 1004 and isolating layer 1006 may each comprise a piece of foil. The guard 1004 may be coupled to a carrier (see FIG. 11), the isolating layer 1006 (e.g., Kapton® tape) may be coupled to the guard, and the sensor 1002 may be coupled to the isolating layer.

Figure 11:
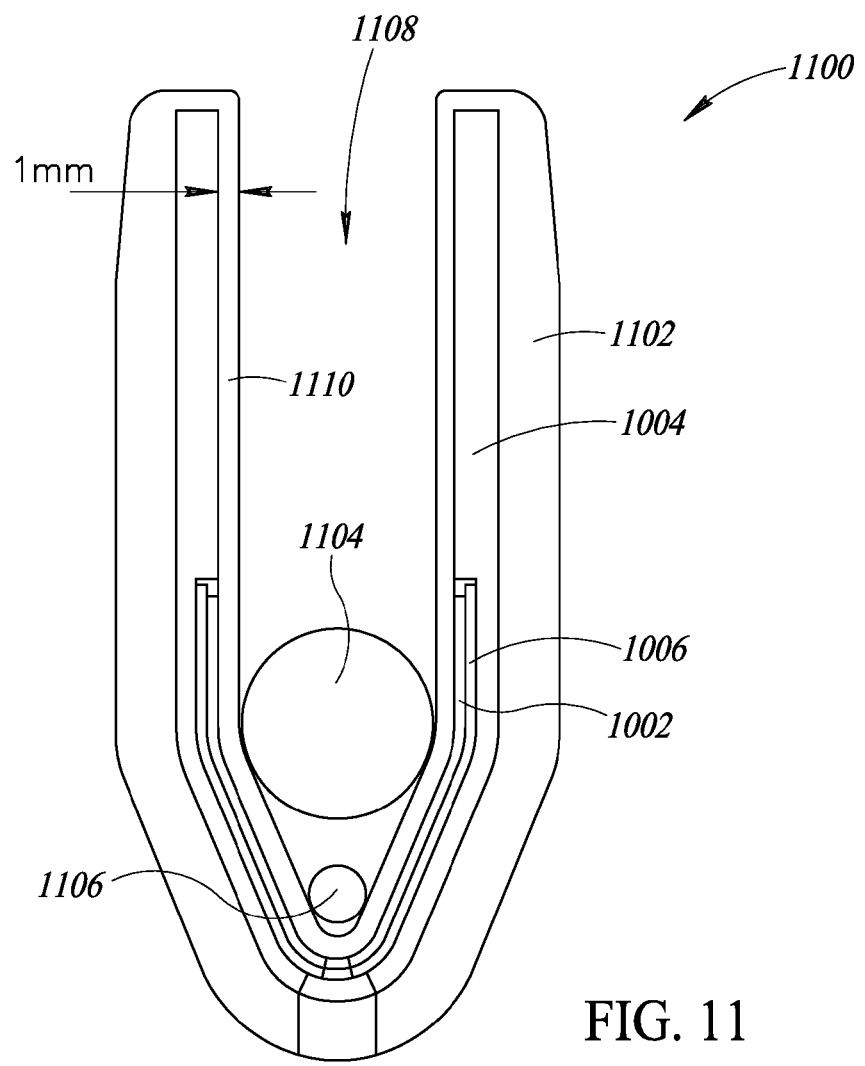
FIG. 11 is a sectional view of a "U" or "V" shaped sensor front end of a non-contact voltage measurement system, according to one illustrated implementation.

FIG. 11 shows a sectional view of an example for a sensor realization of a probe or front end 1100 of a non-contact voltage measurement system, which includes a housing layer 1102 (e.g., plastic) which covers the sensor assembly 1000 to avoid direct galvanic contact between the sensor assembly and any objects. The front end 1100 may be similar or identical to the front end 112 of the non-contact voltage measurement system 102 shown in FIGS. 1A and 1B. In this illustration, the sensor assembly 1000, including the sensor 1002, guard 1004 and isolating layer 1006, are shaped in the form of a "U" or "V," to allow the sensor assembly 1000 to surround insulated wires of different diameters, to increase the coupling capacitance ($C_O$), and to better shield, by the guard, against adjacent conductive objects.

In the example shown in FIG. 11, the sensor assembly 1000 is shaped to accommodate insulated wires of various diameters, such as an insulated wire 1104 with a relatively large diameter or an insulated wire 1106 with a relatively small diameter. In each case, the sensor assembly 1000 substantially surrounds the wire when the wire is positioned in a recessed portion 1108 of the front end 1100. A wall of the front end 1100 which defines the recessed portion 1108 and is positioned between the sensor assembly 1000 and the wire under test may be relatively thin (e.g., 1 mm), to provide galvanic isolation while still allowing for suitable capacitive coupling. Due to the "V" shape of the recessed portion 1108, thicker wires 1104 have more distance than thinner ones 1106 to reduce the wide range of coupling capacitance and also to reduce the environmental capacitance to be less independent of wire diameter.

Figure 12:
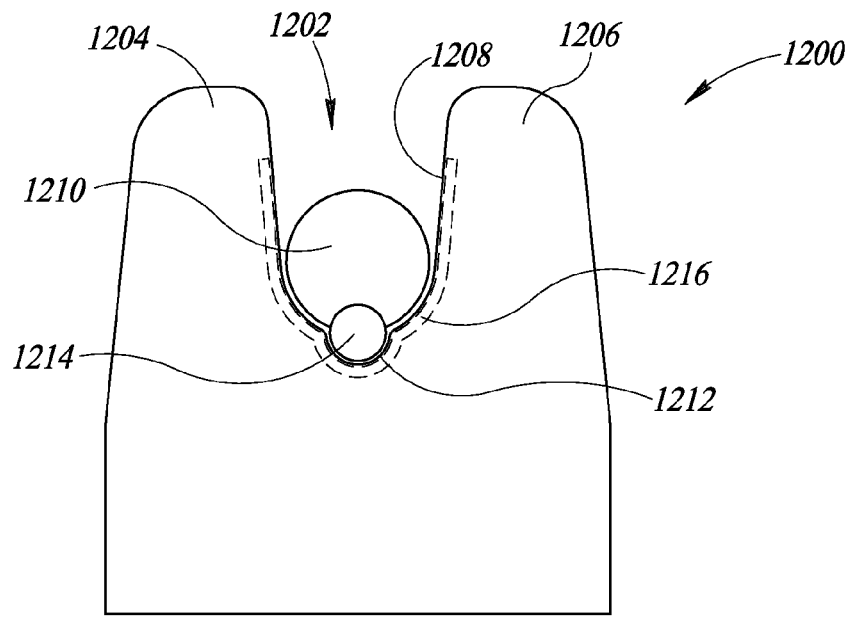
FIG. 12 is an elevational view of an arcuate-shaped sensor front end of a non-contact voltage measurement system, according to one illustrated implementation.

FIG. 12 shows an elevational view of an arcuate-shaped front end 1200 of a non-contact voltage measurement system. The front end 1200 includes a recessed portion 1202 defined by first and second extended portions 1204 and 1206. The recessed portion 1202 includes a relatively large upper arcuate-shaped portion 1208 which receives an insulated wire 1210 having a relatively large diameter. The recessed portion 1202 also includes a relatively small lower arcuate-shaped portion 1212, below the portion 1208, which receives an insulated wire 1214 having a relatively small diameter. A sensor assembly 1216, which may be similar to the sensor assembly 1000 shown in FIG. 10 and which is covered by the portions 1208 and 1212, may have a shape that substantially conforms to the arcuate-shaped portions 1208 and 1212 so that the sensor assembly 1216 substantially surrounds wires having a relatively large diameter (e.g., wire 1210) and wires having a relatively small diameter (e.g., wire 1214).

Figure 13:
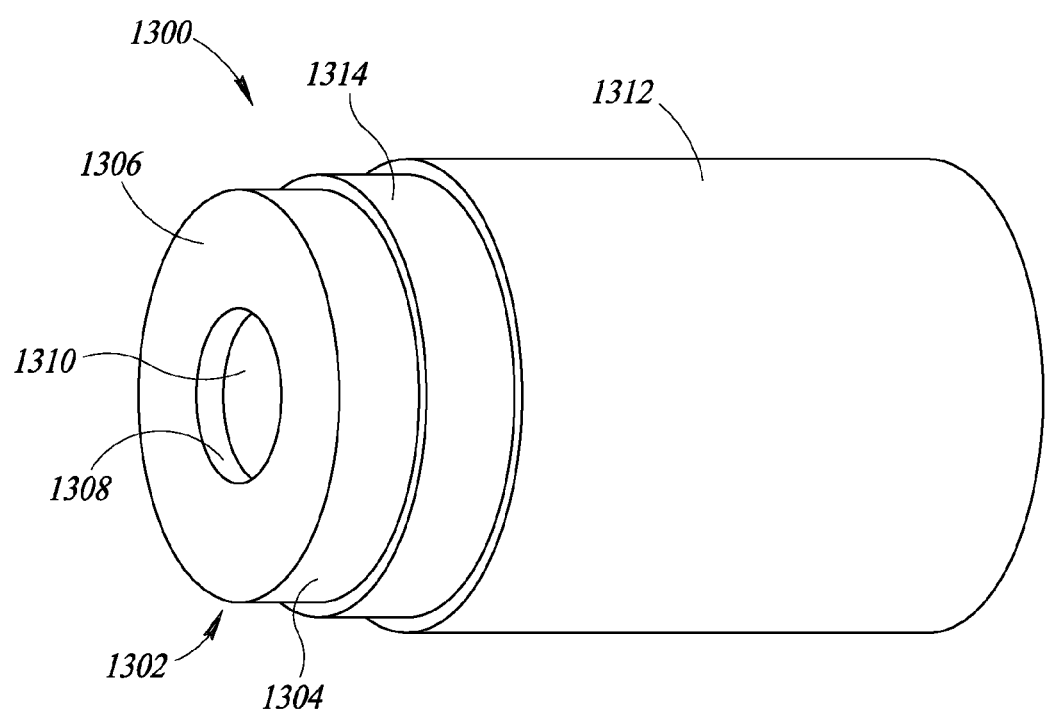
FIG. 13 is a perspective view of a cylindrically shaped sensor front end of a non-contact voltage measurement system, according to one illustrated implementation.

FIG. 13 is a perspective view of a cylindrically shaped front end 1300 of a non-contact voltage measurement system. In this example, the front end 1300 includes a cylindrically shaped internal ground guard 1302 which has a sidewall 1304 and a front surface 1306 which may be positioned proximate a wire under test. The front surface 1306 of the internal ground guard 1302 includes a central opening 1308. A conductive sensor 1310, which forms the coupling capacitor ($C_O$) together with a wire under test, is recessed behind the opening 1308 of the internal ground guard 1302 to avoid capacitive coupling with adjacent objects. The sensor 1310 may be recessed by a distance (e.g., 3 mm) from the front surface 1306 of the internal ground guard 1302, for example.

The sidewall 1304 of the internal ground guard 1302 maybe surrounded by a cylindrically shaped reference shield 1312, which is isolated from the internal ground guard by an isolating layer 1314. A common mode reference voltage source (e.g., voltage source 130) may be connected between the internal guard ground 1302 and the reference shield 1312 to provide the functionality discussed above.

Figure 14A:
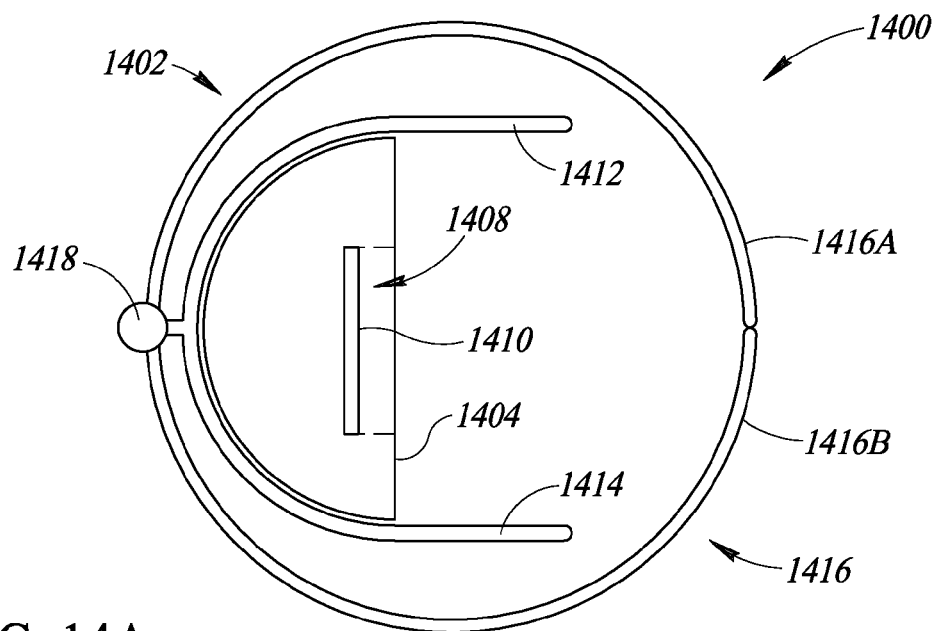
FIG. 14A is a top view of a sensor front end of a non-contact voltage measurement system when a guard ring clamp of an internal ground guard is in a closed position, according to one illustrated implementation.
Figure 14B:
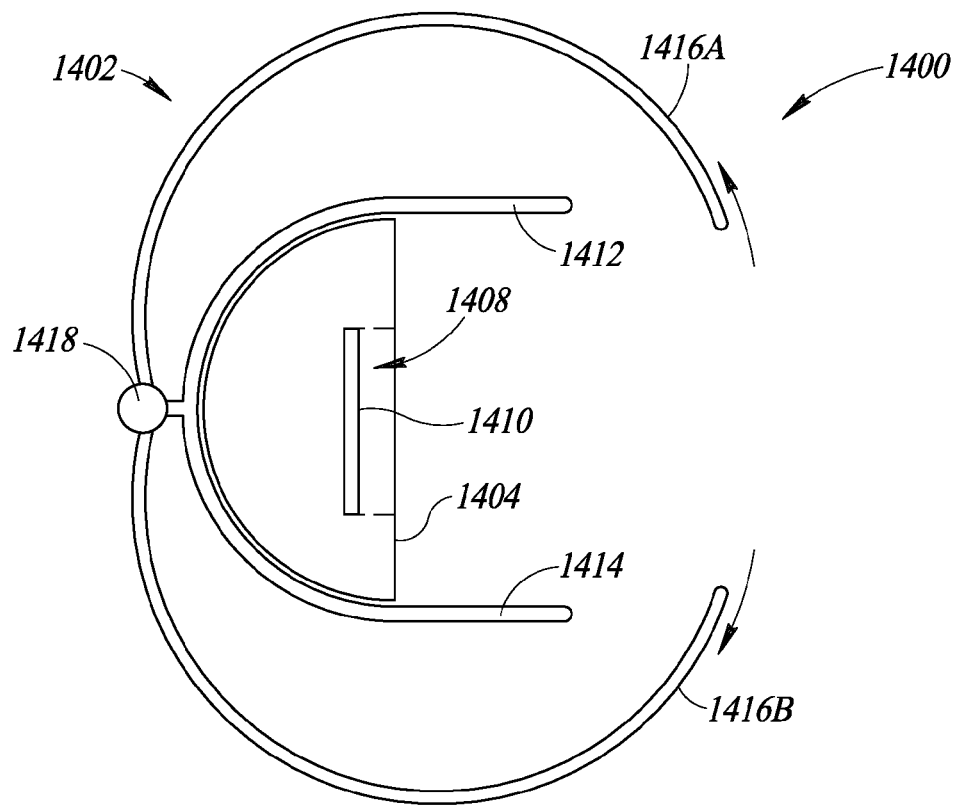
FIG. 14B is a top view of the front end of a non-contact voltage measurement system shown in FIG. 14A when the guard ring clamp of the internal ground guard is in an opened position, according to one illustrated implementation.
Figure 15:
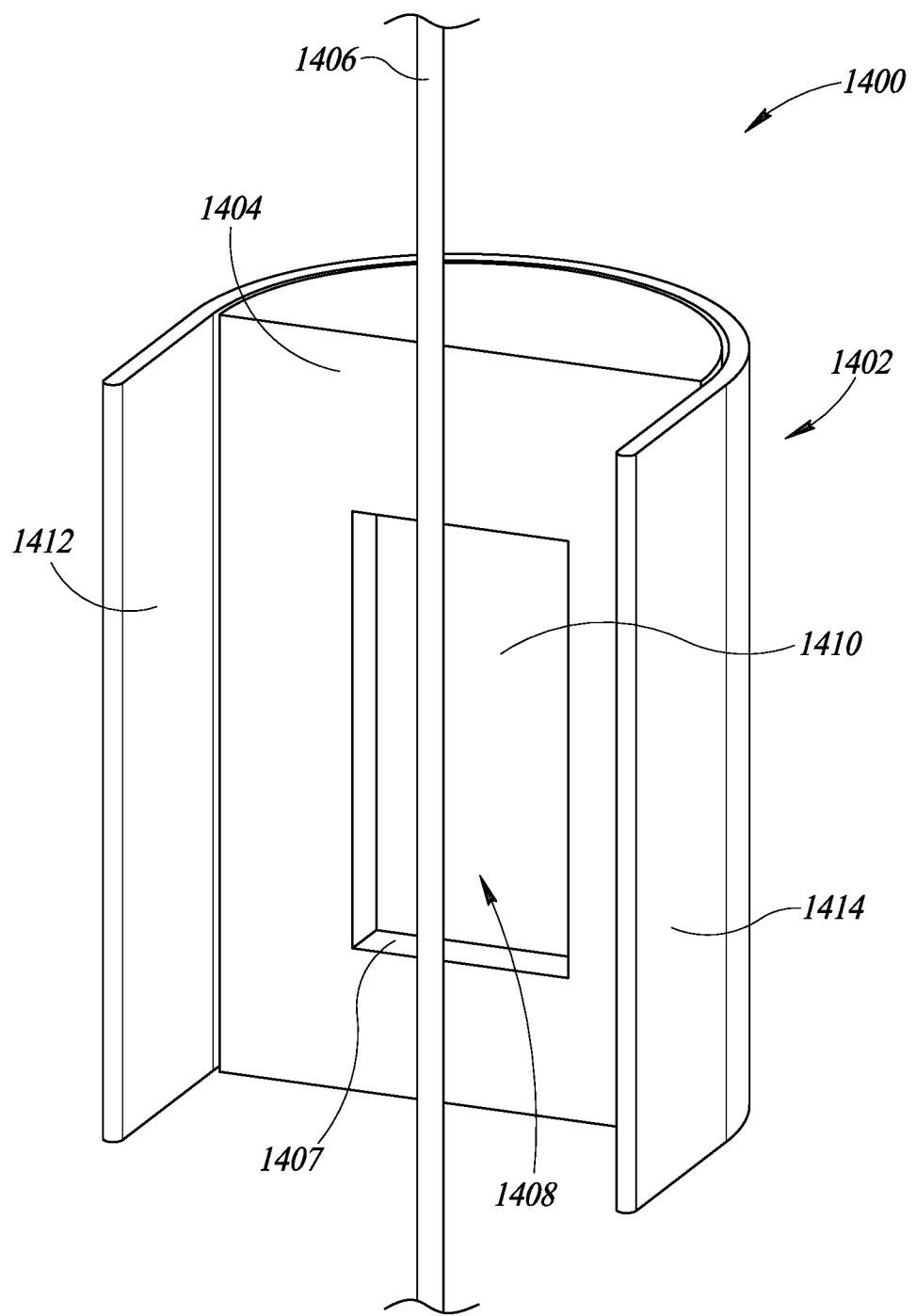
FIG. 15 is a perspective view of a portion of the sensor front end of FIG. 14A, with the guard ring clamp of the internal ground guard removed, according to one illustrated implementation.

FIGS. 14A and 14B show top views of a front end 1400 of a non-contact voltage measurement system, and FIG. 15 shows a perspective view of a portion of the front end. In this example, the front end 1400 includes an internal ground guard 1402 which includes front surface 1404 against which a wire 1406 (FIG. 15) under test may be positioned. The front surface 1404 includes an edge 1407, in this case rectangular-shaped, which defines an opening 1408 in the front surface. This small long rectangular opening accommodates the wire shape having also a longer but thin shape seen from the side. This again reduces adjacent wire influence and also has a high reduction of environmental capacitance related to the sensor. This results in high accuracy independent of wire size. A conductive sensor 1410, which forms the coupling capacitor ($C_O$) with a wire under test, is recessed behind the opening 1408 of the front surface 1404 of the internal guard ground 1402 by a distance (e.g., 3 mm).

The internal ground guard 1402 also includes sidewalls 1412 and 1414 which extend forward (toward the wire under test) from lateral edges of the front surface 1404. The sidewalls reduce sensor stray capacitance and direct reference signal coupling. The internal ground guard 1402 may also include a conductive guard ring clamp 1416 which includes a first clamp arm 1416A and a second clamp arm 1416B. The clamp arms 1416A and 1416B may be selectively moved into an opened position, shown in FIG. 14B, to allow a wire under test to be positioned adjacent the front surface 1404 of the internal ground guard 1402. Once the wire is in position, the clamp arms 1416A and 1416B may be selectively moved into a closed position, shown in FIG. 14A, to provide a shield around the sensor 1410 from capacitances with the external environment (e.g., adjacent conductors, adjacent objects). When in the closed position, the guard ring clamp 1416 may be substantially in the shape of a cylinder which has a height that extends above and below the sensor 1410, for example. The clamp arms 1416A and 1416B may be selectively movable using any suitable manual or automated actuation subsystem 1418. For example, the clamp arms 1416A and 1416B may be biased toward the closed position (FIG. 14A) by a spring or other biasing mechanism which functions as the actuation system 1418, which bias may be overcome by an operator to move the clamp arms into the opened position (FIG. 14B) so that a wire under test may be positioned proximate the front surface 1404 of the internal ground guard 1402.

Capacitive Divider Type Non-Contact Voltage Measurement Systems

The following discussion relates to systems and methods which utilize a capacitive divider type voltage sensor or system to measure AC voltage of an insulated conductor (e.g., insulated wire) without requiring a galvanic connection between the conductor and a test electrode or probe. The implementations disclosed in this section may be referred to herein as "capacitive divider type voltage sensors" or systems. Generally, a non-contact voltage measurement system is provided which includes a variable capacitance subsystem that operates to generate a variable capacitive voltage between an insulated conductor under test and earth ground. During measurement, the non-contact voltage measurement system varies the capacitance of the variable capacitance subsystem to change the impedance of a capacitive divider circuit between the insulated conductor under test and earth ground. By sequentially making two (or three) measurements across the variable capacitance subsystem, the AC voltage of the insulated conductor can be determined without requiring any galvanic connection to the insulated conductor. Such systems which do not require a galvanic connection are referred to herein as "non-contact." As used therein, "electrically coupled" includes both direct and indirect electrical coupling unless stated otherwise.

Figure 16:
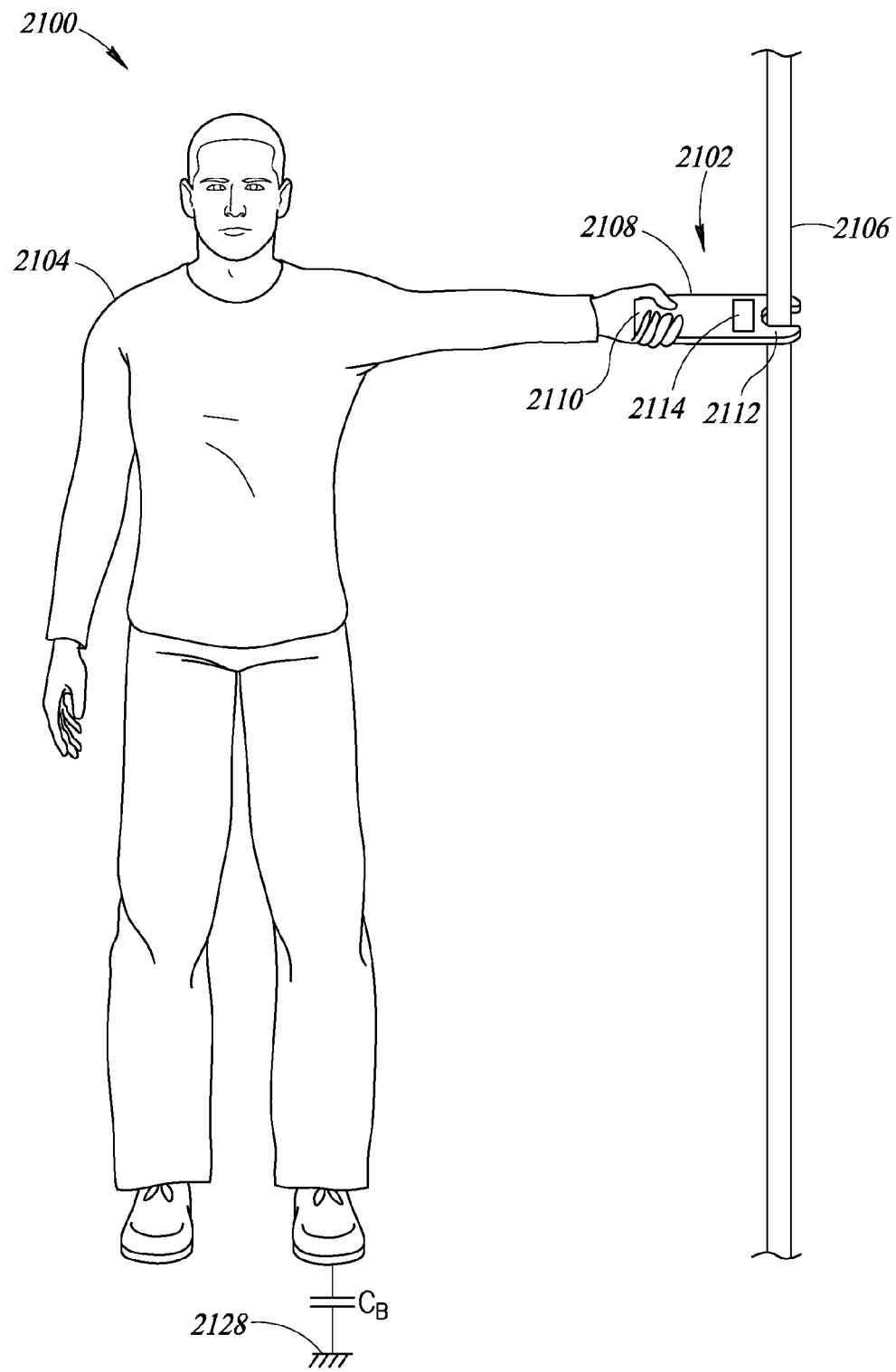
FIG. 16 is a pictorial diagram of an environment in which a non-contact voltage measurement system including a capacitive divider type voltage sensor may be used by an operator to measure AC voltage present in an insulated wire without requiring galvanic contact with the wire, according to one illustrated implementation.
Figure 17:
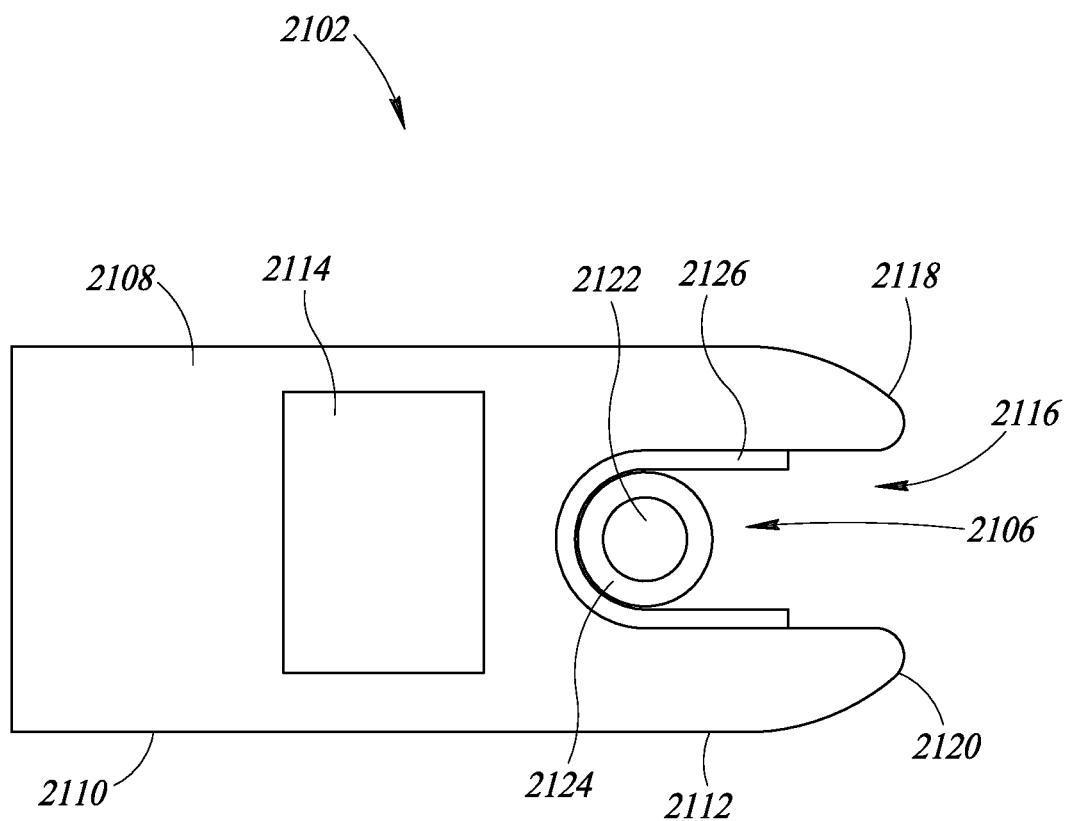
FIG. 17 is a top plan view of the non-contact voltage measurement system of FIG. 16, according to one illustrated implementation.

FIG. 16 is a schematic diagram of an environment 2100 in which a non-contact voltage measurement system 2102 of the present disclosure may be used by an operator 2104 to measure AC voltage present in an insulated wire 2106 without requiring galvanic contact between the non-contact voltage measurement system and the wire 2106. FIG. 17 is a top plan view of the non-contact voltage measurement system 2102 of FIG. 16. The non-contact voltage measurement system 2102 includes a housing or body 2108 which includes a grip portion or end 2110 and a probe portion or end 2112 opposite the grip portion. The housing 2108 may also include a user interface 2114 which facilitates user interaction with the non-contact voltage measurement system 2102. The user interface 2114 may include any number of inputs (e.g., buttons, dials, switches, touch sensor) and any number of outputs (e.g., display, LEDs, speakers, buzzers).

In at least some implementations, as shown best in FIG. 17, the probe portion or end 2112 may include a recessed portion 2116 defined by first and second extended portions 2118 and 2120. The recessed portion 2116 receives the insulated wire 2106. The insulated wire 2106 includes a conductor 2122 and an insulator 2124 surrounding the conductor 2122. The recessed portion 2116 may include a sensor or electrode 2126 which rests adjacent or substantially adjacent the insulator 2124 of the insulated wire 2106 when the insulated wire is positioned within the recessed portion 2116 of the non-contact voltage measurement system 2102.

As shown in FIG. 16, in use the operator 2104 may grasp the grip portion 2110 of the housing 2108 and place the probe portion 2112 proximate the insulated wire 2106 so that the non-contact voltage measurement system 2102 may accurately measure the AC voltage present in the wire with respect to earth ground (or another reference node). Although the probe portion or end 2112 is shown as having the recessed portion 2116, in other implementations the probe portion 2112 may be configured differently. For example, in at least some implementations the probe portion 2112 may include a selectively movable clamp, a hook, a flat or arcuate surface which includes the sensor, or other type of interface which allows a sensor of the non-contact voltage measurement system 2102 to be positioned adjacent the insulated wire 2106.

As discussed further below, in at least some implementations, the non-contact voltage measurement system 2102 may utilize the body capacitance ($C_B$) between the operator 2104 and ground 2128 during the AC voltage measurement. The particular systems and methods used by the non-contact voltage measurement system 2102 to measure AC voltage are discussed below with reference to FIGS. 18-22.

Figure 18:
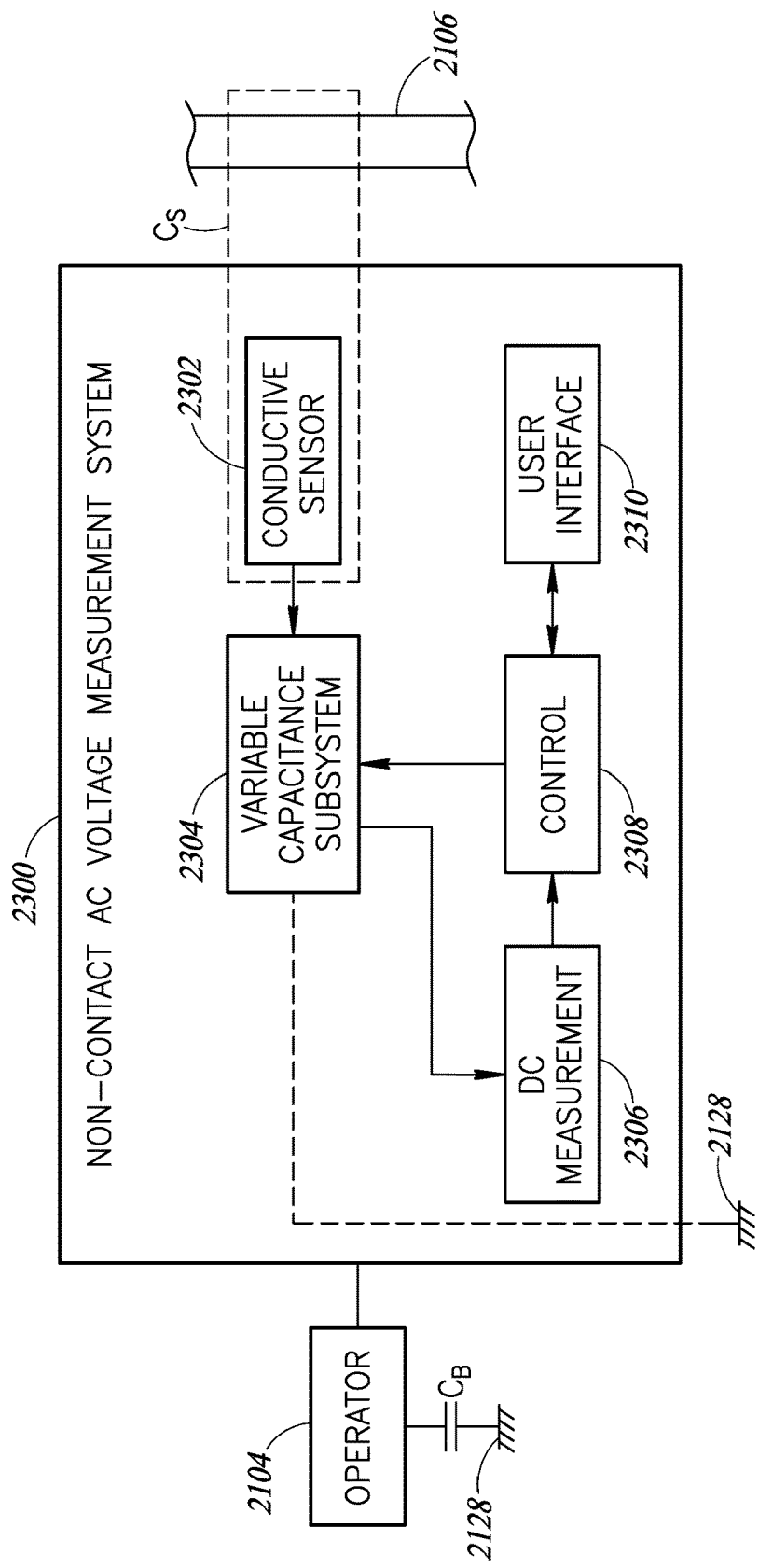
FIG. 18 is a high level block diagram of a non-contact voltage measurement system, according to one illustrated implementation.

FIG. 18 is a high level block diagram of a non-contact voltage measurement system 2300. The non-contact voltage measurement system 2300 may be similar or identical to the non-contact voltage measurement system 2102 of FIGS. 16 and 17 discussed above.

The non-contact voltage measurement system 2300 includes a conductive sensor or electrode 2302 which is sized, dimensioned and positioned to be adjacent the insulated wire 2106 when the operator 2104 positions the probe portion or end 2112 (FIG. 16) proximate the wire. The sensor 2302 may be similar or identical to the sensor 2126 of FIG. 17, for example. When the non-contact voltage measurement system 2300 is positioned proximate the insulated wire 2106 with the sensor 2302 adjacent the wire, the sensor capacitively couples with the insulated wire. In other words, a conductive portion of the sensor 2302 comprises one half of a sensor capacitor ($C_S$), with the conductor 2122 of the insulated wire 2106 (FIG. 17) comprising the other half of the sensor capacitor. In at least some implementations, the sensor 2302 may be designed such that the sensitivity to electromagnetic fields on a side of the sensor facing the insulated wire 2106 is greater than the sensitivity to electromagnetic fields on other sides of the sensor not facing the insulated wire.

The non-contact voltage measurement system 2300 also includes a variable capacitance subsystem 2304 which is electrically coupled to the conductive sensor 2302. The variable capacitance subsystem 2304 has a capacitance value which is selectively variable between at least a first capacitance value ($C_1$) and a second capacitance value ($C_2$), where the second capacitance value ($C_2$) different from the first capacitance value ($C_1$). In at least some implementations, the variable capacitance subsystem 2304 may be controlled to selectively have a capacitance value which is variable between at least a first capacitance value ($C_1$), a second capacitance value ($C_2$), and a third capacitance value ($C_3$), where each of the first, second and third capacitance values are different from one another. As discussed further below, the variable capacitance subsystem 2304 is used to vary the capacitance of a series capacitive circuit which extends from the insulated wire 2106 through the non-contact voltage measurement system 2300 to earth ground 2128 or other reference node.

In at least some implementations, at least one of the capacitance values (e.g., capacitance value $C_1$) may be selectively variable to accommodate varying values of input signals and input capacitances. For example, the system 2300 may determine that the input signal is too large or too small for an accurate measurement, and may selectively adjust one or more of the capacitance values so that accurate signal measurements may be obtained. As such, one or more of the capacitance values (e.g., $C_1$) may be implemented utilizing a plurality of physical capacitors which may be selectively combined to provide a desired capacitance value suitable for a particular input signal and input capacitance.

The non-contact voltage measurement system 2300 also includes a voltage measurement subsystem 2306 which is operative to sense the voltage, or a signal indicative of the voltage, across the variable capacitance subsystem 2304. In at least some implementations, the voltage measurement subsystem 2306 may include an analog-to-digital converter (ADC) which converts an analog voltage signal into a digital signal. For example, the voltage measurement subsystem 2306 may include an ADC which has a relatively high effective resolution, such as 20 or more bits (e.g., 22 bits) of resolution, which facilitates highly accurate measurements. In at least some implementations, the voltage measurement subsystem 2306 may include conditioning circuitry (e.g., one or more amplifiers and/or filters) to buffer, shape, and/or amplify the detected voltage from the variable capacitance subsystem 2304 prior to converting the signal to digital form using an ADC.

The non-contact voltage measurement system 2300 may also include a controller 2308 which is communicatively coupled to the voltage measurement subsystem 2306 and the variable capacitance subsystem 2304. The controller 2308 may be any suitable hardware, software or combination thereof. As an example, the controller 2308 may include one or more processors and one or more nontransitory processor-readable storage media communicatively coupled to the one or more processors. The nontransitory processor-readable storage media may store instructions and/or data which, when executed by the one or more processors, cause the one or more processors to implement the functionality discussed herein (e.g., measure AC voltage in the insulated wire 2106).

The controller 2308 may include any type of processing unit, such as one or more central processing units (CPUs), digital signal processors (DSPs), application-specific integrated circuits (ASICs), field programmable gate arrays (FPGAs), programmable logic controllers (PLCs), artificial neural network circuits or systems, or any other logic components. The nontransitory processor-readable storage medium coupled to the controller 2308 may include any type of nontransitory volatile and/or non-volatile memory.

The non-contact voltage measurement system 2300 may also include a user interface 2310 communicatively coupled to the controller 2308. The user interface 2310 may include any number of inputs (e.g., buttons, dials, switches, touch sensor) and any number of outputs (e.g., display, LEDs, speakers, buzzers). In at least some implementations, the controller 2308 and/or user interface 2310 may include one or more wired and/or wireless communication interfaces (e.g., USB, Bluetooth®, WiFi®) which allow data and/or instructions to be communicated between the non-contact voltage measurement system 2300 and one or more external devices.

In operation, the operator 2104 may position the non-contact voltage measurement system 2300 proximate the insulated wire 2106 so that the sensor 2302 capacitively couples with the wire to form the sensor capacitor $C_S$. When the sensor 2302 is so positioned, the controller 2308 may cause the variable capacitance subsystem 2304 to have different capacitance values, and may obtain measurements from the voltage measurement subsystem 2306 at each of the different capacitance values. The controller 2308 may then determine the magnitude of the AC voltage present in the insulated wire 2106 based on the obtained measurements, and present the result to the operator 2104 via the user interface 2310. Additional details regarding the particular implementations of the non-contact voltage measurement system 2300 are discussed below with reference to FIGS. 19-21.

Figure 19:
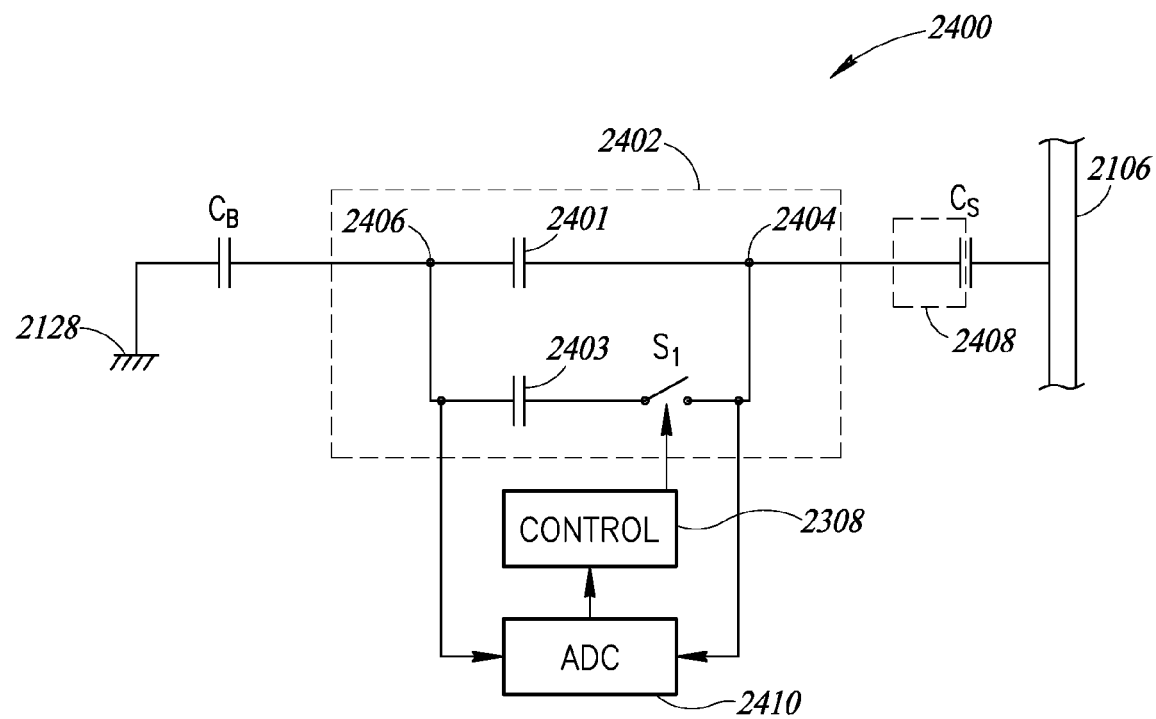
FIG. 19 is a schematic diagram of a non-contact voltage measurement system which includes a variable capacitance subsystem that utilizes two capacitors, according to one illustrated implementation.

FIG. 19 is a schematic diagram of a non-contact voltage measurement system 2400 which includes a variable capacitance subsystem 2402 that utilizes two capacitors, designated capacitors 2401 and 2403. The capacitors 2401 and 2403 may have capacitance values which are the same as each other or different from each other. As a non-limiting example, the capacitors 2401 and 2403 may each have a capacitance value of 1000 picofarads (pF). As another example, the capacitor 2401 may have a capacitance value of 1000 pF and the capacitor 2403 may have a capacitance value of 2000 pF.

The variable capacitance subsystem 2402 includes a first capacitance subsystem node 2404 and a second capacitance subsystem node 2406. The capacitor 2401 is electrically coupled between the first capacitance subsystem node 2404 and the second capacitance subsystem node 2406. The first capacitance subsystem node 2404 is further electrically coupled to a conductive sensor 2408, which may be similar or identical to the conductive sensors 2126 and 2302 of the non-contact voltage measurement systems 2102 and 2300, respectively, of FIGS. 17 and 18 discussed above. As discussed above, when the non-contact voltage measurement system 2400 is positioned adjacent the insulated wire 2106, the conductive sensor 2408 forms one half of a sensor capacitor $C_S$, with the conductor 2122 (FIG. 17) of the wire 2106 forming the other half of the sensor capacitor $C_S$.

The variable capacitance subsystem 2402 also includes a switch $S_1$ which operates to selectively electrically couple the capacitor 2403 in parallel with the capacitor 2401. Thus, by selectively controlling the switch $S_1$, the capacitance value between the first capacitance subsystem node 2404 and the second capacitance subsystem node 2406 is selectively variable between the capacitance value of the capacitor 2401 and the sum of the capacitance values of the capacitors 2401 and 2403. In the case where the capacitors 2401 and 2403 have the same capacitance values (e.g., 1000 pF), the capacitance of the variable capacitance subsystem 2402 when the switch $S_1$ is closed is twice the capacitance of the variable capacitance subsystem 2402 when the switch $S_1$ is opened (e.g., 2000 pF versus 1000 pF).

The second capacitance subsystem node 2406 may be electrically coupled to ground 2128 via body capacitance $C_B$, which is the capacitance of the operator 2104 (FIGS. 16 and 17) holding the non-contact voltage measurement system 2400 during operation. Generally, the operator's body may be modeled as a conductor covered by a thin insulator with respect to ground 2128. Typically, the body capacitance $C_B$ is in the range of tens to low hundreds of picofarads (e.g., 50-300 pF), depending on various factors. In at least some implementations, rather than utilizing the body capacitance $C_B$, the second capacitance subsystem node 2406 may be optionally electrically coupled to ground 2128 via a suitable electrical connection between the non-contact voltage measurement system 2400 and ground.

The controller 2308 is coupled to selectively control the operation of the switch $S_1$, which in turn selectively controls the capacitance value of the variable capacitance subsystem 2402 to be either capacitance value $C_1$ or capacitance value $C_2$. In this example, the capacitance value $C_1$ is equal to the capacitance of the capacitor 2401, and the capacitance value $C_2$ is equal to the sum of the capacitances of the capacitors 2401 and 2403. In other examples, depending on the arrangement of capacitors and one or more switches between the first capacitance subsystem node 2404 and the second capacitance subsystem node 2406, different capacitance values $C_1$ and $C_2$ in the variable capacitance subsystem 2402 may be selectively attained.

The non-contact voltage measurement system 2400 also includes an ADC 2410 which is electrically coupled to the first capacitance subsystem node 2404 and the second capacitance subsystem node 2406. The ADC 2410 is communicatively coupled to the controller 2308 via a suitable interface (e.g., synchronous serial interface (SSI)). The ADC 2410 is operative to convert an analog voltage between the first capacitance subsystem node 2404 and the second capacitance subsystem node 2406 into a digital signal, and to provide the digital signal to the controller 2308. In at least some implementations, the ADC 2410 may have a relatively high effective resolution, such as 20 or more bits (e.g., 22 bits, 24 bits, 30 bits) of resolution. Although not shown for clarity, the ADC 2410 may include or be coupled to conditioning circuitry (e.g., one or more amplifiers and/or filters) to buffer, shape, and/or amplify the detected voltage from the variable capacitance subsystem 2402 prior to converting the signal to digital form. Further, although the controller 2308 and ADC 2410 are shown schematically as separate components, in at least some implementations some or all of the functionality may be combined into a single system or component (e.g., a single integrated circuit).

To measure the AC voltage in the wire 2106 when the sensor 2408 is positioned adjacent the wire such that the sensor and the wire form the sensor capacitor $C_S$, the controller 2308 may first cause the variable capacitance subsystem 2402 to have the first capacitance value $C_1$ between the first capacitance subsystem node 2404 and the second capacitance subsystem node 2406. For example, the controller 2308 may achieve such by opening the switch $S_1$, which causes the variable capacitance subsystem 2402 to have a capacitance value equal to the capacitance of the capacitor 2401.

Next, while the variable capacitance subsystem 2402 has the first capacitance value $C_1$, the controller 2308 may cause the ADC 2410 to capture or measure a first voltage $V_{M1}$ between the first capacitance subsystem node 2404 and the second capacitance subsystem node 2406. Such voltage $V_{M1}$ may be stored by the controller 2308 in a nontransitory processor-readable storage medium for subsequent use.

Next, after obtaining the measurement of the first voltage $V_{M1}$, the controller 2308 may cause the variable capacitance subsystem 2402 to have the second capacitance value $C_2$ between the first capacitance subsystem node 2404 and the second capacitance subsystem node 2406. For example, the controller 2308 may achieve such by closing the switch $S_2$ to place the capacitor 2403 in parallel with the capacitor 2401, which causes the variable capacitance subsystem 2402 to have a capacitance value equal to the sum of the capacitance values of the capacitors 2401 and 2403.

While the variable capacitance subsystem 2402 has the second capacitance value $C_2$, the controller 2308 may cause the ADC 2410 to capture or measure a second voltage $V_{M2}$ between the first capacitance subsystem node 2404 and the second capacitance subsystem node 2406.

Next, the controller 2308 may determine the AC voltage in the insulated wire 2106 based at least in part on the detected first voltage $V_{M1}$, the detected second voltage $V_{M2}$, the first capacitance value $C_1$ and the second capacitance value $C_2$. An example process for determining the AC voltage in the insulated wire 2106 is discussed below with reference to FIG. 20.

Figure 20:
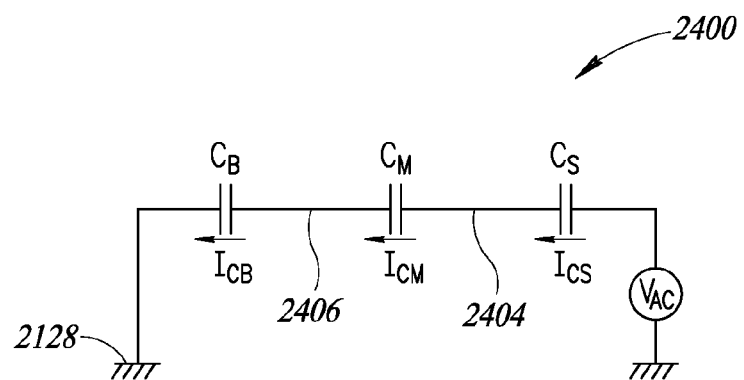
FIG. 20 is a schematic circuit diagram of the non-contact voltage measurement system of FIG. 19, according to one illustrated implementation.

FIG. 20 shows a schematic circuit diagram of the non-contact voltage measurement system 2400 of FIG. 19. In this example, the AC voltage of the insulated wire 2106 is represented by an AC source ($V_{AC}$). A series capacitive circuit is formed between the AC source ($V_{AC}$), the sensor capacitor $C_S$, a measurement capacitance $C_M$ which is either the capacitance value $C_1$ or the capacitance value $C_2$ depending on the state of the switch $S_1$, and the body capacitance $C_B$ of the operator 2104 (FIGS. 16 and 17). As discussed above, the ADC 2410 obtains a first voltage measurement $V_{M1}$ across the nodes 2404 and 2406 when the variable capacitance subsystem 2402 has a first capacitance value (i.e., $C_M = C_1$), and obtains a second voltage measurement $V_{M2}$ across the nodes 2404 and 2406 when the variable capacitance subsystem has a second capacitance value (i.e., $C_M = C_2$). The measured voltage $V_M$ is equal to the potential difference between the voltage ($V_{404}$) at the node 2404 and the voltage ($V_{406}$) at the node 2406 (i.e., $V_M = V_{404} - V_{406}$).

The current at node 2404 may be expressed by the equation:

$$I_{CS} - I_{CM} = 0 \tag{6}$$

The current ($I_{CS}$) is given by the following equation:

$$I_{CS} = \frac{V_{AC} - V_{404}}{\frac{1}{s \times C_S}} \tag{7}$$

where ($V_{AC} - V_{404}$) is the voltage across the sensor capacitor $C_S$, s is the Laplace variable, and ($1/(s \times C_S)$) is the impedance of the sensor capacitor $C_S$. The current ($I_{CM}$) is given by the following equation:

$$I_{CM} = \frac{V_{404} - V_{406}}{\frac{1}{s \times C_M}} \tag{8}$$

where ($V_{404} - V_{406}$) is the voltage across the capacitor $C_M$ and ($1/(s \times C_M)$) is the impedance of the capacitance $C_M$.

Similarly, the current at the node 2406 may be expressed by the equation:

$$I_{CM} - I_{CB} = 0 \tag{9}$$

The current ($I_{CB}$) is given by the following equation:

$$I_{CB} = \frac{V_{406} - 0}{\frac{1}{s \times C_B}} \quad (10)$$

where ($V_{406}$–0) is the voltage across the body capacitor $C_B$ and (1/(s×$C_B$)) is the impedance of the body capacitance $C_B$. The current ($I_{CM}$) is provided above.

Using equations (6) and (9) above, and $V_M = V_{404} - V_{406}$, $V_M$ may be expressed by the following equation:

$$V_M = V_{AC} \times \frac{C_x}{C_M + C_x} \quad (11)$$

where $$C_x = \frac{C_B \times C_S}{C_B + C_S} \quad (12)$$

As discussed above, the ADC 2410 obtains a first voltage measurement $V_{M1}$ when the variable capacitance system 2402 has the capacitance value $C_1$, and obtains a second voltage measurement $V_{M2}$ when the variable capacitance system 2402 has the capacitance value $C_2$. Thus, $V_{M1}$ and $V_{M2}$ may be expressed by the following equations:

$$V_{M1} = V_{AC} \times \frac{C_x}{C_1 + C_x} \quad (13)$$

$$V_{M2} = V_{AC} \times \frac{C_x}{C_2 + C_x} \quad (14)$$

Equations (13) and (14) may be solved for the AC voltage ($V_{AC}$) in the insulated wire 2106, which is provided by the following equation:

$$V_{AC} = \frac{V_{M1}\left(\frac{C_1}{C_2} - 1\right)}{\frac{C_1 V_{M1}}{C_2 V_{M2}} - 1} \quad (15)$$

As can be seen from equation (15), the AC voltage ($V_{AC}$) can be determined during runtime using only the known capacitance values $C_1$ and $C_2$ (or the ratio between the capacitance values $C_1$ and $C_2$) and the measured voltages $V_{M1}$ and $V_{M2}$. That is, the sensor capacitor $C_S$ and the body capacitance $C_B$ need not be determined to obtain the AC voltage ($V_{AC}$) in the insulated wire 2106. It is further noted that the frequency of the AC voltage drops out of the equations, but the overall impedance of the system 2400 depends on the frequency and the capacitance of the smallest capacitor in the circuit. For example, with a sensor capacitance $C_S$ of 1 pF which is the smallest capacitor in the circuit, the impedance of the circuit is on the order of 3.5 GΩ at 50 Hz.

Figure 21:
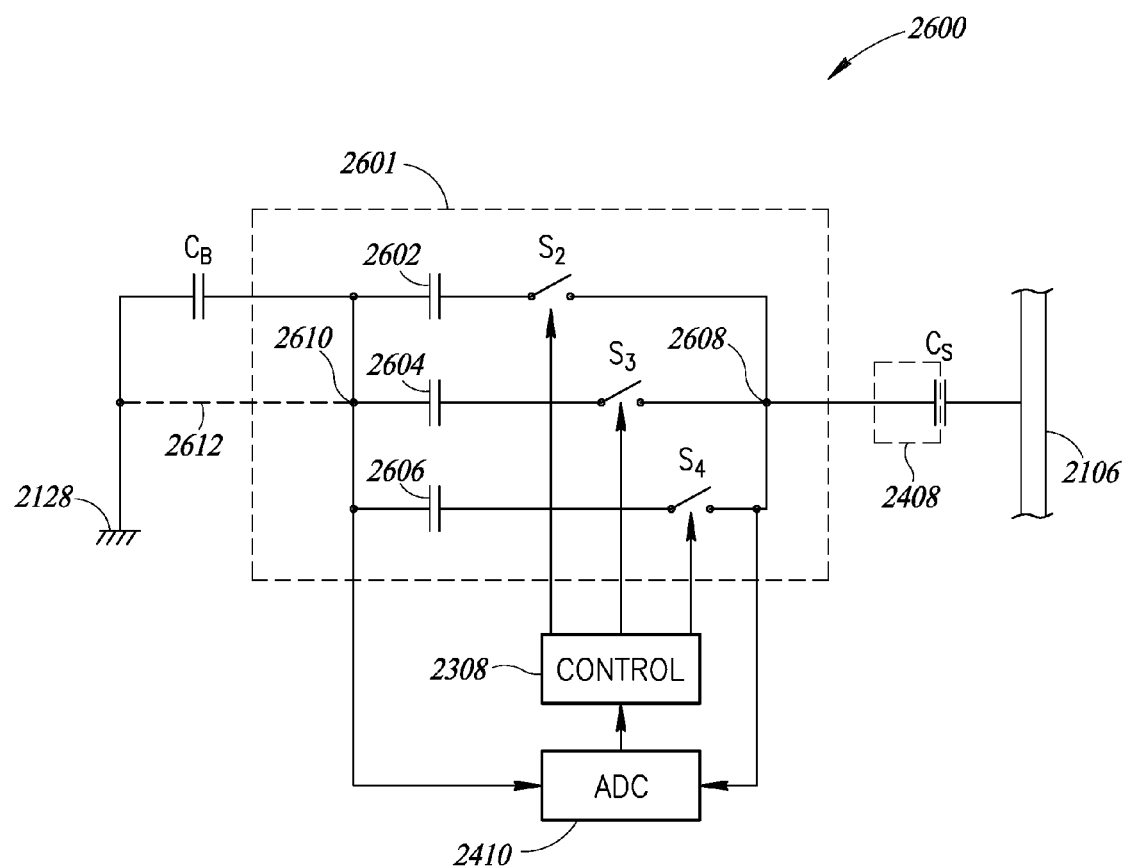
FIG. 21 is a schematic diagram of a non-contact voltage measurement system which includes a variable capacitance subsystem that utilizes three capacitors, according to one illustrated implementation.

FIG. 21 is a schematic diagram of a non-contact voltage measurement system 2600 which includes a variable capacitance subsystem 2601 that utilizes three capacitors, namely capacitors 2602, 2604, and 2606. The non-contact voltage measurement system 2600 is similar or identical to the non-contact voltage measurement systems discussed above, so only substantial differences are discussed below for the sake of brevity.

The non-contact voltage measurement system 2600 includes a first capacitance subsystem node 2608 electrically coupled to the sensor 2408, and a second capacitance subsystem node 2610 electrically coupled to ground 2128 via the body capacitance $C_B$ of the operator 2104 (FIGS. 16 and 17). In at least some implementations, the second capacitive subsystem node 2610 may be optionally electrically coupled directly to ground 2128 via a suitable electrical connection 2612 ("reference connection").

The capacitor 2602 may be selectively coupled in series between the nodes 2608 and 2610 via a switch $S_2$ which is controllable by the controller 2308. The capacitor 2604 may be selectively coupled in series between the nodes 2608 and 2610 via a switch $S_3$ which is controllable by the controller 2308. The capacitor 2606 may be selectively coupled in series between the nodes 2608 and 2610 via a switch $S_4$ which is controllable by the controller 2308. In at least some implementations, the controller 2308 closes one of the switches $S_2$, $S_3$ and $S_4$ at a time to couple one of the capacitors in series between the nodes 2608 and 2610 at a time. In such instances, each of the capacitors 2602, 2604 and 2606 may have different capacitance values from each other. For example, the capacitor 2602 may have a capacitance value of 1000 pF, the capacitor 2604 may have a capacitance value of 2000 pF and the capacitor 2606 may have a capacitance value of 24000 pF. Generally, the capacitance values should be chosen to provide a relatively large variation in the voltage measurements when each of the capacitors is switched into the circuit.

To measure the AC voltage ($V_{AC}$) in the wire 2106 when the sensor 2408 is positioned adjacent the wire 2106 such that the sensor and the wire form the sensor capacitor $C_S$, the controller 2308 may first cause the variable capacitance subsystem 2402 to have the first capacitance value $C_1$ between the first capacitance subsystem node 2608 and the second capacitance subsystem node 2610. For example, the controller 2308 may achieve such by closing the switch $S_2$ and opening the switches $S_3$ and $S_4$, which causes the variable capacitance subsystem 2601 to have a capacitance value equal to the capacitance of the capacitor 2602.

Next, while the variable capacitance subsystem 2402 has the first capacitance value $C_1$, the controller 2308 may cause the ADC 2410 to capture a first measured voltage $V_{M1}$ between the first capacitance subsystem node 2608 and the second capacitance subsystem node 2610. Such voltage $V_{M1}$ may be stored by the controller 2308 in a nontransitory processor-readable storage medium for subsequent use.

Next, after obtaining the measurement of the first voltage $V_{M1}$, the controller 2308 may cause the variable capacitance subsystem 2601 to have the second capacitance value $C_2$ between the first capacitance subsystem node 2608 and the second capacitance subsystem node 2610. For example, the controller 2308 may achieve such by closing the switch $S_3$ and opening the switches $S_2$ and $S_4$, which causes the variable capacitance subsystem 2601 to have a capacitance value equal to the capacitance value of the capacitor 2604.

While the variable capacitance subsystem 2601 has the second capacitance value $C_2$, the controller 2308 may cause the ADC 2410 to capture a second measured voltage $V_{M2}$ between the first capacitance subsystem node 2608 and the second capacitance subsystem node 2610.

After obtaining the measurement of the second voltage $V_{M2}$, the controller 2308 may cause the variable capacitance subsystem 2601 to have the third capacitance value $C_3$ between the first capacitance subsystem node 2608 and the second capacitance subsystem node 2610. For example, the controller 2308 may achieve such by closing the switch $S_4$ and opening the switches $S_2$ and $S_3$, which causes the variable capacitance subsystem 2601 to have a capacitance value equal to the capacitance value of the capacitor 2606.

While the variable capacitance subsystem 2601 has the third capacitance value $C_3$, the controller 2308 may cause the ADC 2410 to capture a third measured voltage $V_{M3}$ between the first capacitance subsystem node 2608 and the second capacitance subsystem node 2610.

Next, the controller 2308 may determine the AC voltage ($V_{AC}$) in the insulated wire 2106 based at least in part on the detected first voltage $V_{M1}$, the detected second voltage $V_{M2}$, the detected third voltage $V_{M3}$, the first capacitance value $C_1$, the second capacitance value $C_2$ and the third capacitance value $C_3$. An example process for determining the AC voltage ($V_{AC}$) in the insulated wire 2106 is discussed below.

When the switch $S_2$ is closed and the switches $S_3$ and $S_4$ are opened, the AC voltage ($V_{AC}$) in the insulated wire 2106 may be expressed by the following equation:

$$V_{AC} = I_1(Z_S + Z_B + Z_{602}) \quad (16)$$

where $I_1$ is the series current, $Z_S$ is the unknown impedance of the sensor capacitor $C_S$, $Z_B$ is the unknown impedance of the body capacitance $C_B$ of the operator 2104 (FIGS. 16 and 17), and $Z_{602}$ is the impedance of the capacitor 2602.

When the switch $S_3$ is closed and the switches $S_2$ and $S_4$ are opened, the AC voltage in the insulated wire 2106 may be expressed by the following equation:

$$V_{AC} = I_2(Z_S + Z_B + Z_{604}) \quad (17)$$

where $I_2$ is the series current, $Z_S$ is the unknown impedance of the sensor capacitor $C_S$, $Z_B$ is the unknown impedance of the body capacitance $C_B$ of the operator 2104 (FIGS. 16 and 17), and $Z_{604}$ is the impedance of the capacitor 2604.

When the switch $S_4$ is closed and the switches $S_2$ and $S_3$ are opened, the AC voltage ($V_{AC}$) in the insulated wire 2106 may be expressed by the following equation:

$$V_{AC} = I_3(Z_S + Z_B + Z_{606}) \quad (18)$$

where $I_3$ is the series current, $Z_S$ is the unknown impedance of the sensor capacitor $C_S$, $Z_B$ is the unknown impedance of the body capacitance $C_B$ of the operator 2104 (FIGS. 16 and 17), and $Z_{606}$ is the impedance of the capacitor 2606.

Setting equations (16) and (17) equal to each other and solving for $Z_S + Z_B$ gives the following equation:

$$Z_S + Z_B = \frac{V_{M2} - V_{M1}}{I_1 - I_2} \quad (19)$$

Substituting equation (19) into equation (18) gives the following equation:

$$V_{AC} = I_3 \times \left(\frac{V_{M2} - V_{M1}}{I_1 - I_2} + Z_{606}\right) \quad (20)$$

Substituting $I_X = V_X/Z_X$ and $Z_X = 1/(2\pi\omega C_X)$ and simplifying the result, the AC voltage ($V_{AC}$) in the insulated wire 2106 may be expressed by the following equation:

$$V_{AC} = C_{606} V_{606} \left(\frac{V_{M2} - V_{M1}}{C_{602} V_{602} - C_{604} V_{604}}\right) + V_{M3} \quad (21)$$

The determined AC voltage of the insulated wire 2106 may then be presented to the operator or communicated to an external device via a suitable communications interface.

Figure 22:
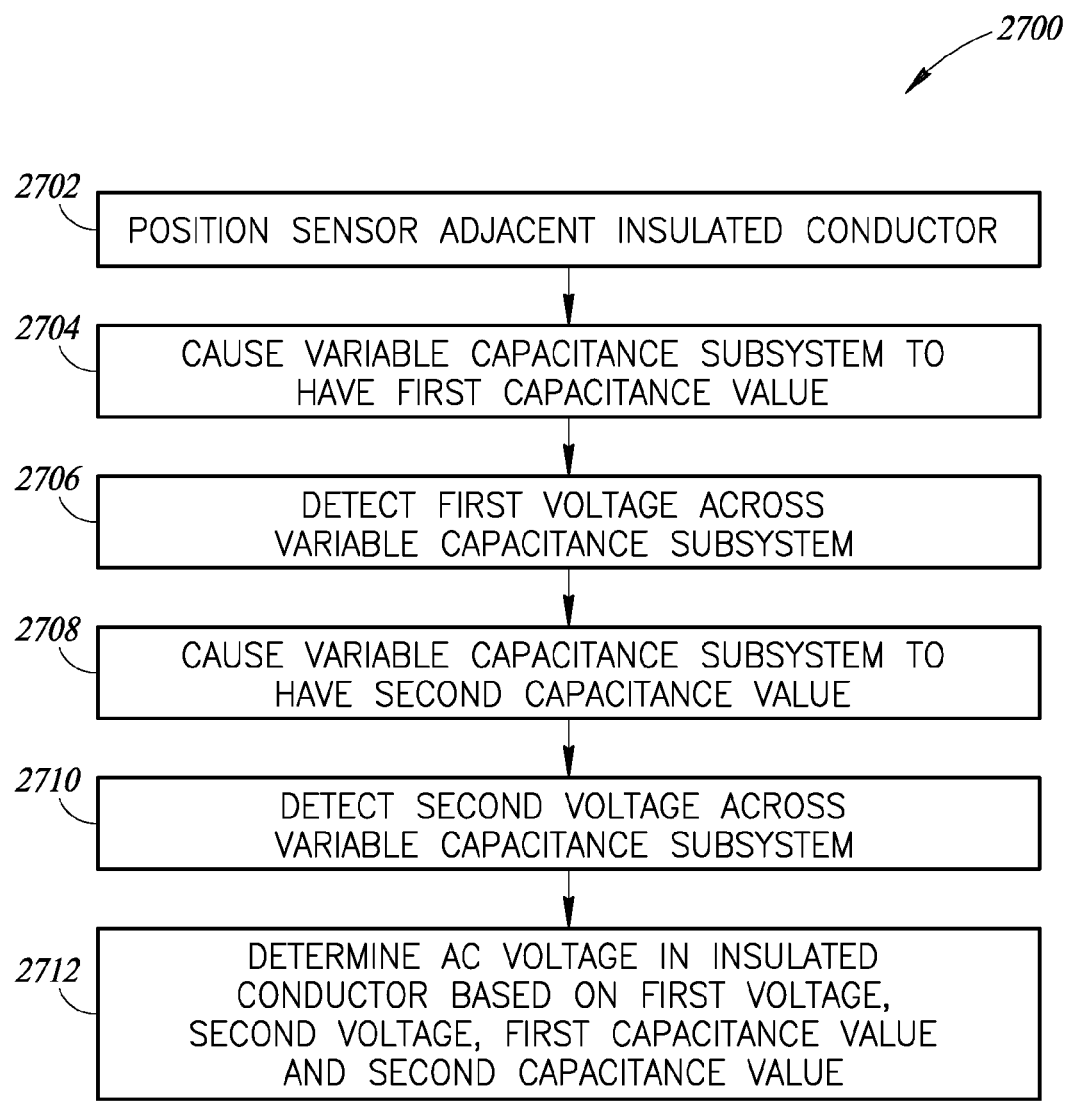
FIG. 22 is a flow diagram of a method of operating a non-contact voltage measurement system to measure AC voltage in an insulated wire without galvanic contact with the wire, according to one illustrated implementation.

FIG. 22 is a flow diagram of a method 2700 of operating a non-contact voltage measurement system to measure AC voltage in an insulated wire without galvanic contact. The non-contact voltage measurement system may be similar or identical to any of the implementations of non-contact voltage measurement systems discussed above, and/or may include various combinations of such non-contact voltage measurement systems.

The method 2700 may begin at 2702 when an operator positions a conductive sensor of the non-contact voltage measurement system adjacent the insulated wire to be measured. As discussed above, when the conductive sensor is positioned adjacent the insulated wire, the sensor and conductor in the insulated wire are capacitively coupled together to form a sensor capacitor $C_S$.

At 2704, at least one processor (controller) of the non-contact voltage measurement system may cause a variable capacitance subsystem electrically coupled to the sensor to have a first capacitance value. In at least some implementations, the variable capacitance subsystem includes at least a first capacitor, a second capacitor, and a processor-controlled switch, for example.

At 2706, the at least one processor may detect or measure a first voltage across the variable capacitance subsystem and store the first measured voltage in a nontransitory processor-readable storage medium. As discussed above, in at least some implementations, the at least one processor may detect or measure the voltage across the variable capacitance subsystem via an ADC which has a relatively high effective resolution (e.g., 20 bits, 22 bits).

At 2708, the at least one processor of the non-contact voltage measurement system may cause the variable capacitance subsystem to have a second capacitance value which is different from the first capacitance value. In at least some implementations, one of the first capacitance value and the second capacitance value may be at least twice the other of the first capacitance value and the second capacitance value. As a non-limiting example, each of the first and second capacitance values may be between 1000 pF and 5000 pF.

At 2710, the at least one processor may detect or measure a second voltage across the variable capacitance subsystem and store the second measured voltage in a nontransitory processor-readable storage medium.

At 2712, the at least one processor may determine the AC voltage in the insulated conductor based at least in part on the first and second measured voltages and the first and second capacitance values. For example, as discussed above, the at least one processor may determine the AC voltage ($V_{AC}$) in the insulated conductor according to the equation:

$$V_{AC} = V_{M1} \times [(C_1/C_2) - 1] / [(C_1 V_{M1}/C_2 V_{M2}) - 1] \quad (22)$$

where $C_1$ and $C_2$ are the first and second capacitance values, respectively, and $V_{M1}$ and $V_{M2}$ are the first and second measured voltages across the variable capacitance subsystem.

After determining the AC voltage in the insulated conductor, the at least one processor may present the result to the operator via a user interface communicatively coupled to the at least one processor. The user interface may include visual components (e.g., display, a light emitter (e.g., LED), a plurality of light emitters (e.g., LEDs)) and/or audio components (e.g., speaker, buzzer). Additionally or alternatively, the at least one processor may communicate the results to an external device via a suitable wired and/or wireless communications interface.

In at least some implementations, after obtaining the second measured voltage, the at least one processor may cause the variable capacitance subsystem to have the third capacitance value. In such instances, the at least one processor may then detect or measure a third measurement voltage across the variable capacitance subsystem.

Then, the at least one processor may determine the AC voltage ($V_{AC}$) in the insulated conductor based at least in part on the first measured voltage ($V_{M1}$), second measured voltage ($V_{M2}$), third measured voltage ($V_{M3}$), first capacitance value ($C_1$), second capacitance value ($C_2$) and third capacitance value ($C_3$). For example, the at least one processor may determine the AC voltage ($V_{AC}$) in the insulated conductor according to the equation:

$$V_{AC} = C_3 V_{M3} \times [(V_{M2} - V_{M1})/(C_1 V_{M1} - C_2 V_{M2})] + V_{M3} \quad (23)$$

The determined AC voltage ($V_{AC}$) may then be presented to the operator via a suitable interface and/or communicated to an external device via a wired and/or wireless communications interface.

Multi-Capacitor Type Non-Contact Voltage Measurement Systems

The following discussion is directed to systems and methods for measuring AC voltage of an insulated or blank uninsulated conductor (e.g., insulated wire) using a multi-capacitor type voltage measurement sensor or system without requiring a galvanic connection between the conductor and a test electrode or probe. The implementations disclosed in this section may be referred to herein as "multi-capacitor type voltage sensors" or systems. Generally, a non-galvanic contact (or "non-contact") voltage measurement system is provided which measures an AC voltage signal in an insulated conductor with respect to ground using a plurality of capacitive sensors ("multi-capacitor").

Figure 23A:
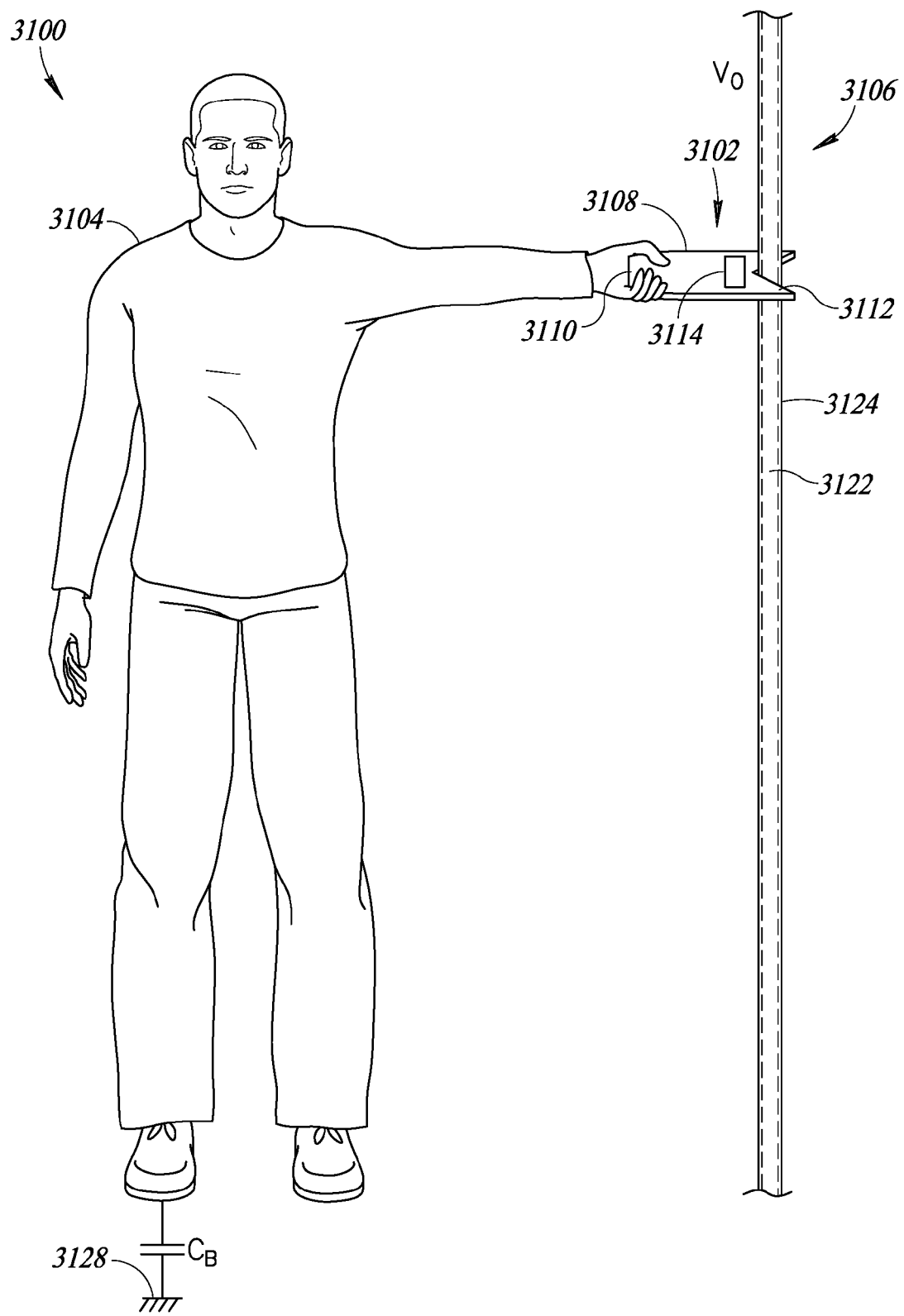
FIG. 23A is a pictorial diagram of an environment in which a non-contact voltage measurement system including a multi-capacitor type voltage sensor may be used by an operator to measure AC voltage present in an insulated wire without requiring galvanic contact with the wire, according to one illustrated implementation.
Figure 23B:
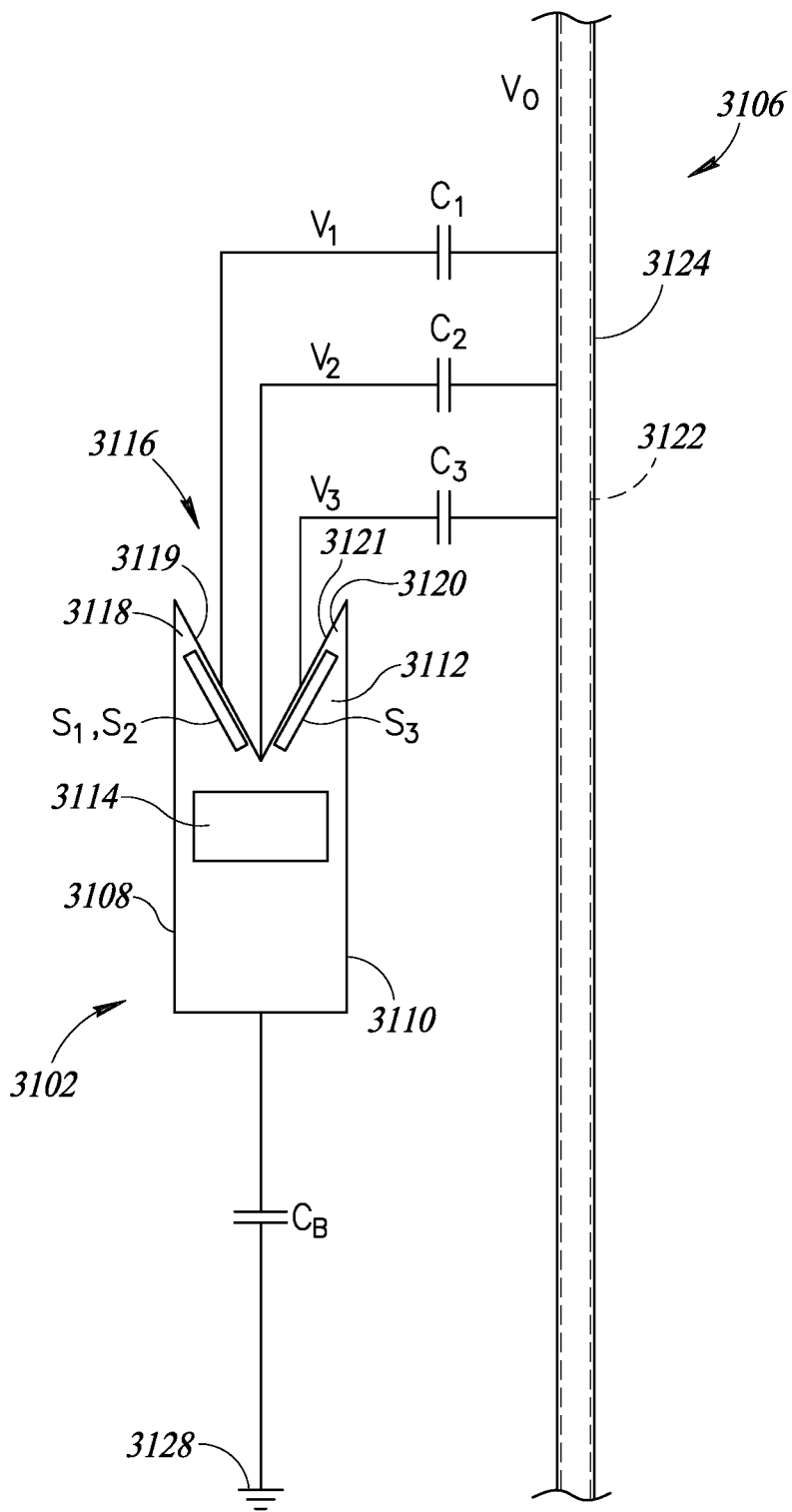
FIG. 23B is a top view of the non-contact voltage measurement system of FIG. 23A, showing coupling capacitances formed between the insulated wire and conductive sensors of the non-contact voltage measurement system, according to one illustrated implementation.

FIG. 23A is a pictorial diagram of an environment 3100 in which a non-contact voltage measurement system 3102 that includes a multi-capacitor voltage sensor or system may be used by an operator 3104 to measure AC voltage present in an insulated wire 3106 without requiring galvanic contact between the non-contact voltage measurement system and the wire 3106. FIG. 23B is a top plan view of the non-contact voltage measurement system 3102 of FIG. 23A, showing various electrical characteristics of the non-contact voltage measurement system during operation. The non-contact voltage measurement system 3102 includes a housing or body 3108 which includes a grip portion or end 3110 and a probe portion or end 3112, also referred to herein as a front end, opposite the grip portion. The housing 3108 may also include a user interface 3114 which facilitates user interaction with the non-contact voltage measurement system 3102. The user interface 3114 may include any number of inputs (e.g., buttons, dials, switches, touch sensor) and any number of outputs (e.g., display, LEDs, speakers, buzzers). The non-contact voltage measurement system 3102 may also include one or more wired and/or wireless communications interfaces (e.g., USB, Wi-Fi®, Bluetooth®) to facilitate communication with other local or remotely-located devices.

In at least some implementations, as shown best in FIG. 23B, the probe portion 3112 may include a recessed portion 3116 defined by first and second extended portions 3118 and 3120. The recessed portion 3116 receives the insulated wire 3106 (see FIG. 23A) when a measurement is performed. The insulated wire 3106 includes a conductor 3122 and an insulator 3124 surrounding the conductor 3122. The recessed portion 3116 may include sensors or electrodes $S_1$, $S_2$ and $S_3$ which are positioned proximate the insulator 3124 of the insulated wire 3106 when the insulated wire is positioned within the recessed portion 3116 of the non-contact voltage measurement system 3102. In the illustrated example, the sensors $S_1$ and $S_2$ are disposed inside the extended portion 3118 of the housing 3108, and the sensor $S_3$ is disposed inside the extended portion 3120. A surface 3119 of the extended portion 3119 may be provided to separate the sensors $S_1$ and $S_2$ from the recessed portion 3116 to prevent physical and electrical contact between the sensors and other objects (e.g., the insulated wire 3106, metal objects). Similarly, a surface 3121 of the extended portion 3120 may separate the sensor $S_3$ from the recessed portion 3116. As discussed further below with reference to FIG. 27, in at least some implementations the surface 3119 may separate the sensors $S_1$ and $S_2$ from the recessed portion 3116 by a distance (e.g., thickness $T_1$ of FIG. 27) which is different from a distance (e.g., thickness $T_2$ of FIG. 27) that the surface 3121 separates the sensor $S_3$ from the recessed portion.

As shown in FIG. 23A, in use the operator 3104 may grasp the grip portion 3110 of the housing 3108 and place the probe portion 3112 proximate the insulated wire 3106 so that the non-contact voltage measurement system 3102 may accurately measure the AC voltage present in the wire with respect to earth ground (or another reference node). Although the probe end 3112 is shown as having the recessed portion 3116, in other implementations the probe portion 3112 may be configured differently. For example, in at least some implementations the probe portion 3112 may include a selectively movable clamp, a hook, a flat or arcuate surface which includes the sensor, or other type of interface which allows a sensor assembly of the non-contact voltage measurement system 3102 to be positioned proximate the insulated wire 3106.

When the probe portion 3112 is positioned proximate the insulated wire 3106, the sensors $S_1$, $S_2$ and $S_3$ each capacitively couple with the conductor 3122 of the wire, generating capacitances $C_1$, $C_2$ and $C_3$, respectively. As discussed further below, each of the sensors $S_1$, $S_2$ and $S_3$ differs from each other with respect to at least one characteristic that affects capacitive coupling with the insulated wire 3106, such that the different voltages $V_1$, $V_2$ and $V_3$ at the sensors $S_1$, $S_2$ and $S_3$ may be detected and used to accurately determine the AC voltage ($V_O$) in the insulated wire 3106.

In at least some implementations, various ratios between the output voltages $V_1$, $V_2$ and $V_3$ are used to determine the insulated conductor's 3106 characteristics. Using the determined characteristics, the AC voltage in the insulated conductor 3106 may be determined via a calibrated lookup table and/or one or more determined equations.

The particular systems and methods used by the non-contact voltage measurement system 3102 to measure AC voltage are discussed below with reference to FIGS. 24-27.

Figure 24:
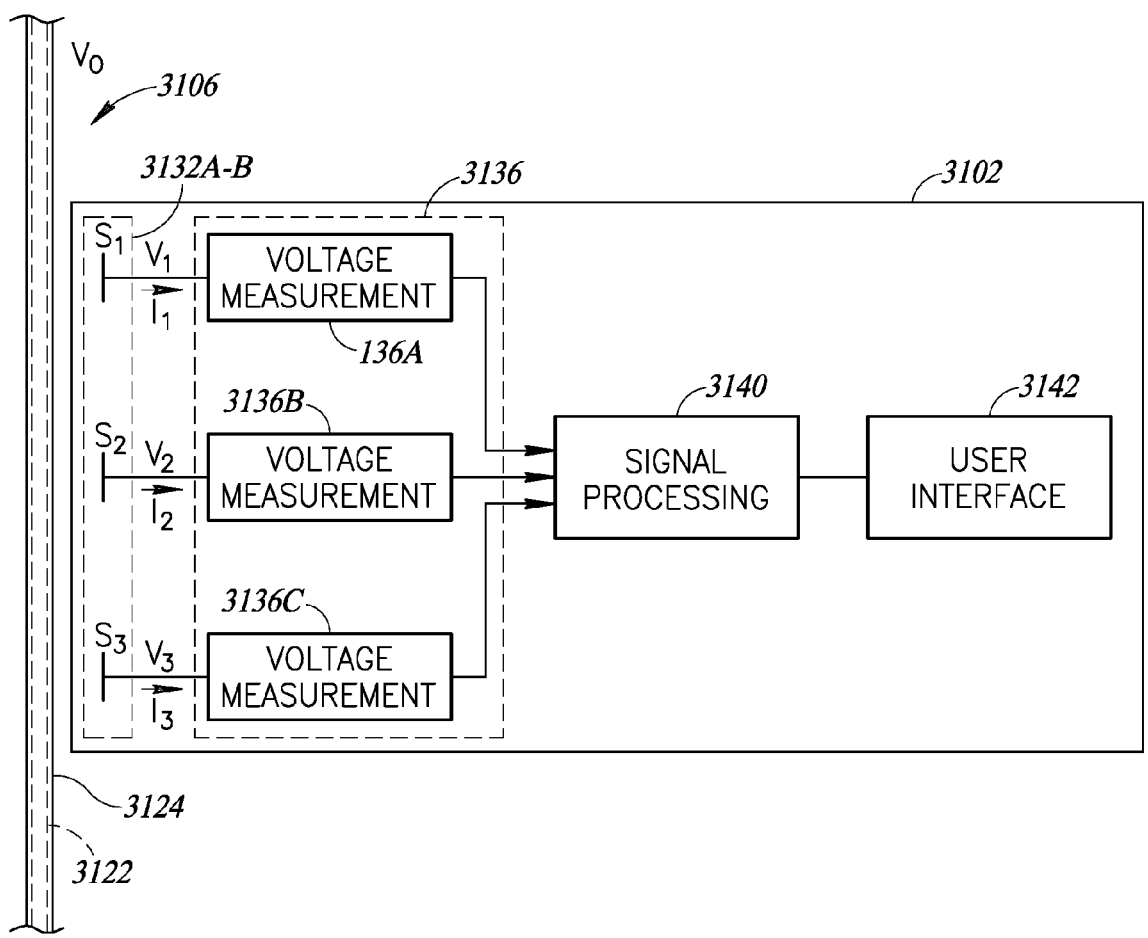
FIG. 24 is a schematic diagram of various internal components of the non-contact voltage measurement system, according to one illustrated implementation.

FIG. 24 shows a schematic diagram of various internal components of the non-contact voltage measurement system 3102 also shown in FIGS. 23A and 23B. In this example, the conductive sensors $S_1$, $S_2$ and $S_3$ of the non-contact voltage measurement system 3102 are positioned proximate the insulated wire 3106 under test. Each of the sensors $S_1$, $S_2$ and $S_3$ capacitively couples with the conductor 3122 of the insulated wire 3106, forming the sensor coupling capacitors $C_1$, $C_2$ and $C_3$ (FIG. 23B), respectively. The AC voltage signal ($V_O$) in the wire 3122 generates sensor voltage signals $V_1$, $V_2$ and $V_3$ at the sensors $S_1$, $S_2$ and $S_3$, respectively, which voltage signals are dependent on the coupling capacitances $C_1$, $C_2$ and $C_3$ for the respective sensors $S_1$, $S_2$ and $S_3$.

The AC voltage ($V_O$) in the wire 3122 to be measured has a connection to an external ground 3128 (e.g., neutral). The non-contact voltage measurement system 3102 itself also has a capacitance to ground 3128, which consists primarily of the body capacitance ($C_B$) when the operator 3104 (FIG. 23A) holds the non-contact voltage measurement system in his hand. Each of the capacitances $C_1$, $C_2$ and $C_3$ creates a conductive loop through $C_B$ and the voltage inside the loop generates respective signal currents ($I_1$, $I_2$ and $I_3$). The current signals ($I_1$, $I_2$ and $I_3$) are generated by the AC voltage signal ($V_O$) in the conductor 3122 of the insulated wire 3106 which is capacitively coupled to the conductive sensors $S_1$, $S_2$ and $S_3$, respectively, and loop back to the external ground 3128 through the housing 3108 of the non-contact voltage measurement system 3102 and the body capacitor ($C_B$) to ground 3128. The current signals ($I_1$, $I_2$ and $I_3$) are each dependent on the distance between the conductive sensor $S_1$, $S_2$ and $S_3$, respectively, and the insulated wire 3106 under test, the particular shapes and sizes of the conductive sensor $S_1$, $S_2$ and $S_3$, and the size, voltage level ($V_O$) and relative position of the conductor 3122. The voltages $V_1$, $V_2$ and $V_3$ are proportional to the current signals $I_1$, $I_2$ and $I_3$, respectively. Any other reference potential relative to Ground (the body capacitance $C_B$) can also be used if there is a connection from and internal ground guard 3154 (see FIGS. 25, 26A, 26B and 27) to the measured reference potential such as a test lead. This connection, if used, can also cancel the influence of low body capacitances $C_B$ if connected to ground/earth. An example would be phase-to-phase measurements in multiphase environment connecting the internal ground guard 3154 to one phase and using the non-contact sensor 3112 for another phase.

To reduce or avoid stray currents, at least a portion of the non-contact voltage measurement system 3102 (e.g., the sensors $S_1$, $S_2$ and $S_3$) may be at least partially surrounded by a conductive internal ground guard or screen 3132A-B (also shown in FIGS. 26A-B) which causes most of the current to run through the conductive sensor $S_1$, $S_2$ and $S_3$ which form the coupling capacitors $C_1$, $C_2$ and $C_3$, respectively, with the conductor 3122 of the insulated wire 3106. The internal ground guards 3132A-B may be formed from any suitable conductive material (e.g., copper) and may be solid (e.g., foil) or have one or more openings (e.g., mesh). The guards 3132A-B around the sensors $S_1$, $S_2$ and $S_3$ may also reduce stray influences of adjacent wires close to the sensors. The guards 3132A-B, also referred to by the reference numeral 3154 in FIGS. 25, 26A, 26B and 27, provide an internal ground connection for the non-contact voltage measurement system 3102.

As shown in FIG. 24, the non-contact voltage measurement system 3102 may include a voltage measurement subsystem 3136 which includes voltage measurement components 3136A, 3136B and 3136C which are operative to detect the voltage signals $V_1$, $V_2$ and $V_3$, respectively, and/or the respective current signals $I_1$, $I_2$ and $I_3$ which are proportional to the voltage signals. As a non-limiting example, each of the voltage measurement components 3136 may comprise an analog-to-digital converter (ADC) and associated circuitry to detect the voltage signals $V_1$, $V_2$ and $V_3$. As another non-limiting example, each of the voltage measurement components 3136A, 3136B and 3136C may include an input amplifier and feedback circuitry which operates as an inverting current-to-voltage converter to convert the input currents $I_1$, $I_2$ and $I_3$, which are proportional to the voltage signals $V_1$, $V_2$ and $V_3$, into voltage levels.

The voltage signals $V_1$, $V_2$ and $V_3$ (or signals representative thereof) may be fed to a signal processing module 3140 which, as discussed further below, processes the voltage signals $V_1$, $V_2$ and $V_3$ to determine the AC voltage ($V_O$) in the conductor 3122 of the insulated wire 3106. The signal processing module 3140 may include any combination of digital and/or analog circuitry.

The non-contact voltage measurement system 3102 may also include a user interface 3142 (e.g., display) communicatively coupled to the signal processing module 3140 to present the determined AC voltage ($V_O$) or to communicate by an interface to the operator 3104 of the non-contact voltage measurement system.

Figure 25:
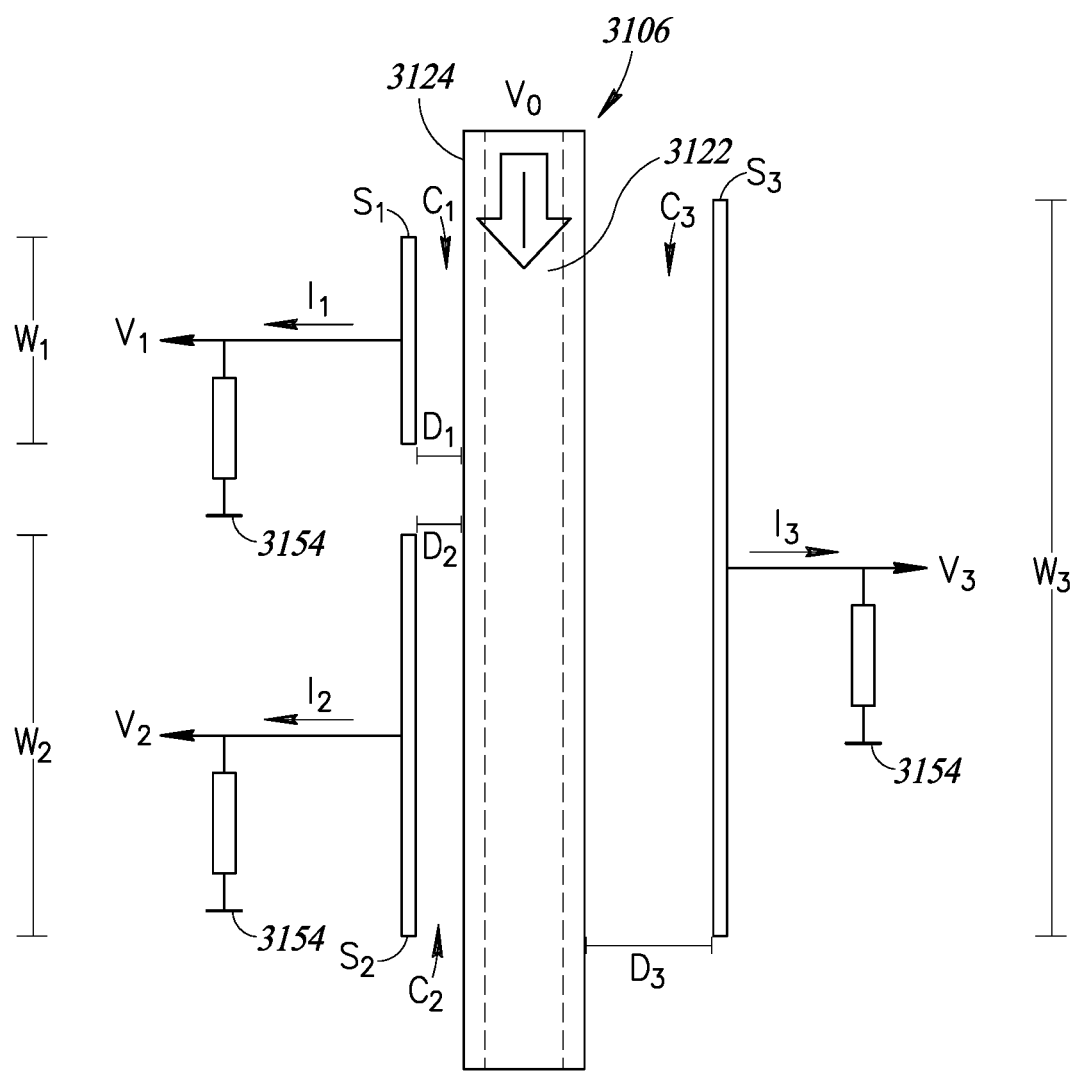
FIG. 25 is a schematic diagram which shows conductive sensors of the non-contact voltage measurement system positioned proximate an insulated wire under test, according to one illustrated implementation.
Figure 27:
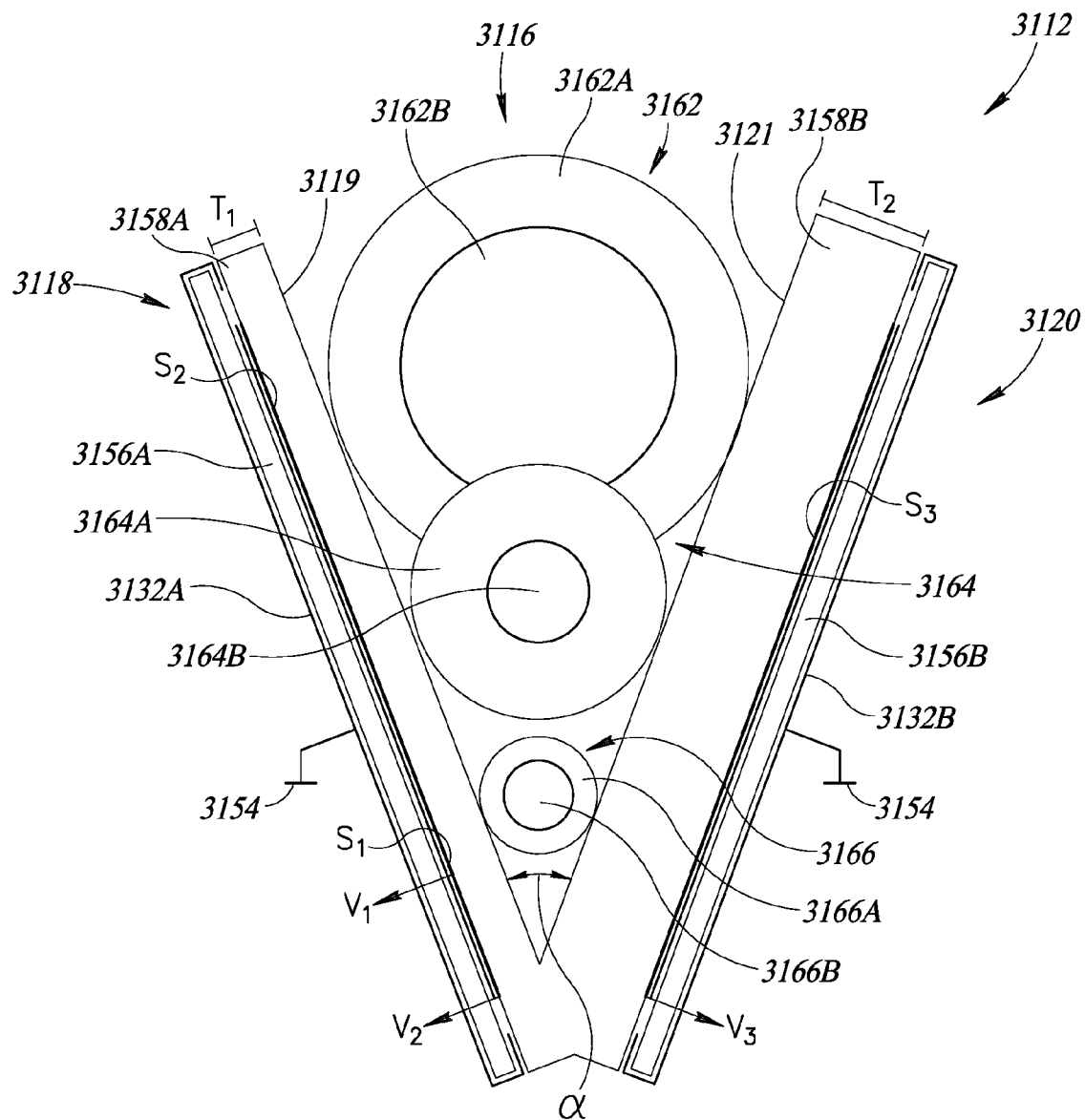
FIG. 27 is a sectional view of a frond end or probe end of the non-contact voltage measurement system, according to one illustrated implementation.

FIG. 25 is a schematic diagram which shows the conductive sensors $S_1$, $S_2$ and $S_3$ of the non-contact voltage measurement system 3102 positioned proximate the insulated wire 3106 during measurement of the insulated wire, according to one illustrated implementation. In this example, the conductive sensor $S_1$ is separated from the insulated wire 3106 by a first distance $D_1$, the conductive sensor $S_2$ is separated from the insulated wire 3106 by a second distance $D_2$, and the conductive sensor $S_3$ is separated from the insulated wire 3106 by a third distance $D_3$. In at least some implementations, at least one of the distances $D_1$, $D_2$ and $D_3$ may be different from at least one other of the distances $D_1$, $D_2$ and $D_3$. For example, in at least some implementations the distances $D_1$ and $D_2$ may be equal to each other, and the distance $D_3$ may be different from the distances $D_1$ and $D_2$. As shown in FIG. 27, the distances $D_1$, $D_2$ and $D_3$ may be controlled at least in part by physical properties (e.g., thickness) of one or more insulation layers.

As also illustrated FIG. 25, the conductive sensors $S_1$, $S_2$ and $S_3$ may have different physical dimensions (e.g., height, width, shape, area). In the illustrated example, the conductive sensor $S_1$ has a width ($W_1$) that is less than a width ($W_2$) of the conductive sensor $S_2$, and the conductive sensor $S_2$ has a width ($W_2$) that is less than a width ($W_3$) of the conductive sensor $S_3$. Such differences between the sensors $S_1$, $S_2$ and $S_3$ allow for measurements of the voltages $V_1$, $V_2$ and $V_3$ to uniquely determine the AC voltage in the insulated wire.

Figures 26A, 26B:
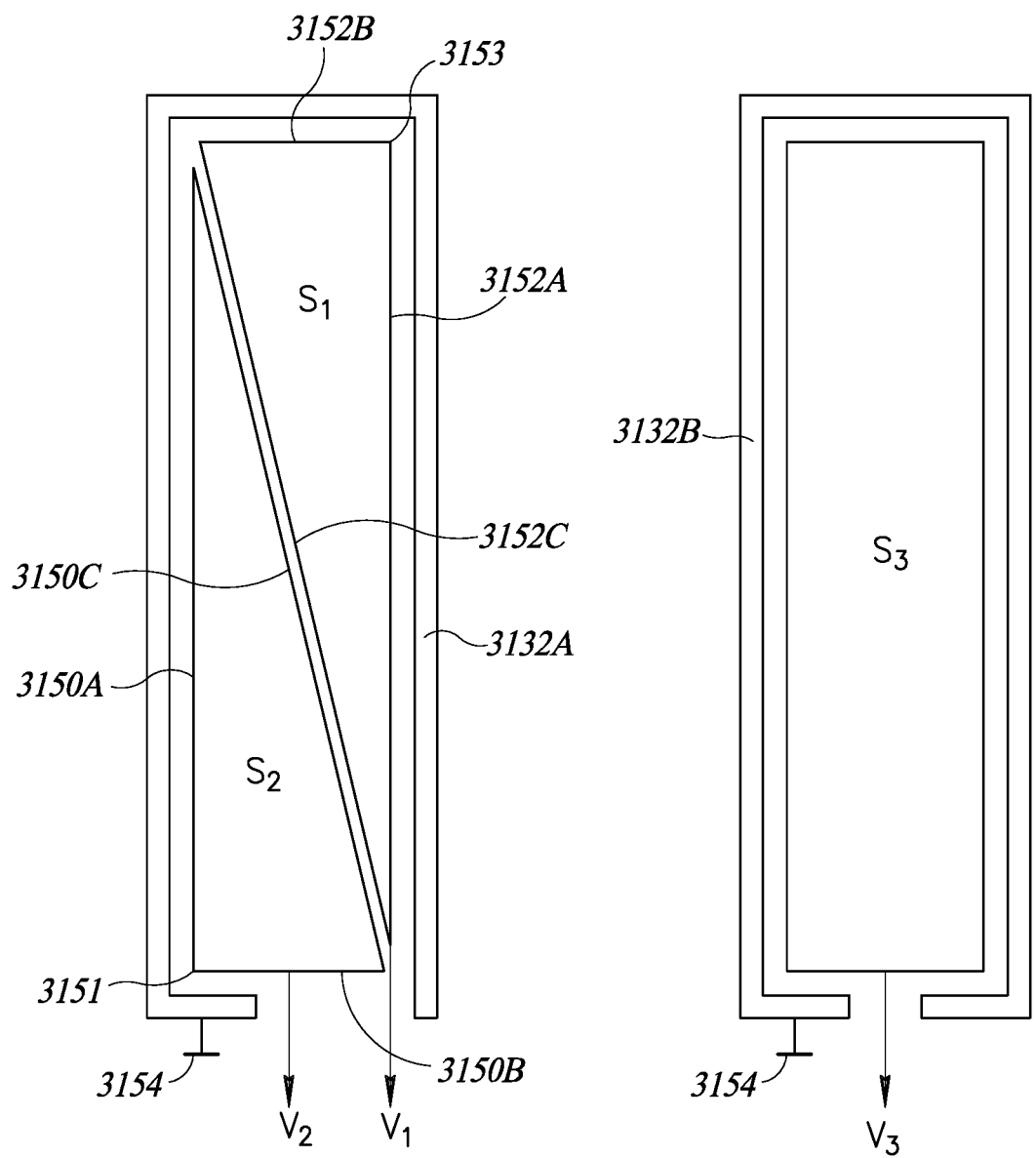
FIG. 26A is a plan view of first and second conductive sensors and an internal ground guard for the non-contact voltage measurement system which shows examples shapes for the first and second conductive sensors, according to one illustrated implementation.
FIG. 26B is a plan view of a third conductive sensor and an internal ground guard for the non-contact voltage measurement system which shows an example shape for the third conductive sensor, according to one illustrated implementation.

FIG. 26A is a plan view of the first and second conductive sensors $S_1$ and $S_2$ at least partially surrounded by the internal ground guard 3132A. In this example, the sensor $S_1$ has a planar right triangular shape which defines a first edge 3150A and a second edge 3150B that form a right angle at a corner 3151, and a hypotenuse edge 3150C opposite the right angle. Similarly, the sensor $S_2$ has a planar right triangular shape which defines a first edge 3152A and a second edge 3152B that form a right angle at a corner 3153, and a hypotenuse edge 3152C opposite the right angle. In this example, the sensors $S_1$ and $S_2$ are inverted with respect to one another such that the hypotenuse edges 3150C and 3152C of the first and second conductive sensors $S_1$ and $S_2$, respectively, are positioned next to (e.g., substantially adjacent) each other with a small gap therebetween.

FIG. 26B is a plan view of the third conductive sensor $S_3$ at least partially surrounded by the internal ground guard 3132B. In this example, the third conductive sensor $S_3$ is rectangular in shape. In at least some implementations, the area of the third sensor $S_3$ is the same (or substantially the same) as the combined area of the first and second conductive sensors $S_1$ and $S_2$, although such feature is not required. In instances where the third sensor $S_3$ is the same as the combined area of the first and second conductive sensors $S_1$ and $S_2$ and the sensors $S_1$ and $S_2$ are spaced apart from the insulated wire by a distance that is different from the distance which the sensor $S_3$ is spaced apart from the insulated wire, the combined sensors $S_1$ and $S_2$ may be considered as a single capacitance ($C_1+C_2$) which may be compared with the capacitance $C_3$ to account for the differences in the distances using similarly shaped capacitors.

It should be appreciated that the particular shapes, sizes, relative positions and orientations of the sensors $S_1$, $S_2$ and $S_3$ are illustrative and are not limiting. Indeed, the shapes, sizes, relative positions and orientations of each of the sensors $S_1$, $S_2$ and $S_3$ may be varied in numerous combinations.

FIG. 27 is a sectional view of the front end 3112 of the non-contact voltage measurement system 3102 which includes the sensors $S_1$, $S_2$ and $S_3$. The sensors $S_1$ and $S_2$ may be supported by a circuit board 3156A, which is at least partially surrounded by the internal ground guard 3132A. Similarly, the sensor $S_3$ may be supported by a circuit board 3156B, which is at least partially surrounded by the internal ground guard 3132B.

A first insulation layer 3158A separates the sensors $S_1$ and $S_2$ from the recessed portion 3118 of the front end 3112. A second insulation layer 3158B separates the sensor $S_3$ from the recessed portion 3118 of the front end. The first and second insulation layers 3158A and 3158B may have planar surfaces 3119 and 3121, respectively, that are disposed at an acute angle ($\alpha$) with respect to each other to define the "V" shaped recessed portion 3116 which receives insulated conductors therein. As a non-limiting example, the angle ($\alpha$) may be between 20 degrees and 50 degrees (e.g., 39 degrees, 42 degrees) in at least some implementations. Example insulated conductors 3162, 3164 and 3166 are shown disposed within the recessed portion 3116 adjacent the planar surfaces 3119 and 3121. The insulated conductor 3162 includes a conductive wire 3162B surrounded by insulation 3162A, the insulated conductor 3164 includes a conductive wire 3164B surrounded by insulation 3164A, and the insulated conductor 3166 includes a conductive wire 3166B surrounded by insulation 3166A.

In the example shown in FIG. 27, the front end or probe end 3112 is shaped to accommodate insulated wires of various diameters, such as the insulated wire 3162 with a relatively large diameter or the insulated wire 3166 with a relatively small diameter. The insulated wires 3162, 3164 and 3166 may also have conductors 3162A, 3164A and 3166A, respectively, with differing diameters, and/or respective insulation layers 3162B, 3164B and 3166B with differing thicknesses.

The first insulation layer 3158A may have a first thickness $T_1$, and the second insulation layer 3158B may have a second thickness $T_2$. In at least some implementations, the first thickness $T_1$ may be different than the second thickness $T_2$. For example, in at least some implementations the first thickness may be approximately 0.5 millimeters (mm) and the second thickness $T_2$ may be approximately 2.5 mm.

Providing the three sensors $S_1$, $S_2$ and $S_3$ which differ from each other with respect to at least one characteristic (e.g., size, shape, distance from insulated conductor 3106) which affects capacitive coupling with the insulated wire under test allows the non-contact voltage measurement system 3102 to compensate for different variables which affect the capacitive coupling between the sensors and the insulated conductor 3106. Such variables may include the diameter of the insulated conductor 3106, the thickness of the insulation of the insulated conductor 3106, the position of the insulated conductor 3106 within the recessed portion 3116 of the front end 3112, etc.

Advantageously, by obtaining the voltage measurements for the voltages $V_1$, $V_2$ and $V_3$ at the sensors $S_1$, $S_2$ and $S_3$, respectively, at least one processor of the non-contact voltage measurement system 3102 may accurately determine the AC voltage on the insulated conductor 3106. To make such a determination, the non-contact voltage measurement system 3102 may be calibrated (e.g., during manufacturing or design) using known insulated conductors 3106 with known AC voltages. Additionally or alternatively, the at least one processor of the non-contact voltage measurement system 3102 may utilize one or more determined equations with utilize the voltages $V_1$, $V_2$ and $V_3$ as inputs and provide the AC voltage of the insulated conductor 3106 as an output. During operation, the at least one processor of the non-contact voltage measurement system 3102 may obtain the voltages $V_1$, $V_2$ and $V_3$, and then determine the AC voltage in the insulated wire using a lookup table or one or more equations which receive the voltages as inputs and output the AC voltage in the insulated wire.

For the example sensor configuration shown in FIGS. 26A, 26B and 27, various relationships between the measured voltages $V_1$, $V_2$ and $V_3$ at the sensors $S_1$, $S_2$ and $S_3$, respectively may be used to determine the AC voltage of an insulated conductor under test. In at least some implementations, the non-contact voltage measurement system 3102 may utilize one or more of the following relationships:

$$\frac{V_1}{V_2} \tag{24}$$

$$V_1 + V_2 \tag{25}$$

$$V_1 + V_2 + V_3 \tag{26}$$

$$\frac{V_1 + V_2}{V_3} \tag{27}$$

The relationships (24)-(27) above may be used to provide a function for the unknown AC voltage in an insulated conductor (e.g., insulated conductor 3106) that is independent of the distance between the insulated conductor and the sensors $S_1$, $S_2$ and $S_3$, such that the AC voltage in insulated conductors of various sizes may be measured.

For the sensors $S_1$ and $S_2$, the following equation may be used:

$$V_O = k \times (V_1 + V_2) \tag{28}$$

where $V_O$ is the AC voltage in the insulated conductor and k is a function of relationship (24) above (i.e., $k=f(V_1/V_2)$).

The measured voltages $V_1$, $V_2$ and $V_3$ are dependent on the capacitances $C_1$, $C_2$ and $C_3$ between the sensors $S_1$, $S_2$ and $S_3$, respectively, and the insulated conductor. Thus, the capacitances $C_1$, $C_2$ and $C_3$ may be calculated according to the known equation for the capacitance between a wire (e.g., an insulated conductor) that is parallel to a plane or wall (e.g., each of sensors $S_1$, $S_2$ and $S_3$). The equation for the capacitance C for each of the sensors is as follows:

$$C = \frac{2\pi\varepsilon l}{\cosh^{-1}\frac{d}{a}} = \frac{2\pi\varepsilon l}{\ln\left(\frac{d}{a} + \sqrt{\frac{d^2}{a^2} - 1}\right)} \tag{29}$$

where 'a' is the radius of the conductive wire, 'd' is the distance between the wire and the sensor (where 'd'>'a'), and 'l' is the length of the wire which is proximate the sensor or, equivalently, the width of the sensor.

As discussed above, the voltages $V_1$, $V_2$ and $V_3$ may be measured with suitable voltage measurement components 3136A, 3136B and 3136C, respectively, such as one or more ADCs or one or more inverting operational amplifiers which convert the currents through each of the sensors $S_1$, $S_2$ and $S_3$ to respective voltages.

The above-listed relationships (24), (25) and (26) identify three equations which provide unique values for a given measurement of voltages $V_1$, $V_2$ and $V_3$ which identifies the diameter of the conductive wire under test as well as the insulation thickness of the conductive wire and can be used to calculate the capacitances $C_1$, $C_2$ and $C_3$ using equation (29) above. Then, the AC voltage in the insulated wire may be calculated according to the following equation:

$$I_x \sim V_x = \frac{V_O}{\frac{1}{j\omega C_x}} = V_O \times j\omega C_x \qquad (30)$$

where 'x' is equal to 1, 2 and 3 for the sensors $S_1$, $S_2$ and $S_3$, respectively.

The three output voltages $V_1$, $V_2$ and $V_3$ of the three sensors $S_1$, $S_2$ and $S_3$ allow a characterization of the insulated wire under test by the diameter of the conductor and the thickness of the insulation. Relationship (24) above primarily defines the outer diameter of the insulated wire, and relationship (27) primarily defines the diameter of the conductor of the insulated wire. As discussed above, the voltages $V_1$, $V_2$ and $V_3$ are used as inputs to obtain a calibration factor from a lookup table or for calculating such utilizing one or more equations.

As an example, for a given measurement of voltages $V_1$, $V_2$ and $V_3$, using equation (29) above, relationship (24) limits the possible combinations of wire diameter and insulation thickness for the insulated wire under test. Similarly, relationship (25) limits the possible combinations of wire diameter and insulation thickness for the insulated wire under test. Thus, using relationships (24) and (25) a virtual wire having a specified wire diameter and specified insulation thickness may be determined. The physical properties of the determined virtual wire may be used to identify a factor 'k' which is dependent on both of the relationships (24) and (25) above. Using the determined virtual wire and the measured voltages $V_1$ and $V_2$, a calibration table that is generated by different positions of the insulated wire under test provides the final voltage result independent of position.

Using only the voltages $V_1$ and $V_2$, the result may provide inaccurate values. Thus, the voltage $V_3$ from the sensor $S_3$ may be used in a similar manner to that described above to provide better position definition. Notably, relationship (27) utilizes the sum of the voltages $V_1$ and $V_2$. Since the shape of the sensors $S_1$ and $S_2$ when combined together are similar to the shape of the sensor $S_3$, relationship (27) provides a ratio for similar capacitors (i.e., $C_1+C_2$ and $C_3$) at two different distances (i.e., $T_1$ and $T_2$).

The actual sizes and shapes of the sensors $S_1$, $S_2$ and $S_3$ may be selected to achieve reasonable capacitances (e.g., a few picofarads) between the sensors and the insulated conductor under test, and also to be much less than the body capacitance (CB) (e.g., 30 to 200 picofarads), which may be used as a possible reference to earth ground for handheld applications.

Non-Contact AC Electrical Parameter Measurement Systems

The following discussion provides various example implementations of non-contact measurement systems which may include some or all of the functionality discussed herein.

Figure 28:
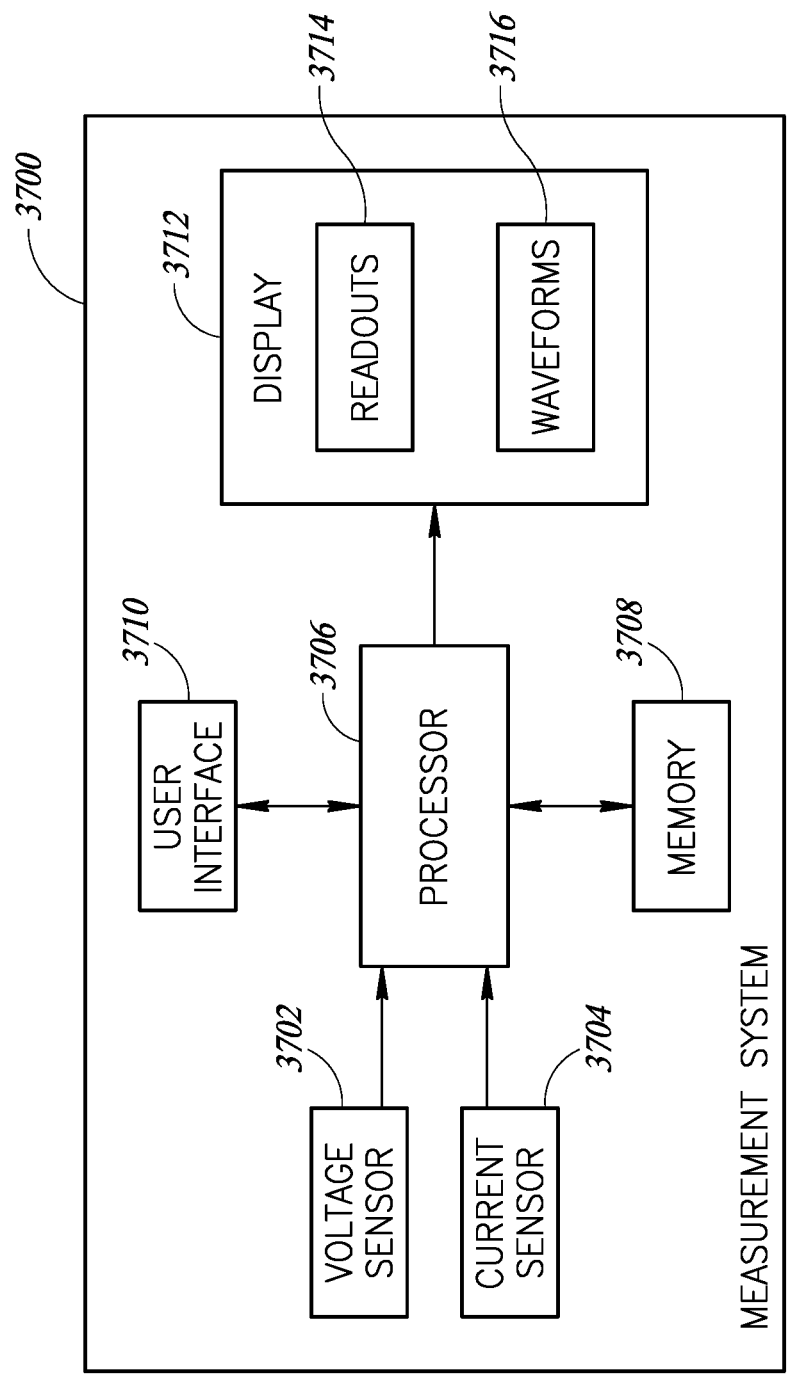
FIG. 28 is a schematic block diagram of a measurement system, according to one illustrated implementation.

FIG. 28 is a schematic block diagram of a non-contact measurement system or instrument 3700 which provides non-contact voltage measurement functionality and non-contact current measurement functionality. The measurement system 3700 may also determine one or more AC electrical parameters (e.g., power, energy, frequency, harmonics) derived from voltage and/or current measurements. The measurement system 3700 includes a voltage sensor 3702 and a current sensor 3704 that are each communicatively coupled to a processor 3706.

The voltage sensor 3702 and/or processor 3706 may be similar or identical to any of the non-contact sensing systems discussed herein. The processor 3706 may include one or more logic processing units, such as one or more central processing units (CPUs), microprocessors, digital signal processors (DSPs), application-specific integrated circuits (ASICs), field programmable gate arrays (FPGAs), etc. The measurement system 3700 may also include memory 3708 communicatively coupled to the processor 3706 which stores at least one of instructions or data thereon. The memory 3708 may include one or more solid state memories, for instance flash memory or solid state drive (SSD), which provide nonvolatile storage of computer-readable instructions, data structures, program modules and other data for the measurement system 3700. Although not depicted, the measurement system 3700 can employ other nontransitory computer- or processor-readable media, for example a hard disk drive, an optical disk drive, or memory card media drive.

The measurement system 3700 may include a user interface 3710 which may include any number of inputs (e.g., buttons, dials, switches, touch sensor, touchscreen) and any number of outputs (e.g., display, LEDs, speakers, buzzers). The measurement system 3700 may also include one or more displays 3712 which presents readouts 3714 and/or waveforms 3716.

In operation, the processor 3706 receives signals from the voltage sensor 3702 and the current sensor 3704 to obtain voltage and current measurements, respectively. The processor 3706 may utilize such voltage and current measurements to derive additional AC electrical parameters based on the combination of the measurements. Such parameters may include, for example, power (true power, apparent power, etc.), phase (e.g., three-phase), frequency, harmonics, energy, etc.

The voltage and current sensor signals may be obtained by the respective voltage and current sensors 3702 and 3704 during a common measurement time interval, which may be relatively short in duration (e.g., 10 milliseconds (ms), 100 ms, 1 second, 10 seconds). For example, the voltage sensor 3702 and the current sensor 3704 may obtain measurements at least partially concurrent with each other. As another example, one of the voltage sensor 3702 and the current sensor 3704 may obtain a measurement substantially immediately after the other of the voltage sensor and the current sensor obtains a measurement, such that the measurements are obtained at nearly the same time. In some implementations, the voltage sensor 3702 and the current sensor 3704 may be operative to repeatedly obtain measurements, concurrently or in succession, at specified intervals (e.g., every 10 ms, every 100 ms, every 1 second, every 10 seconds).

Generally, the voltage sensor 3702 and the current sensor 3704 both obtain their respective measurements within a measurement time interval that is sufficiently short such that pairs of the voltage and current measurements correspond to each other, which allows for accurate derivation or determination of one or more AC electrical parameters (e.g., power, phase) using the obtained current and voltage measurements.

The processor 3706 may provide readouts 3714 of one or more of the measured or derived parameters, and may provide graphical representations of one or more characteristics. Such graphical representations may include waveforms, harmonic bar graphs, etc. Example signal characteristics which may be presented via the display 3712 include voltage, current, frequency, power parameters (e.g., watts, KVA), phase, energy, harmonics, phase sequence detection, etc.

Figure 29:
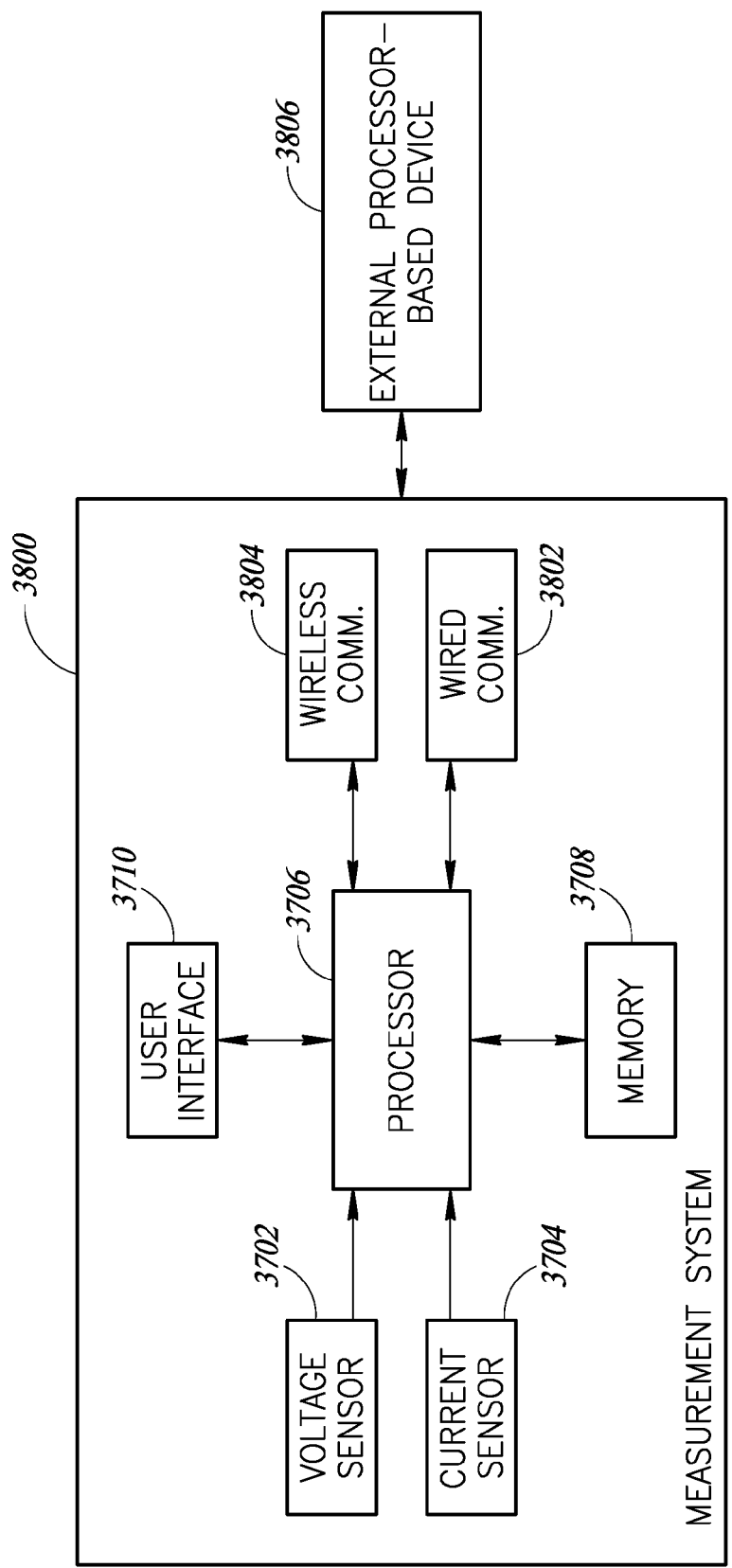
FIG. 29 is a schematic block diagram of a measurement system which operates as a remote sensor, according to one illustrated implementation.

FIG. 29 is a schematic block diagram of a measurement system or instrument 3800 which provides non-contact voltage measurement functionality and/or non-contact current measurement functionality. The measurement system 3800 is similar or identical to the measurement system 3700 of FIG. 28 in many respects, so only relevant differences are discussed herein for the sake of brevity.

In this implementation, the measurement system 3800 may not include a display and instead may be used as a "leave behind" sensor to monitor electrical equipment remotely via an external processor-based device 3806. Such processor-based device 3806 may include various types of devices, such as smartphones, tablet computers, laptop computers, wearable computers, servers, cloud computers, etc. The external processor-based device 3806 may include a display to present data gathered by the measurement 3800 over a period of time (e.g., minutes, hours, days, weeks, years).

To communicate with one or more external processor-based devices, the measurement system may include one or more wired communications interfaces 3802 and/or one or more wireless communications interfaces 3804.

Non-limiting examples of wireless communications interfaces 3804 include Wi-Fi®, Bluetooth®, Bluetooth® Low Energy, Zigbee®, 6LoWPAN®, Optical IR, wireless HART, etc. Non-limiting examples of wired communications interfaces 3802 include USB®, Ethernet, PLC, HART, MODBUS, FireWire®, Thunderbolt®, etc.

In addition to sending data to the external device 3806, in at least some implementations the measurement system 3800 may receive at least one of data or instructions (e.g., control instructions) from the external device 3806 via the wired communications interface 3802 and/or the wireless communications interface 3802.

Figure 30:
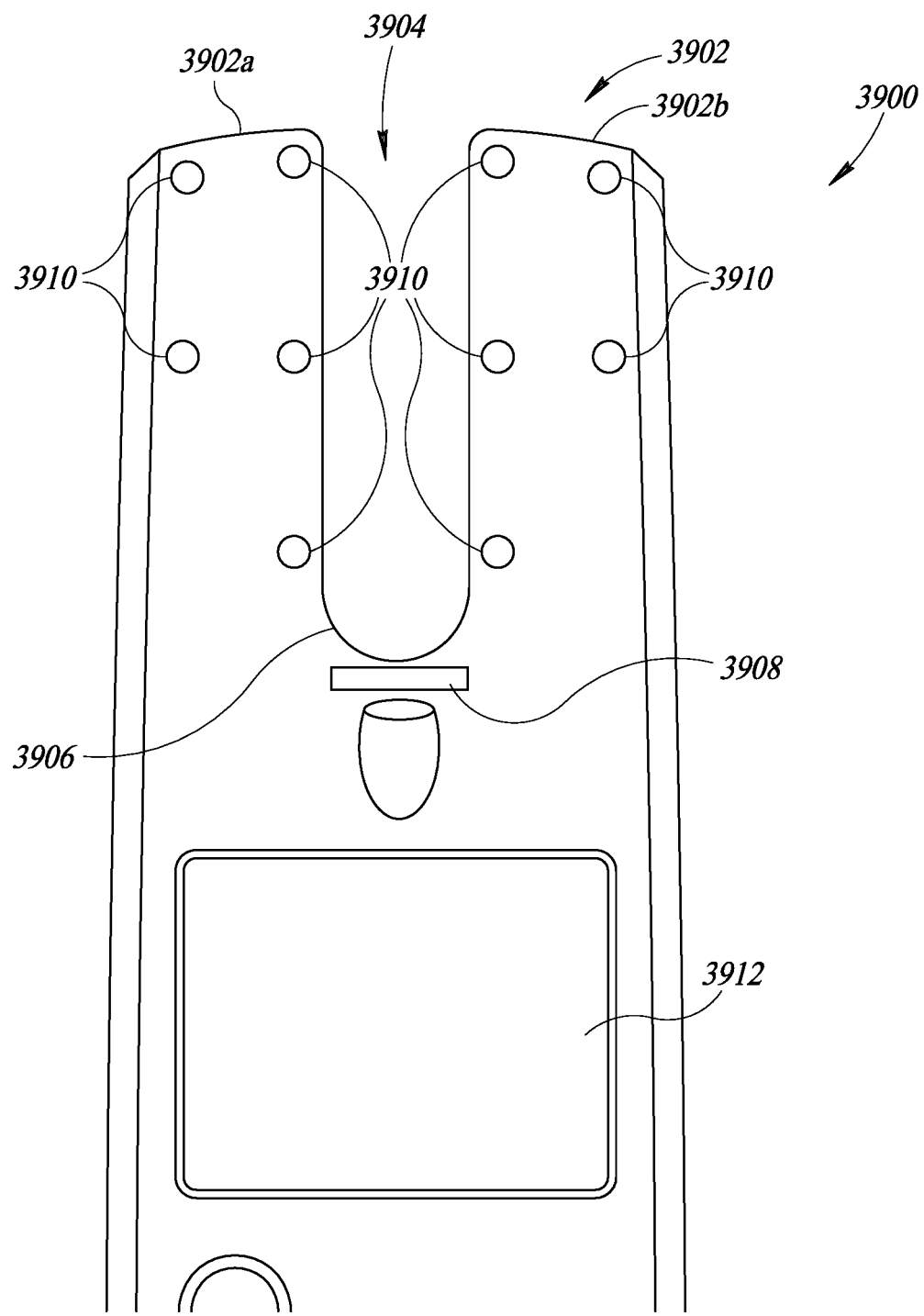
FIG. 30 is a diagram of a front end of a measurement system which provides alignment feedback.

FIG. 30 shows a portion of a front end or probe end 3900 of a measurement system, such as measurement system 3800. The measurement system may be similar or identical to one or more of the measurement systems discussed herein. In this implementation, the front end 3900 of the measurement system includes a fixed claw 3902 which has first and second spaced apart prongs 3902a and 3902b which define a recessed portion 3904 that receives an insulated conductor (not shown for clarity) under test. Proximate an innermost portion 3906 of the recess 3904 there is a sensor 3908 which operates to measure at least one of the voltage and the current in the insulated conductor under test.

The front end 3900 of the measurement system also includes one or more alignment feedback sensors 3910 disposed about the prongs 3902a and 3902b which may be used to provide various information to the user during a measurement operation. For example, in at least some implementations the one or more alignment feedback sensors may 3910 be used to provide feedback to the user regarding the alignment of the insulated conductor relative to the front end 3900. Such may be achieved by utilizing the one or more alignment feedback sensors 3910 to determine the location of the insulated conductor, and providing an indication of such location to the user.

For example, a display 3912 of the measurement system may provide alignment feedback information to the user. As another example, colored lights (e.g., LEDs) may be used to provide alignment feedback to the user. As an example, a red light may be illuminated to indicate that the insulated conductor is not aligned, a yellow light may be illuminated to indicate that the insulated conductor is nearly aligned, and a green light may be illuminated to indicate that the insulated conductor is properly aligned. As another example, the position of the insulated conductor relative to the front end 3900 may be displayed graphically on the display. As another example, sound may be used to provide alignment feedback. For example, the measurement system may generate "beeps" or other sounds at intervals, intensity (volume), or frequency that vary based on the alignment of the insulated conductor (e.g., slow beeps for unaligned, faster beeps for nearly aligned, and fastest beeps or steady beep for aligned).

In at least some implementations, the one or more alignment feedback sensors 3910 may alternatively or additionally be used to detect live voltage nearby (e.g., an energized circuit adjacent the conductor under test). Upon detection of such live voltage, an indication (e.g., sound, light, warning message) may be presented to notify the user that a live voltage is nearby.

In at least some implementations, the one or more alignment feedback sensors 3910 may be used to provide an indication of the accuracy of the measurements obtained by the user. For example, when the user obtains a measurement, a color-coded signal (e.g., red, yellow, green) may be provided to notify the user that the measurement accuracy is good (green), marginal (yellow) or poor (red) based on the alignment determination. Besides color or graphical alignment feedback, other types of feedback may be provided. For example, the determined alignment information may be presented as a numerical value, as a bar graph, as a "hot/cold" indicator, or as any other suitable indicator.

Figure 31:
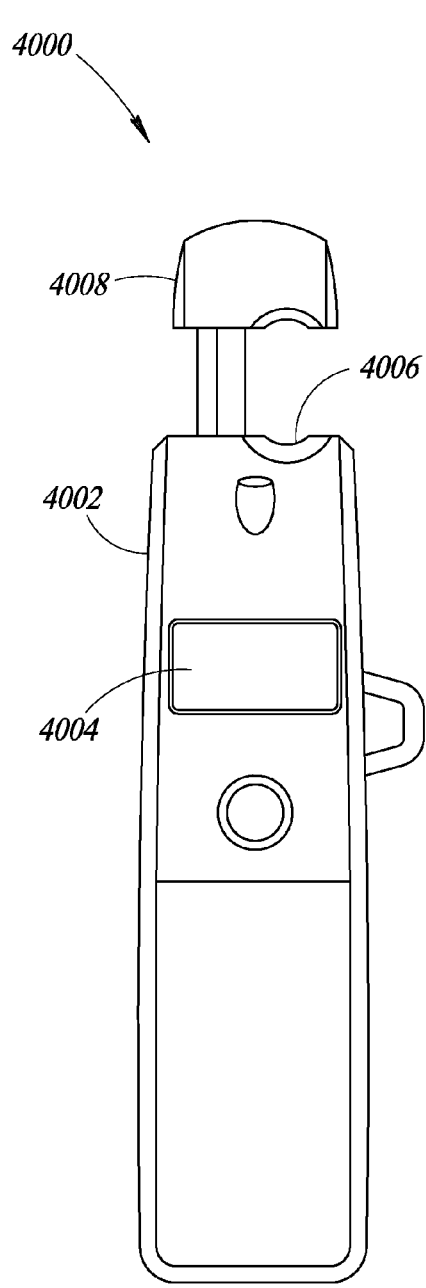
FIG. 31 is a front elevational view of an example measurement system which may incorporate at least some of the functionality of the present disclosure.
Figure 32:
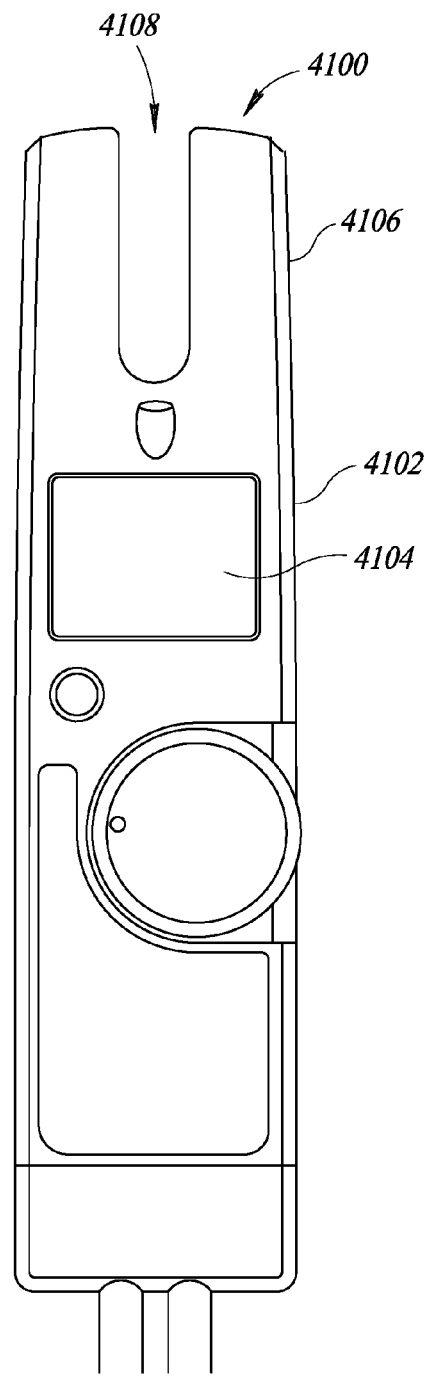
FIG. 32 is a front elevational view of an example measurement system which may incorporate at least some of the functionality of the present disclosure.
Figure 33:
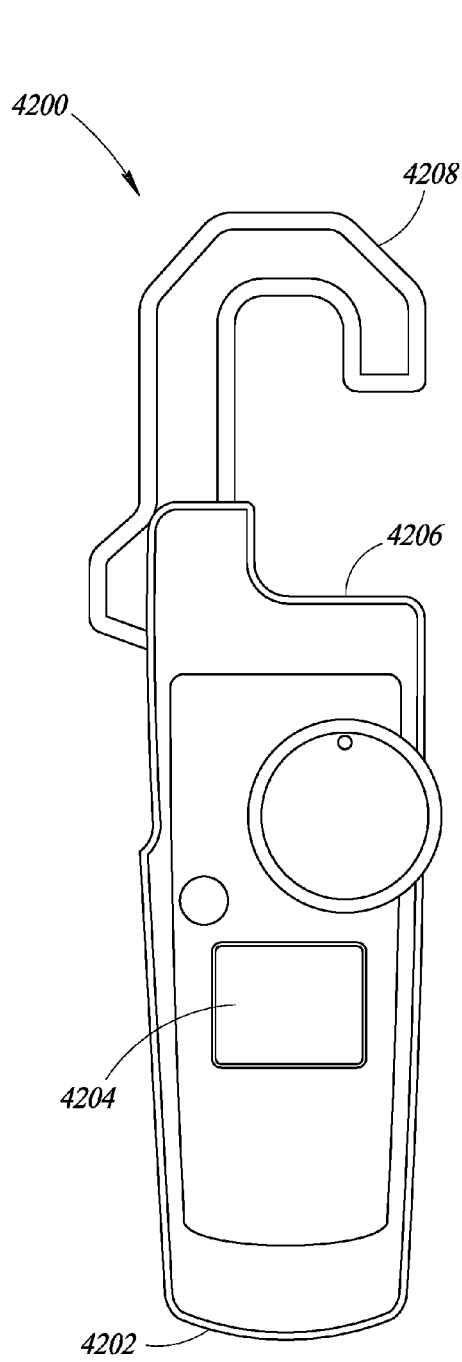
FIG. 33 is a front elevational view of an example measurement system which may incorporate at least some of the functionality of the present disclosure.
Figure 34:
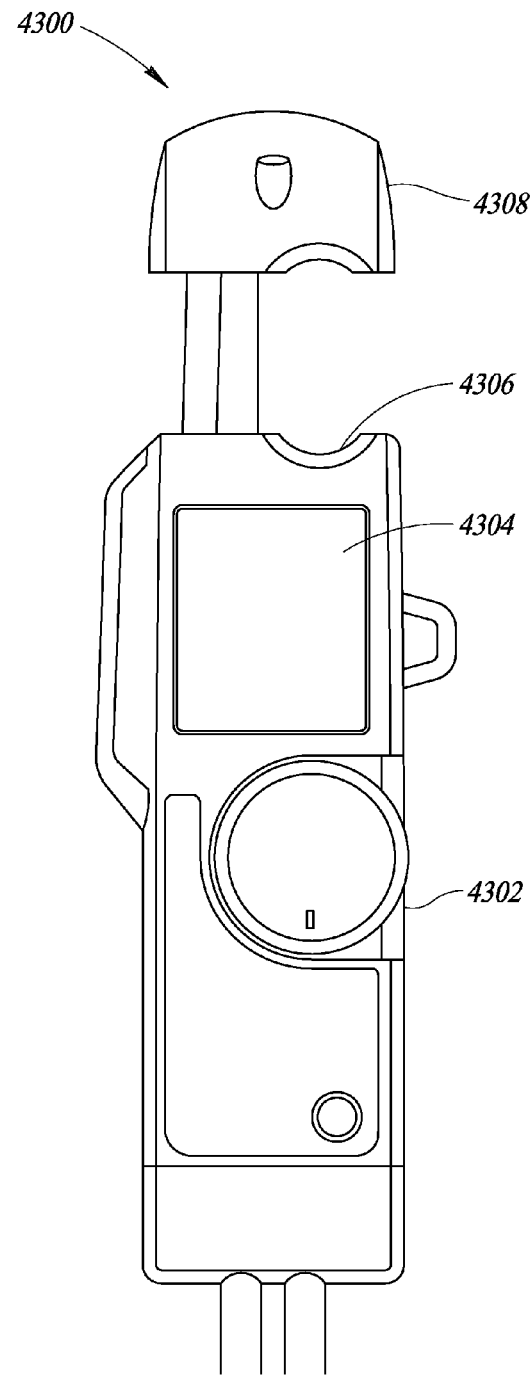
FIG. 34 is a front elevational view of an example measurement system which may incorporate at least some of the functionality of the present disclosure.
Figure 35:
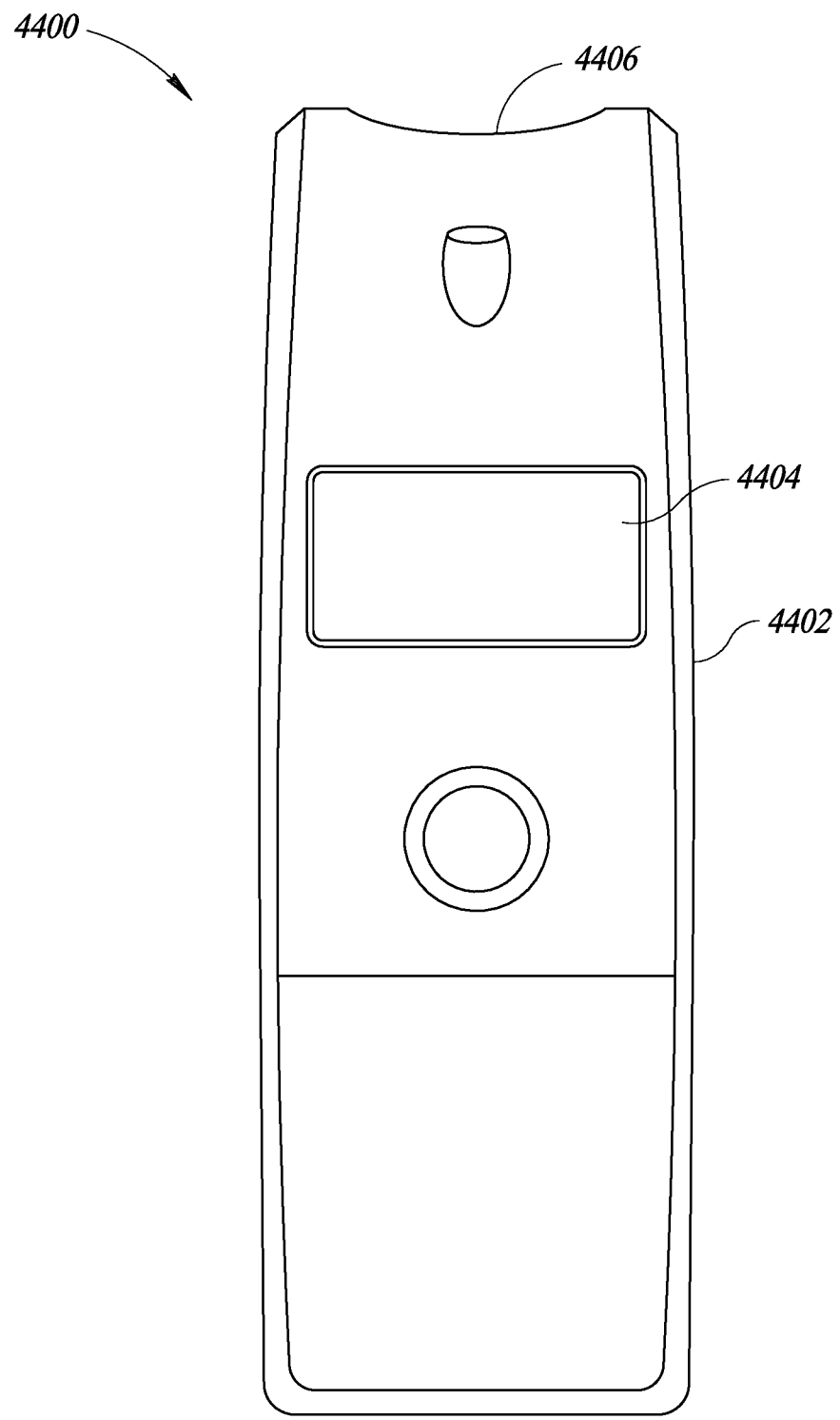
FIG. 35 is a front elevational view of an example measurement system which may incorporate at least some of the functionality of the present disclosure.

FIGS. 31-41B show various examples of measurement instruments which each may incorporate at least some of the functionality discussed herein. FIG. 31 shows a measurement instrument 4000 which includes a housing 4002, a readout display 4004, a front end 4006 which comprises a sensor, and a retractable clamp or jaw 4008 for grasping an insulated conductor. The clamp or jaw 4008, as well as other clamps or jaws of the present disclosure, may be permanently attached to the housing 4002 or may be selectively detachable. FIG. 32 shows a measurement instrument 4100 which includes a housing 4102, a readout display 4104, a front end 4106 which comprises a sensor, and a fixed claw 4108 which receives an insulated conductor therein. FIG. 33 shows a measurement instrument 4200 which includes a housing 4202, a readout display 4204, a front end 4206 which comprises a sensor, and a retractable hook 4208 for grasping an insulated conductor under test. FIG. 34 shows a measurement instrument 4300 which includes a housing 4302, a display 4304 which presents readouts and graphical information (e.g., waveforms, harmonics graphs), a front end 4306 which comprises a sensor, and a retractable hook 4308 for grasping an insulated conductor under test. FIG. 35 shows a measurement instrument 4400 which includes a housing 4402, a display 4404, and an arcuate shaped front end 4406 that includes a sensor therein.

Figure 36:
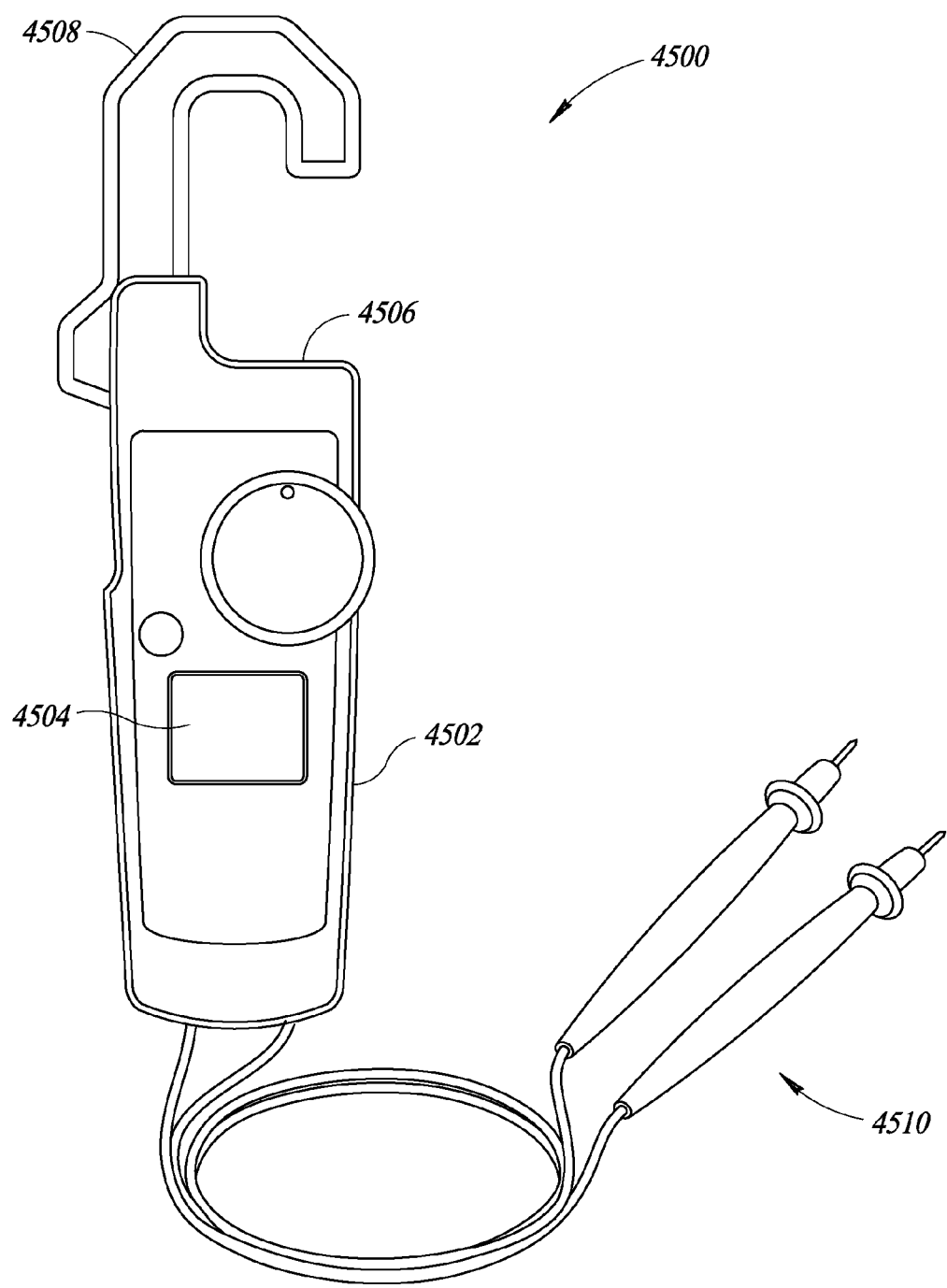
FIG. 36 is a front elevational view of an example measurement system which may incorporate at least some of the functionality of the present disclosure.

FIG. 36 shows a measurement instrument 4500 which includes a housing 4502, a readout display 4504, a front end 4506 which comprises a sensor, a retractable hook 4508, and optional reference leads 4510. The measurement instrument 4500 may be used to measure and/or derive various electrical characteristics, including, but not limited to, non-contact AC voltage, AC current, DC voltage, resistance, frequency, phase, KWh, KW, VA, var, PF, THD, inrush current, phase sequence, and voltage drop test.

Figure 37:
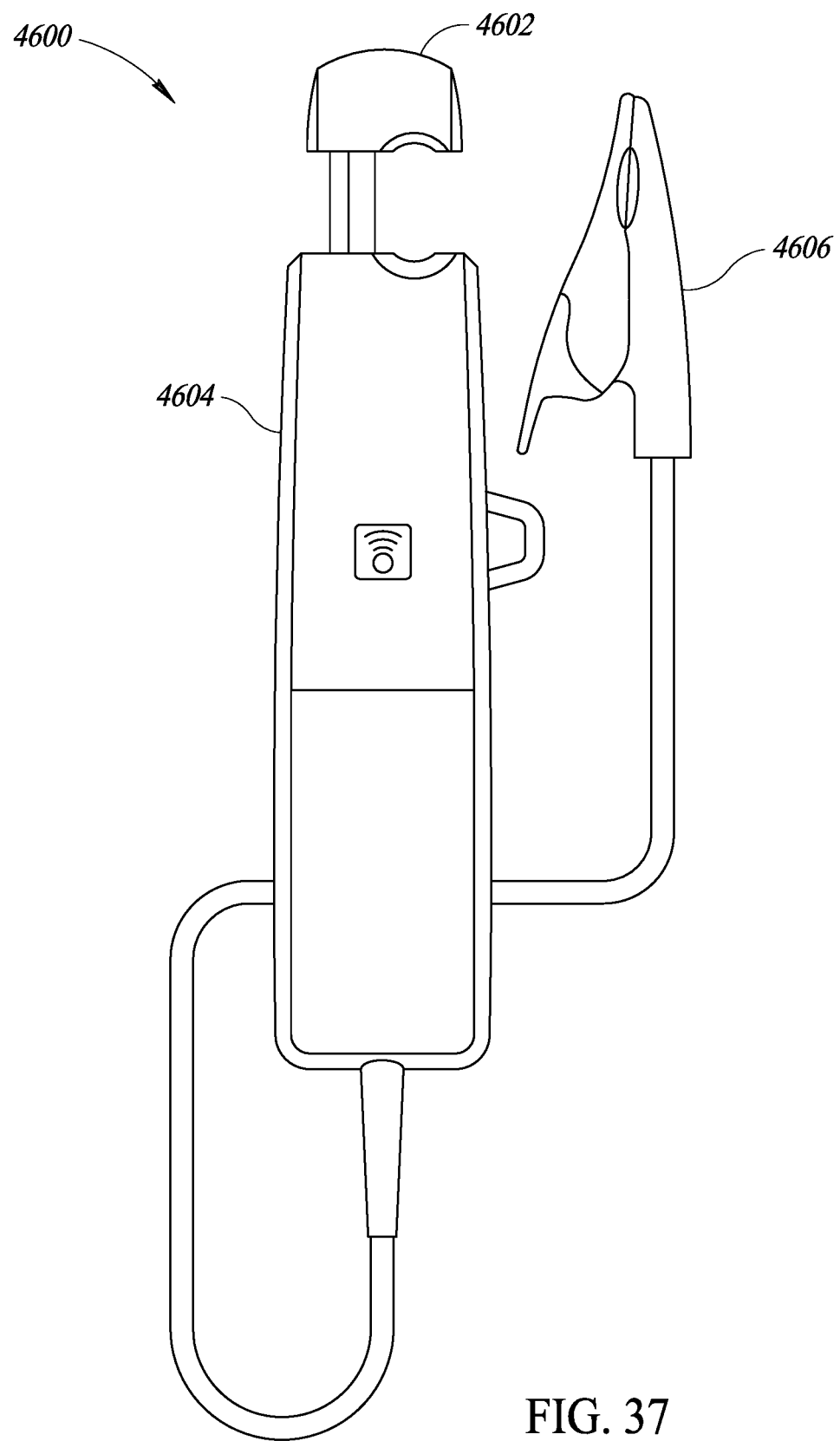
FIG. 37 is a front elevational view of an example measurement system which may incorporate at least some of the functionality of the present disclosure.

An example form factor for the measurement system 3800 is shown in FIG. 37, which illustrates a measurement instrument 4600 that includes a clamp 4602 extending from a housing portion 4604 which grasps an insulated conductor to be measured, and an optional clip 4606 which may be coupled to a reference node. In operation, the user may place the clamp 4604 onto the insulated conductor to be measured, and the measurement instrument 4600 may obtain voltage and/or current measurements for a period of time (e.g., seconds, minutes, hours, days, weeks, years), and may derive one or more additional AC electrical parameters from the measurements. The measurement data and/or the derived parameters may be sent in real-time or at determined intervals to one or more external processor-based devices where such data may be processed and/or presented to a user via a suitable user interface (e.g., display). The measurement instrument 4600 may also receive instructions or data from one or more external devices via wired and/or wireless communications, as discussed above.

Figure 38:
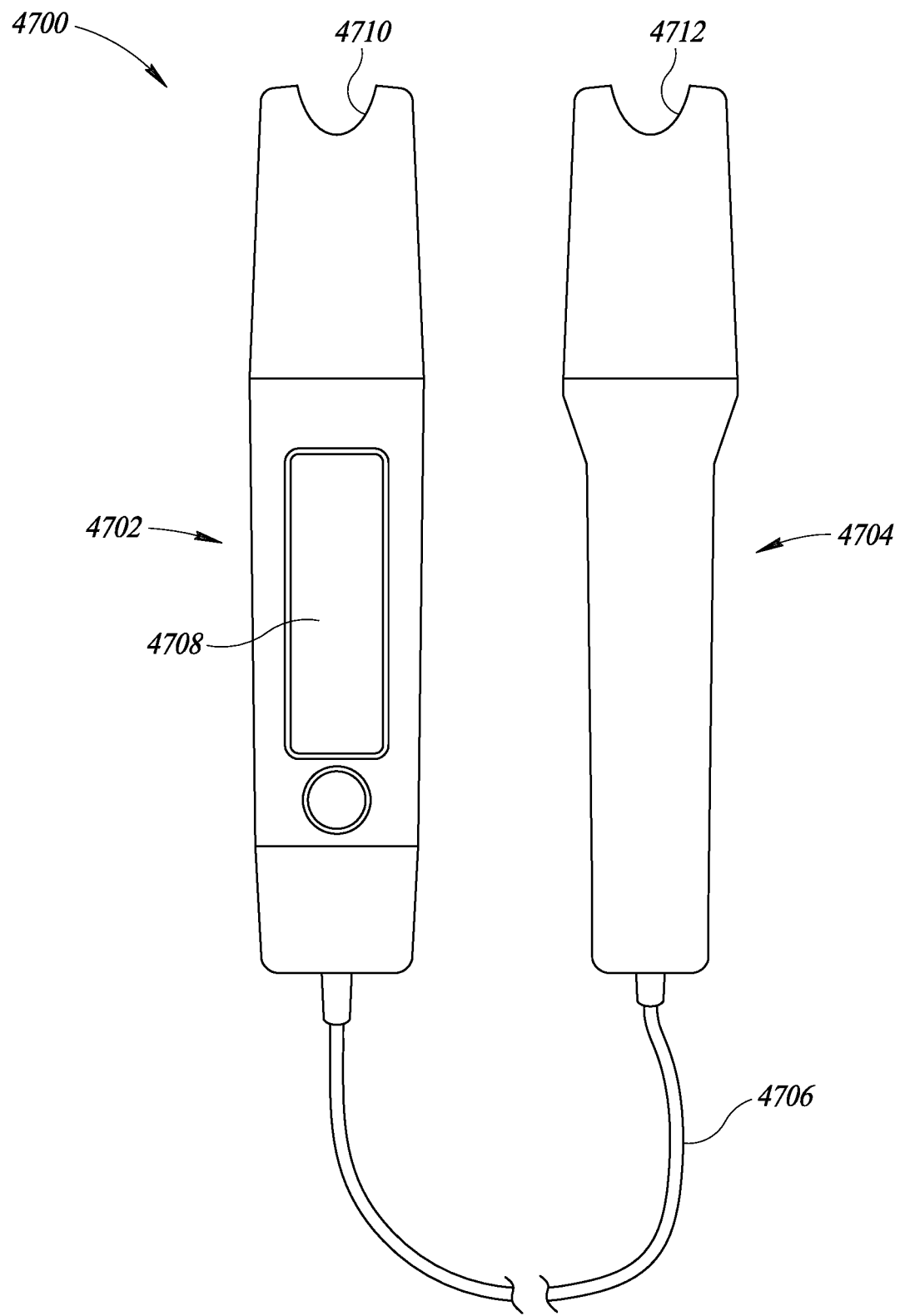
FIG. 38 is a front elevational view of an example measurement system which may incorporate at least some of the functionality of the present disclosure.

FIG. 38 shows a measurement instrument 4700 which includes a first housing 4702 electrically coupled to a second housing 4704 by a cable 4706. The first housing 4702 may include a display 4708 thereon for presenting measurement information to a user. The first housing 4702 may include a front end 4710 having a sensor therein for obtaining non-contact voltage measurements. Similarly, the second housing 4704 may include a front end 4712 having a sensor therein for obtaining non-contact voltage measurements. In operation, one or both of the first and second housings 4702 and 4704 may be used to obtain individual non-contact AC voltage measurements and/or individual AC current measurements. Additionally, when the front end 4710 of the first housing 4702 is positioned proximate a first insulated conductor and the front end 4712 of the second housing 4704 is positioned proximate a second insulated conductor, the measurement system 4700 may obtain combined non-contact phase-to-phase AC voltage measurements between the two insulated conductors.

Figure 39:
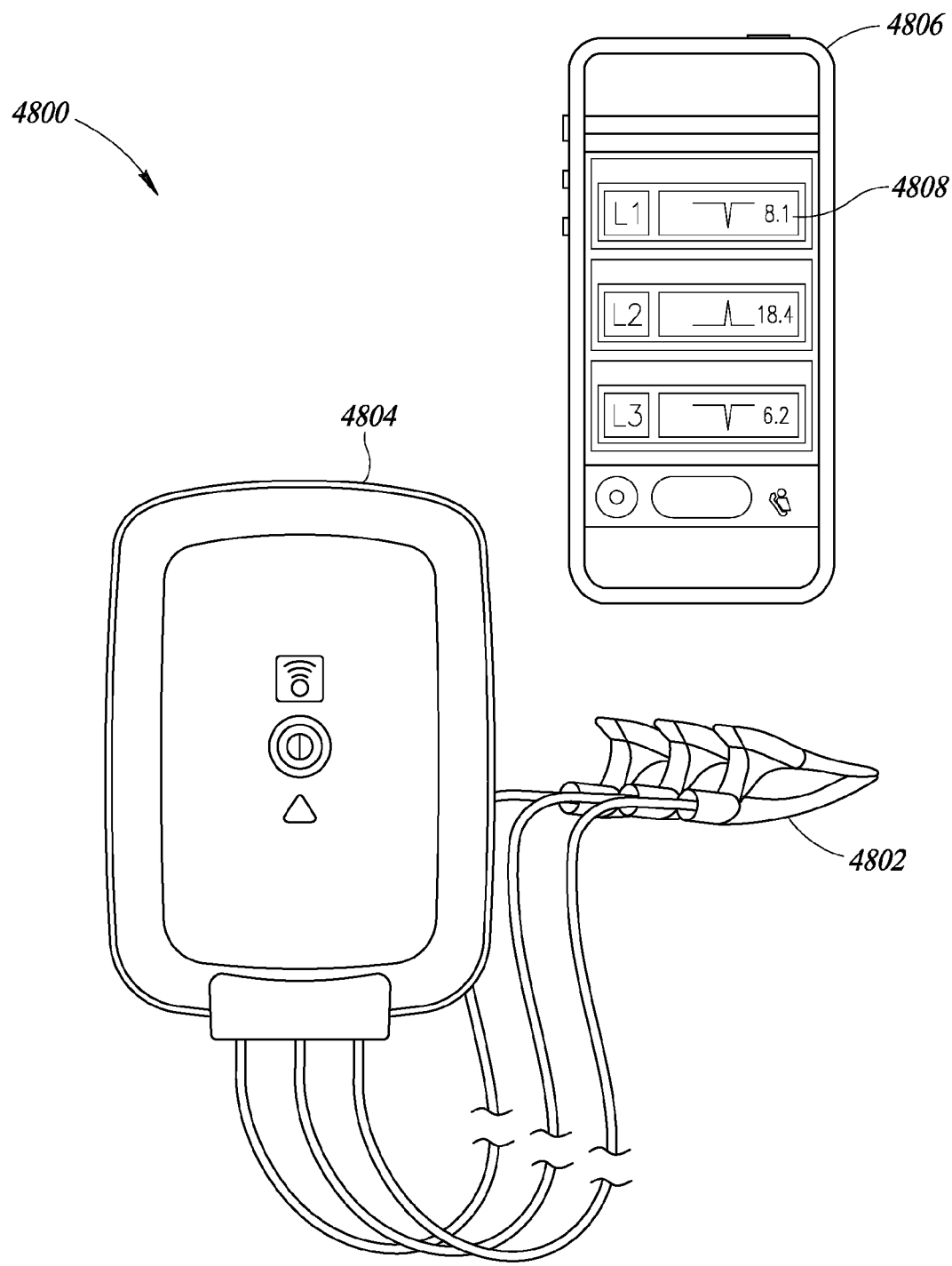
FIG. 39 is a front elevational view of an example measurement system which may incorporate at least some of the functionality of the present disclosure.

FIG. 39 shows a measurement instrument 4800 which includes a housing 4804 having a plurality of test leads 4802 coupled thereto. The measurement instrument 4800 may wirelessly communicate with an external processor-based device 4806 (e.g., smartphone, tablet), which external processor-based device may function as a user interface to control the measurement instrument and to present measurements obtained by the measurement instrument on a display 4808. In at least some implementations, the measurement instrument 4800 may measure and present (e.g., via the external processor-based device 4806) run cycles of fans, compressor, pumps, etc., and/or operating characteristics of heating, cooling, and/or lighting systems. The measurement instrument 4800 may also measure and/or derive non-contact AC voltage, AC voltage, AC current, DC voltage, resistance, frequency, phase, KWh, KW, VA, var, PF, and THD, for example.

Figure 40:
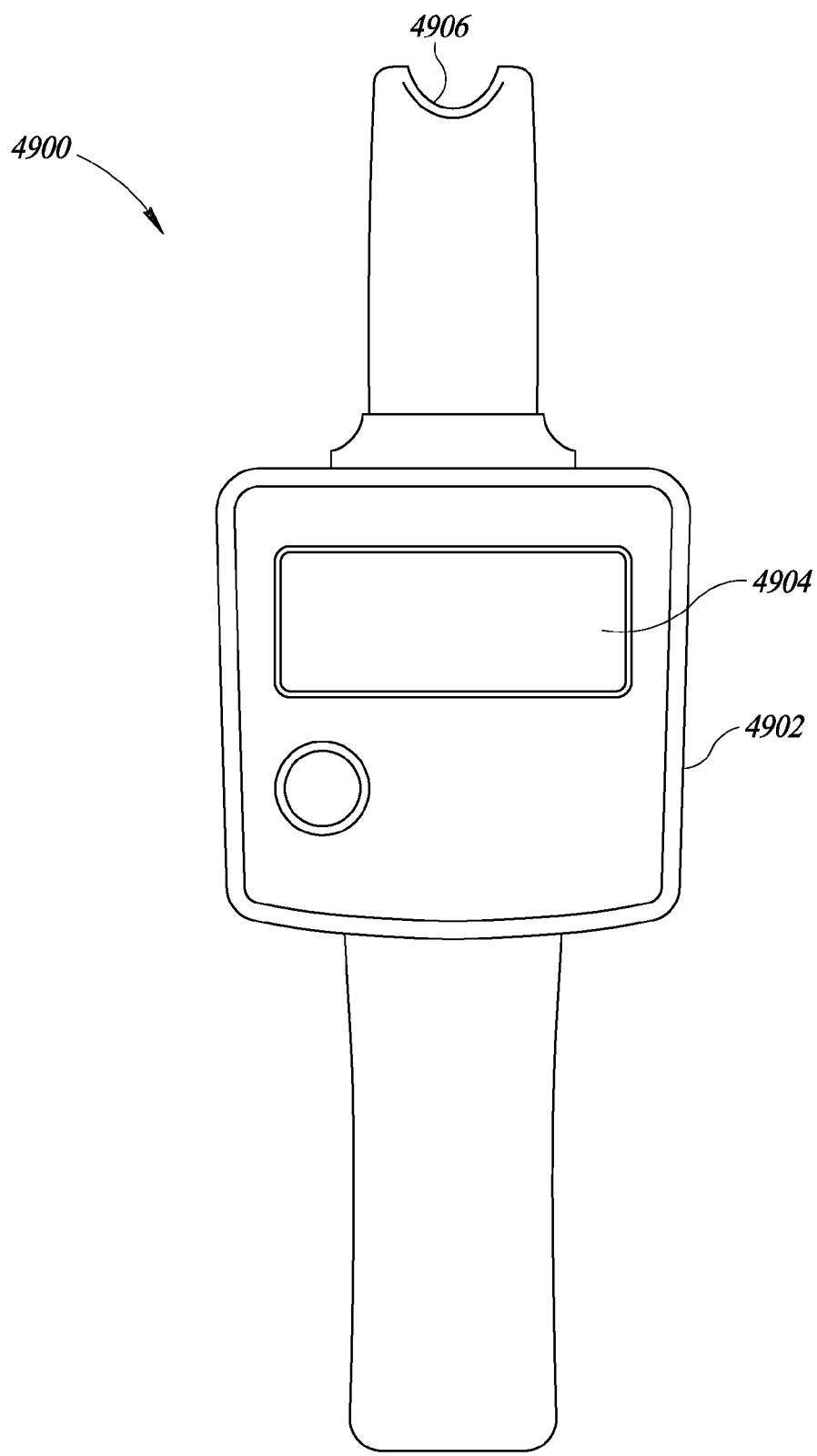
FIG. 40 is a front elevational view of an example measurement system which may incorporate at least some of the functionality of the present disclosure.

FIG. 40 shows a measurement instrument 4900 that includes a housing 4902, a display 4904, and a front end 4906 which comprises a sensor therein for measuring non-contact AC voltage. The measurement instrument 4900 may be used to measure or detect high voltage (e.g., greater than 1 kV). A hotstick (e.g., telescoping hotstick) may optionally be coupled to the measurement instrument 4900 to test high AC voltages without touching or disconnecting the circuit. Such may be useful in utility, industrial and mining applications when working with high-voltage equipment such as transmission lines, downed power lines, fuses and load-break connectors, for example.

Figure 41:
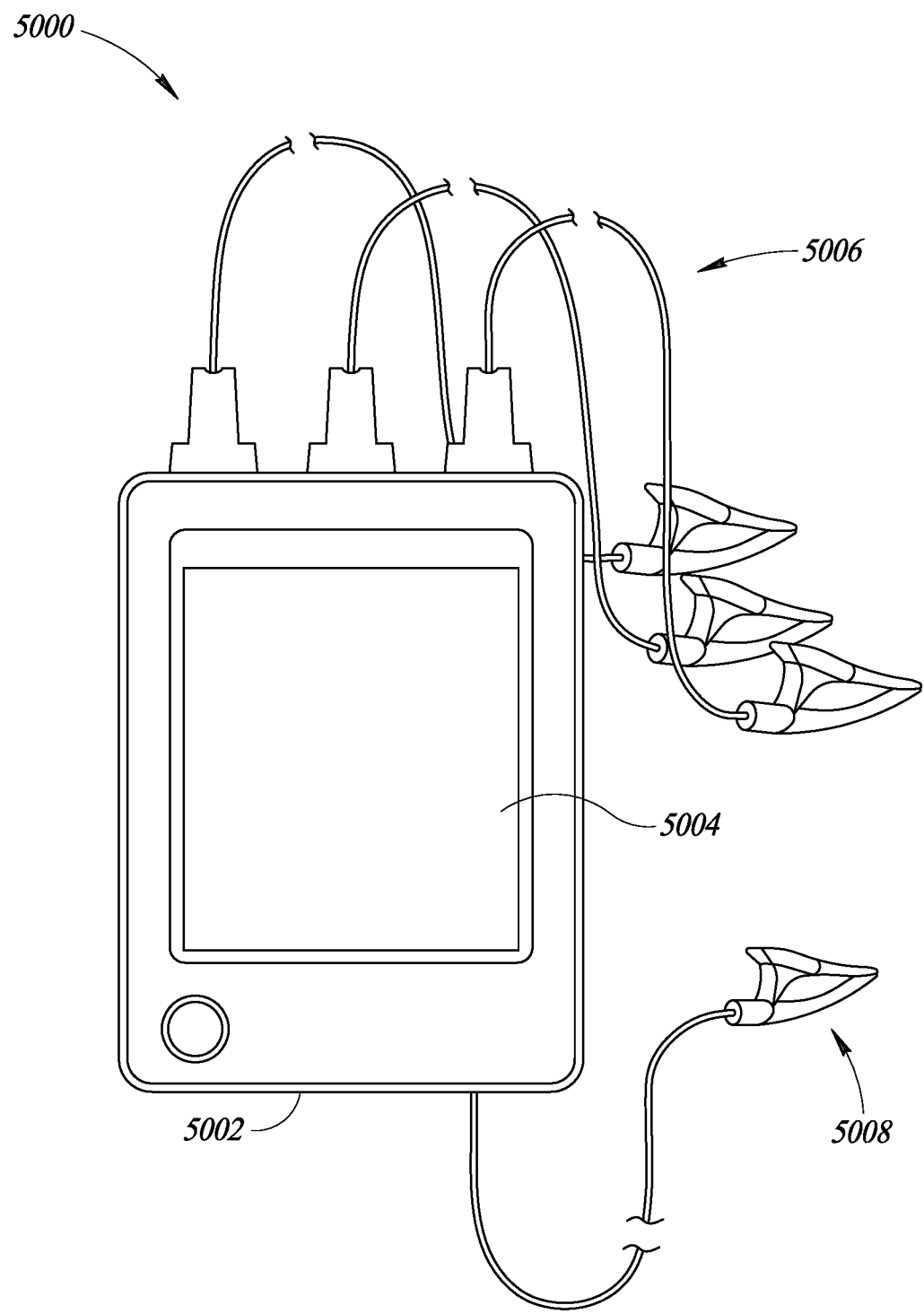
FIG. 41 is a front elevational view of an example measurement system which may incorporate at least some of the functionality of the present disclosure.

FIG. 41 shows a measurement instrument 5000 which includes a housing 5002, a display panel 5004 (e.g., touch screen), three signal input leads 5006, and a reference input lead 5008. The measurement instrument 5000 may be operative to measure non-contact AC voltage, AC current, DC voltage, resistance, continuity, frequency, phase, KWh, KW, VA, var, PF, THD, inrush current, phase sequence, and voltage drop test, for example.

Figures 42A, 42B:
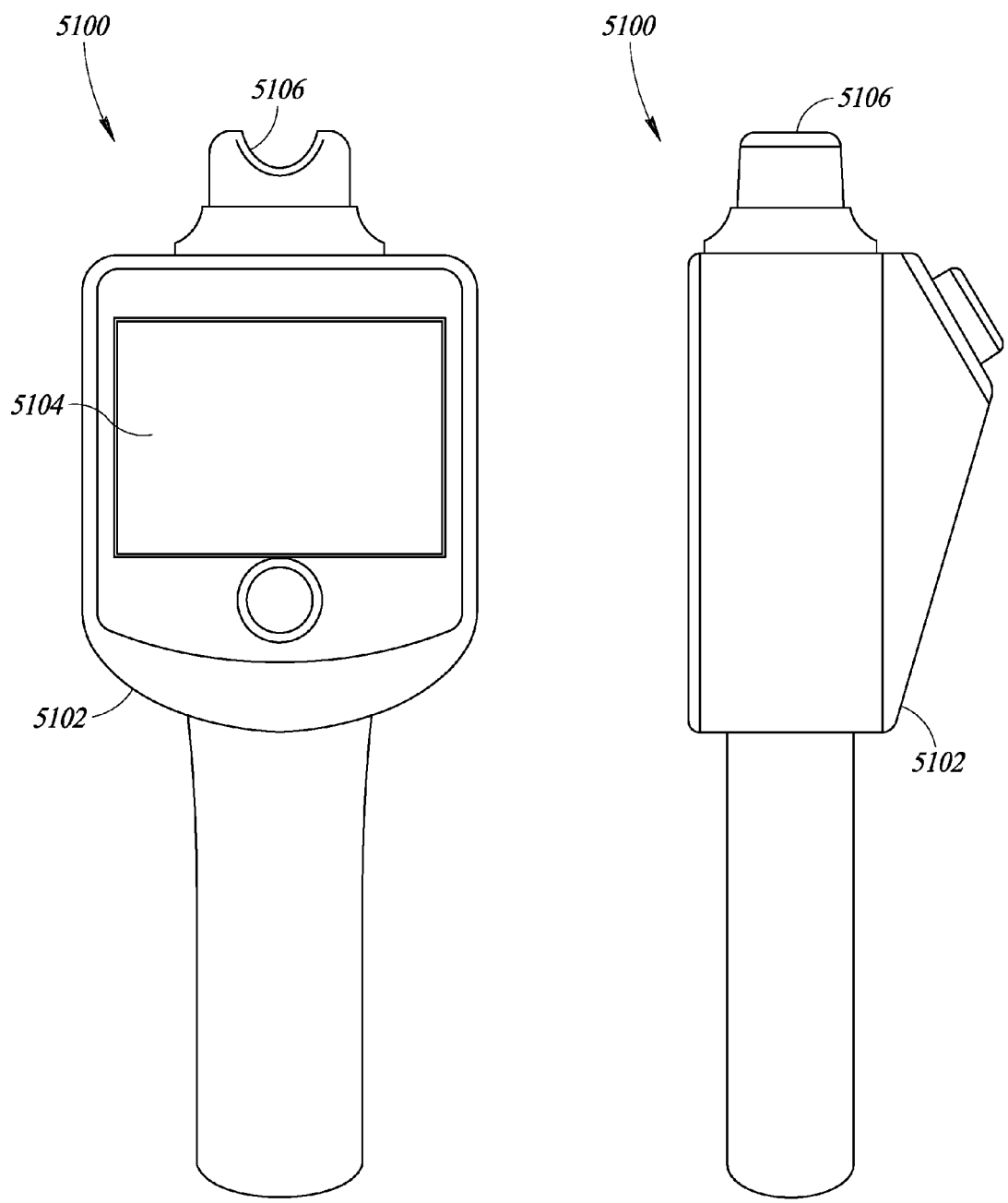
FIG. 42A is a front elevational view of an example measurement system which may incorporate at least some of the functionality of the present disclosure.
FIG. 42B is a left side elevational view of the measurement system of FIG. 42A.

FIGS. 42A and 42B show an infrared camera 5100 which includes a housing 5102 and a display 5104. The infrared camera 5100 includes a front end portion 5106 which includes a sensor that may be used to alternatingly or simultaneously measure non-contact AC voltage and AC current. The infrared camera 5100 may provide visual images on the display 5104, and may optionally be laser guided. In at least some implementations, the infrared camera 5100 is communicatively coupleable to an external processor-based device (e.g., smartphone, tablet computer, another measurement instrument) via a wired and/or wireless communications interface (e.g., spiral cable, Bluetooth® Low Energy).

One or more of the measurement systems or instruments of the present disclosure may include one or more of the following features: a smaller jaw width for better access to tight wires; a wider jaw opening for bigger conductors; a flashlight; a non-contact AC voltage to ground measurement; a non-contact AC voltage phase to phase measurement; a non-contact AC voltage indicator; a backlight display; ghost voltage detection (low Z); impedance; sound; replaceable test leads; optional flex clamp; capacitance measurement; autohold; temperature measurement; true RMS; current (e.g., mA); DC current; power; etc.

Non-Contact Current Measurement Systems

Systems and methods disclosed herein provide non-contact current measurement systems that measure current flowing through an insulated wire without requiring galvanic contact with the conductor of the insulated wire. The non-contact current measurement systems discussed herein may implemented as standalone ammeters or may be combined with one or more other implementations discussed herein to provide additional functionality, such as measurement of various AC electrical parameters (e.g., power, phase, frequency, harmonics, energy). In at least some implementations, a non-contact current measurement system includes a magnetic field sensor that is selectively positionable proximate (e.g., adjacent) an insulated wire under test. Non-limiting examples of magnetic field sensors include anisotropic magnetoresistive (AMR) sensors, giant magnetoresistive (GMR) sensors, fluxgate sensors, squid sensors, fiber-optic sensors, optically pumped sensors, nuclear procession sensors, search-coil sensors, magnetotransistor sensors, magnetodiode sensors, magneto-optical sensors, Hall effect sensors, Rogowski coils, current transformers, or other types of magnetic field sensors. The magnetic field sensor detects a magnetic field generated by the current flowing in the insulated wire. The magnitude of the magnetic field surrounding the conductor of the insulated wire is related (e.g., proportional) to the magnitude of current flowing through the conductor of the insulated wire.

In addition to detecting the magnetic field surrounding a conductor, at least some of the implementations of the present disclosure utilize an adjustable clamp assembly to provide control over the mechanical positioning of the insulated wire relative to the magnetic field sensor. Further, in at least some implementations, the non-contact current measurement system determines information relating to at least one physical dimension of the insulated wire under test, such as its outer diameter or gauge of the conductor inside the insulation of the insulated wire. Using the detected magnetic field, the controlled mechanical positioning, and the determined physical dimension information, the non-contact current measurement system accurately determines the magnitude of the current flowing through the conductor of an insulated wire.

Figure 43:
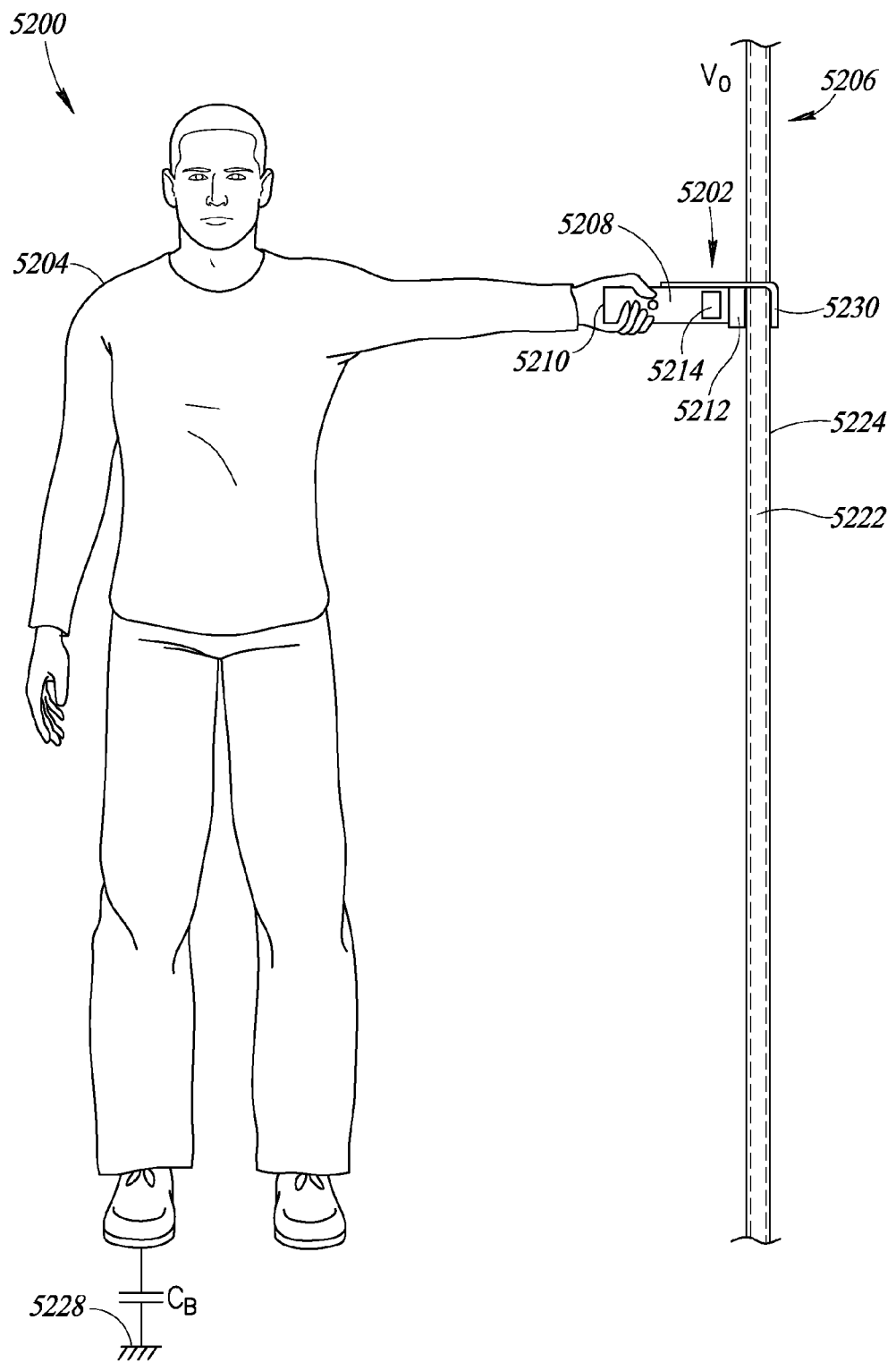
FIG. 43 is a pictorial diagram of an environment in which a non-contact current measurement system may be used by an operator to measure AC current present in an insulated wire without requiring galvanic contact with the insulated wire, according to one illustrated implementation.
Figure 44A:
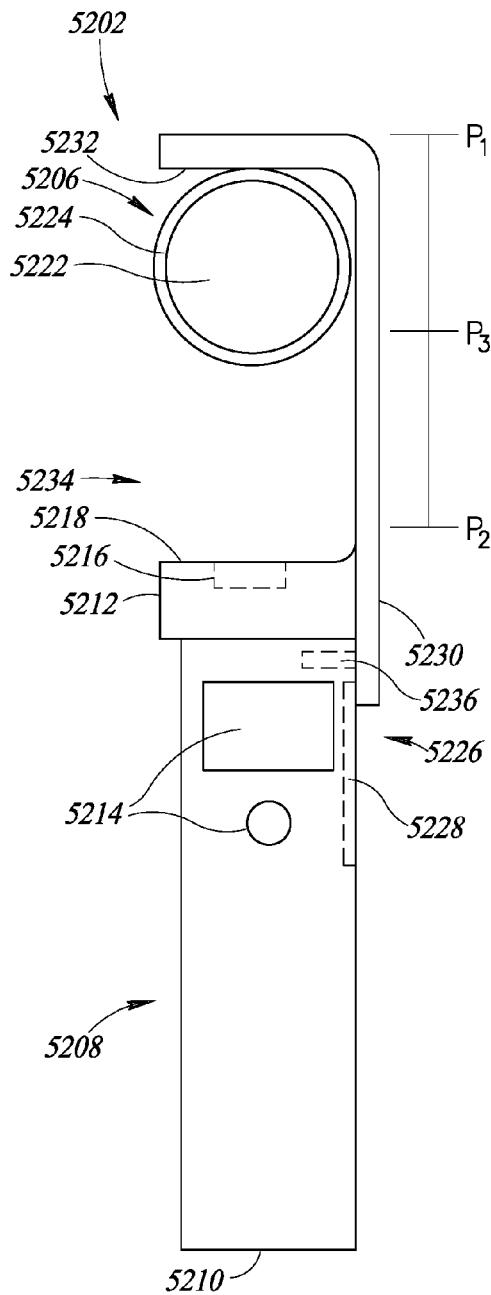
FIG. 44A is a front elevational view of a non-contact current measurement system which includes an adjustable clamp assembly, shown with a clamp member of the adjustable clamp assembly spaced apart from an insulated wire.
Figure 44B:
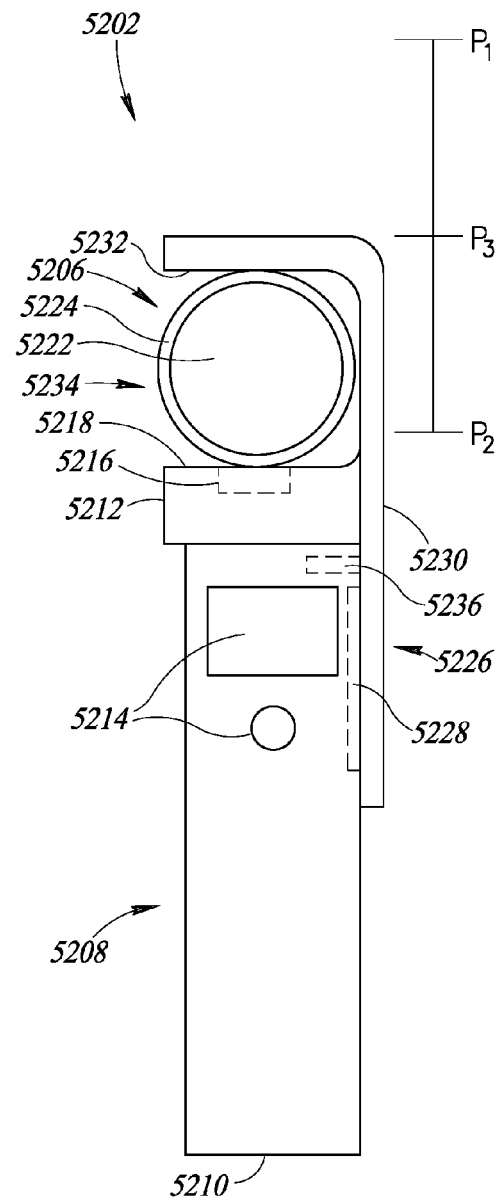
FIG. 44B is a front elevational view of the non-contact current measurement system of FIG. 44A, shown with the insulated wire clamped by the adjustable clamp assembly.

FIG. 43 is a pictorial diagram of an environment 5200 in which a non-contact current measurement system 5202 may be used by a technician 5204 to measure AC current present in an insulated wire 5206 without requiring galvanic contact between the non-contact current measurement system and the insulated wire 5206. FIGS. 44A and 44B show enlarged views of the non-contact current measurement system 5202.

The non-contact current measurement system 5202 includes a housing or body 5208 which includes a grip portion or end 5210 and a front portion or end 5212 opposite the grip portion. The housing 5208 may also include a user interface 5214 which facilitates user interaction with the non-contact current measurement system 5202. The user interface 5214 may include any number of inputs (e.g., buttons, dials, switches, touch sensor) and any number of outputs (e.g., display, LEDs, speakers, buzzers). The non-contact current measurement system 5202 may also include one or more wired and/or wireless communications interfaces (e.g., USB, Wi-Fi®, Bluetooth®).

As shown in FIGS. 44A and 44B, a magnetic field sensor 5216 (e.g., anisotropic magnetoresistive (AMR) sensor, giant magnetoresistive (GMR) sensor, fluxgate sensor, or other magnetic field sensor) is positioned below a top surface 5218 of the front end 5212. The magnetic field sensor 5216 is used to detect the magnetic field generated by a current flowing in the insulated wire 5206, which comprises a conductor 5222 surrounded by one or more layers of insulation 5224. The magnitude of the magnetic field surrounding the conductor 5222 is related (e.g., proportional) to the magnitude of the current flowing through the conductor. Generally, the magnitude of the current flowing in the conductor 5222 may be accurately determined by the magnetic field sensor 5216 when two parameters are met. The first parameter is control over the mechanical positioning of the insulated wire 5206 relative to the magnetic field sensor 5216, which is controlled by an adjustable clamp assembly 5226 in at least some implementations. The second parameter is physical dimension information of the insulated wire 5206, such as its outer diameter or the diameter of the conductor inside the insulation of the insulated wire (i.e., gauge), which may be determined or estimated by a position feedback sensor 5228 operatively coupled to the adjustable clamp assembly 5226. The adjustable clamp assembly 5226 and the position feedback sensor 5228 are discussed further below.

Further, in at least some implementations, physical dimension information regarding the gauge of the insulated wire 5206 may additionally or alternatively be obtained utilizing one or more reference signal sensors that detect a generated reference signal (e.g., reference current signal) between the sensor and the insulated wire 5206. Various example non-contact measurement systems that implement such a "reference signal" method of detecting physical dimension information for an insulated wire are discussed above with reference to FIG. 1A through FIG. 15. For example, in at least some implementations, an adjustable clamp assembly and position feedback sensor may be used to determine the overall diameter of an insulated wire, and the reference signal method may be used to determine the thickness of the insulation of the insulated wire. Using the determined overall diameter of the insulated wire and the determined insulation thickness, the non-contact current measurement system may automatically determine or estimate the diameter of the conductor inside the insulation of the insulated wire (e.g., the diameter of the conductor is equal to the overall diameter of the insulated wire reduced by two times the insulation thickness). The determined diameter of the conductor may then be used in conjunction with the detected magnetic field to accurately determine the magnitude of the current flowing through the insulated wire.

In the illustrated implementation, the mechanical positioning of the insulated wire 5206 is provided by the adjustable clamp or "slider" clamp assembly 5226 which ensures that the insulated conductor is positioned in proper alignment (e.g., adjacent) with the magnetic field sensor 5216 during measurement. The adjustable clamp assembly 5226 includes a clamp member 5230 coupled to the housing 5208 that is selectively movable toward to and away from the top surface 5218 of the front end 5212. The clamp member 5230 may be referred to herein as a first clamp portion, and the front end 5212 may be referred to herein as a second clamp portion. The clamp member 5230 includes a clamp surface 5232 that faces the top surface 5218 of the front end 5212 and is generally parallel thereto. The clamp surface 5232 and the top surface 5218 together define a variably-sized clamp opening 5234 sized and dimensioned to receive a portion of the insulated wire 5206 therein. In the illustrated example, the clamp member 5230 is selectively movable between a first position $P_1$, in which the clamp opening 5234 is relatively large, and a second position $P_2$, in which the clamp opening is relatively small.

As shown in FIG. 44A, a user may position the insulated wire 5206 within the clamp opening 5234 when the clamp surface 5232 of the clamp member 5230 is spaced apart from the top surface 5218 of the front end 5212 by an amount sufficient to easily allow the insulated wire to be moved into the clamp opening. Then, as shown in FIG. 44B, the user may move the clamp member 5230 downward to a third position $P_3$ to "clamp" the insulated wire 5206 between the top surface 5218 of the front end 5212 and the clamp surface 5232, such that the top surface and the clamp surface both contact the insulation layer of the insulated wire on opposite sides. As used herein, the term "clamp" is used to refer to the insulated wire 5206 being contacted by the top surface 5218 and the clamp surface 5232 on opposite sides of the insulated wire to maintain the position of the wire relative to the magnetic field sensor 5216. That is, the term does not indicate that the top surface 5218 or the clamp surface 5232 necessarily impart any particular amount of force on the insulated wire 5206.

The position feedback sensor 5228 is operative to sense the position (e.g., linear position) of the clamp member 5230 and generates a position feedback sensor signal (e.g., linear position feedback sensor signal) that is indicative of such. The position feedback signal may be a digital or analog signal, for example. When the insulated wire 5206 is clamped between the clamp surface 5232 and the top surface 5218 of the front end 5212, the sensed position of the clamp member 5230 may be used to determine or estimate the diameter or gauge of the insulated wire. For example, the position feedback sensor 5228 may provide a position feedback sensor signal that is proportional to the extension of the clamp member 5230. The position feedback sensor 5228 may be any suitable sensor operative to sense the extension of the clamp member 5230 and determine the diameter of the insulated wire 5206. For example, the position feedback sensor 5228 may include a resistive sensor, a magneto-resistive sensor, a Hall Effect sensor, an optical sensor, etc. In at least some implementations, the "reference signal" method may additionally or alternatively be used to determine the diameter or dimensions of the conductor inside the insulated wire 5206, which may further allow the system 5202 to provide accurate current measurements.

In at least some implementations, the clamp member 5230 may be biased toward the second position $P_2$ by a suitable biasing member 5236. For example, the clamp member 5230 may be biased toward the second position $P_2$ by a spring coupled between the clamp member and a portion of the housing 5208. Advantageously, biasing the clamp member 5230 may allow for the clamp assembly 5226 to better retain the insulated wire 5206 in the clamp opening 5234, while also providing more uniform measurements of the diameter of the insulated wire 5206.

The mechanical positioning of the insulated wire 5206 relative to the magnetic field sensor 5216 may be important due to the orthogonal relationship between magnetic flux density and current flow (e.g., the "right hand rule" for magnetic flux around a current-carrying conductor). In addition, the physical dimension information provided by the position feedback sensor 5228 may be important due to magnetic flux density, which is tangent to the circumference of the conductor, being higher in conductors with smaller diameters than conductors with larger diameters for the same current flow. Thus, by knowing at least an estimation of the diameter of the insulated wire, the non-contact current measurement system 5202 can more accurately determine the current flowing through the insulated wire by accounting for the impact the diameter of the wire has on the relationship between the sensed magnetic field and the current flowing in the wire.

As discussed further below with reference to FIG. 48, using data from the magnetic field sensor 5216 and the diameter or gauge data from the position feedback sensor 5228 and/or a reference signal sensor, at least one processor of the non-contact current measurement system 5202 may accurately determine at least one characteristic (e.g., magnitude, frequency) of the current flowing through the insulated wire 5206. Such information may be presented to the user via a display of the user interface 5214, stored in a nontransitory processor-readable storage medium of the non-contact current measurement system, and/or transmitted to a separate device by a wired or wireless communications interface.

Although the illustrated non-contact current measurement system 5202 includes the magnetic field sensor 5216, it is appreciated that in other implementations the non-contact current measurement system may include various other types of current sensors (e.g., Hall Effect sensor, a Rogowski coil, a current transformer, etc.) capable of sensing the magnetic field generated by a current without requiring galvanic contact with the wire under test.

In at least some implementations, the non-contact measurement system 5202 may utilize the body capacitance ($C_B$) between the operator 5204 and ground 5228 during the current measurement. Although the term ground is used for the node 128, the node is not necessarily earth/ground but could be connected in a galvanically isolated manner to any other reference potential by capacitive coupling.

FIG. 45 shows a front elevational view of a non-contact current measurement system 5300 which has a different form factor than the non-contact current measurement system 5202 of FIGS. 44A-44B. The non-contact current measurement system 5300 may be similar or identical to the non-contact current measurement system 5202 discussed above in many respects. Thus, some or all of the discussion above regarding the features of the non-contact current measurement system 5202 may also apply to the non-contact current measurement system 5300.

The non-contact current measurement system 5300 includes a housing 5302 having a front end 5304 and a grip portion or end 5306 opposite the front end. The housing 5302 includes a user interface 5308 (e.g., display, buttons) positioned on a surface of the housing. The front end 5304 includes a current sensor 5312 (e.g., magnetic field sensor), an optional reference signal sensor 5313 and a retractable jaw or clamp member 5314 for grasping an insulated wire (e.g., insulated wire 5206 of FIGS. 43, 44A and 44B). The operation of various reference signal sensors is discussed above with reference to FIGS. 1A-15. The front end 5304 includes a front end surface 5316 adjacent the current sensor 5312 and the clamp member 5314 includes a clamp surface 5318 opposite the front end surface 5316. For a further increase of current measurement accuracy, a second magnetic field sensor could be used in clamp member 5314. The average signal between the current sensor 5312 and an additional sensor located in the clamp member 5314 can then be used for the current calculation. In addition, the difference between both sensors exceeding a limit can be used to identify unreliable situations caused by external stray currents or an incorrectly positioned wire clamped between the clamp members 5314 and 5316. In use, an insulated wire may be clamped between the front end surface 5316 and the clamp surface 5318 to position the insulated wire adjacent the current sensor 5312. The clamp member 5314, as well as other clamp members of the present disclosure, may be permanently attached to the housing 5302 or may be selectively detachable from the housing. The non-contact current measurement system 5300 also includes a position feedback sensor 5320 and optionally includes a biasing member 5322 to bias the clamp member 5314 toward the housing 5302 to clamp an insulated wire between the front end surface 5316 and the clamp surface 5318. Further discussion of embodiments of a current sensor and a position feedback sensor suitable for use in the non-contact current measurement system 5300 is provided with regard to FIG. 48.

FIG. 46 shows a front elevational view of a non-contact current measurement system 5400 which has a different form factor than the non-contact current measurement system 5202 of FIGS. 44A-44B. The non-contact current measurement system 5400 may be similar or identical to the non-contact current measurement systems discussed above in many respects. Thus, some or all of the discussion above regarding the features of the non-contact current measurement systems above may also apply to the non-contact current measurement system 5400.

The non-contact current measurement system 5400 includes a housing 5402 having a front end 5404 and a grip portion or end 5406 opposite the front end. The housing 5402 includes a user interface 5408 (e.g., display, buttons, dial) positioned on a surface of the housing. The front end 5404 includes a current sensor 5412 (e.g., magnetic field sensor), an optional reference signal sensor 5413, and a retractable hook or clamp member 5414 for grasping an insulated wire (e.g., insulated wire 5206 of FIGS. 44, 44A and 44B). The front end 5404 includes a front end surface 5416 adjacent the current sensor 5412 and the clamp member 5414 includes a clamp surface 5418 opposite the front end surface 5416. In use, an insulated wire may be clamped between the front end surface 5416 and the clamp surface 5418 to position the insulated wire adjacent the current sensor 5412. The clamp member 5414 may be permanently attached to the housing 5402 or may be selectively detachable from the housing. The non-contact current measurement system 5400 also includes a position feedback sensor 5420 and optionally includes a biasing member 5422 to bias the clamp member 5414 toward the housing 5402 to clamp an insulated wire between the front end surface 5416 and the clamp surface 5418. Suitable embodiments of a current sensor and position feedback sensor that may be used in the non-contact current measurement system 5400 is provided with regard to FIG. 48.

Figure 47:
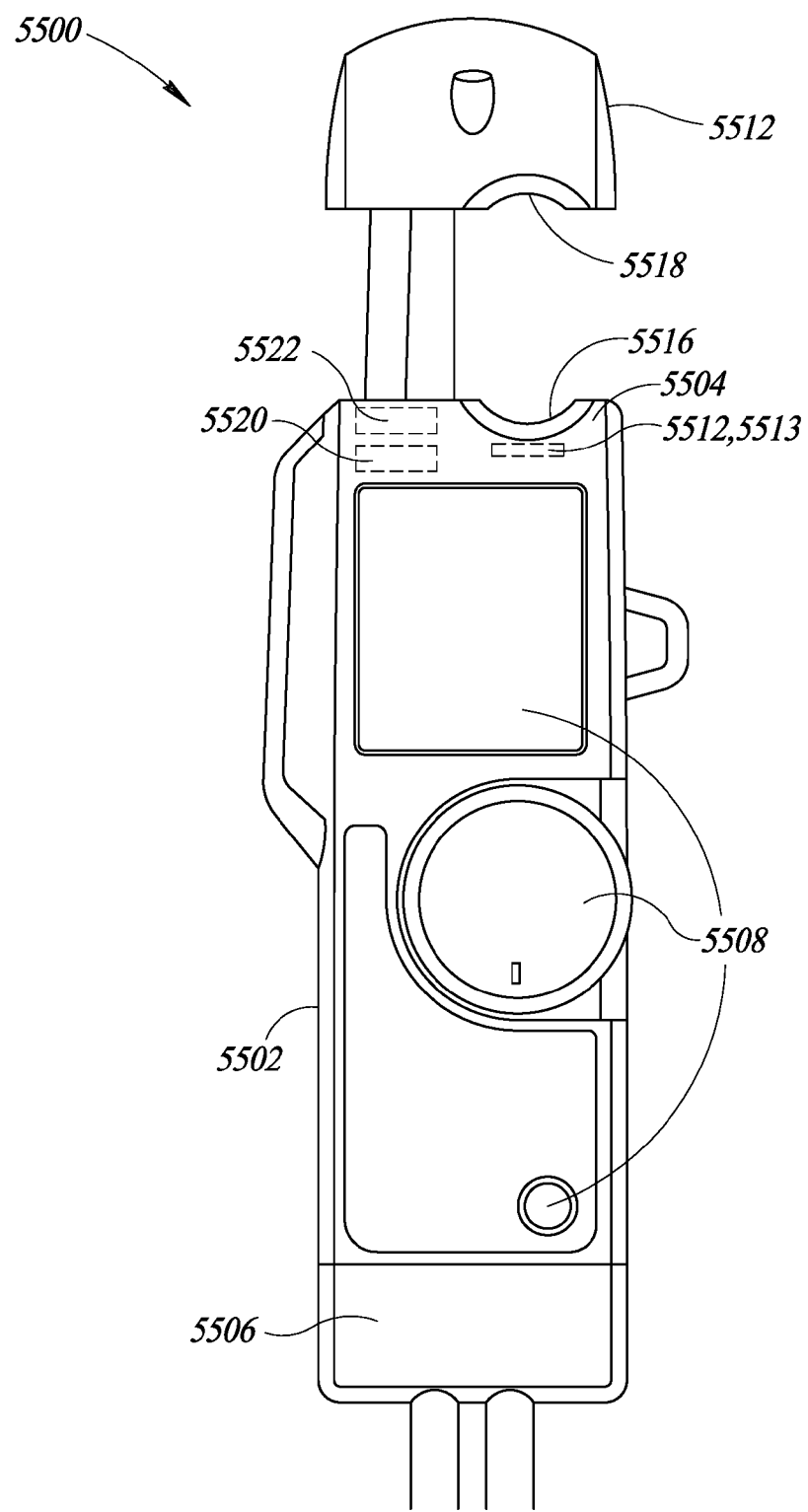
FIG. 47 is a front elevational view of another implementation of a non-contact current measurement system, according to one illustrated implementation.

FIG. 47 shows a front elevational view of a non-contact current measurement system 5500 which has a different form factor than the non-contact current measurement system 5202 of FIGS. 44A-44B. The non-contact current measurement system 5500 may be similar or identical to the non-contact current measurement systems discussed above in many respects. Thus, some or all of the discussion above regarding the features of the non-contact current measurement systems above may also apply to the non-contact current measurement system 5500.

The non-contact current measurement system 5500 includes a housing 5502 having a front end 5504 and a grip portion or end 5506 opposite the front end. The housing 5502 includes a user interface 5508 (e.g., display, buttons, dial) positioned on a surface of the housing. The front end 5504 includes a current sensor 5512 (e.g., magnetic field sensor), an optional reference signal sensor 5513, and a retractable hook or clamp member 5514 for grasping an insulated wire (e.g., insulated wire 5206 of FIGS. 43, 44A and 44B). The front end 5504 includes a front end surface 5516 adjacent the current sensor 5512 and the clamp member 5514 includes a clamp surface 5518 opposite the front end surface 5516. In use, an insulated wire may be clamped between the front end surface 5516 and the clamp surface 5518 to position the insulated wire adjacent the current sensor 5512. The clamp member 5514 may be permanently attached to the housing 5502 or may be selectively detachable from the housing. The non-contact current measurement system 5500 also includes a position feedback sensor 5520 and optionally includes a biasing member 5522 to bias the clamp member 5514 toward the housing 5502 to clamp an insulated wire between the front end surface 5516 and the clamp surface 5518. FIG. 48 discussed below provides additional discussion of embodiments of a current sensor and a position feedback sensor that are suitable for use in the non-contact current measurement system 5500.

Figure 48:
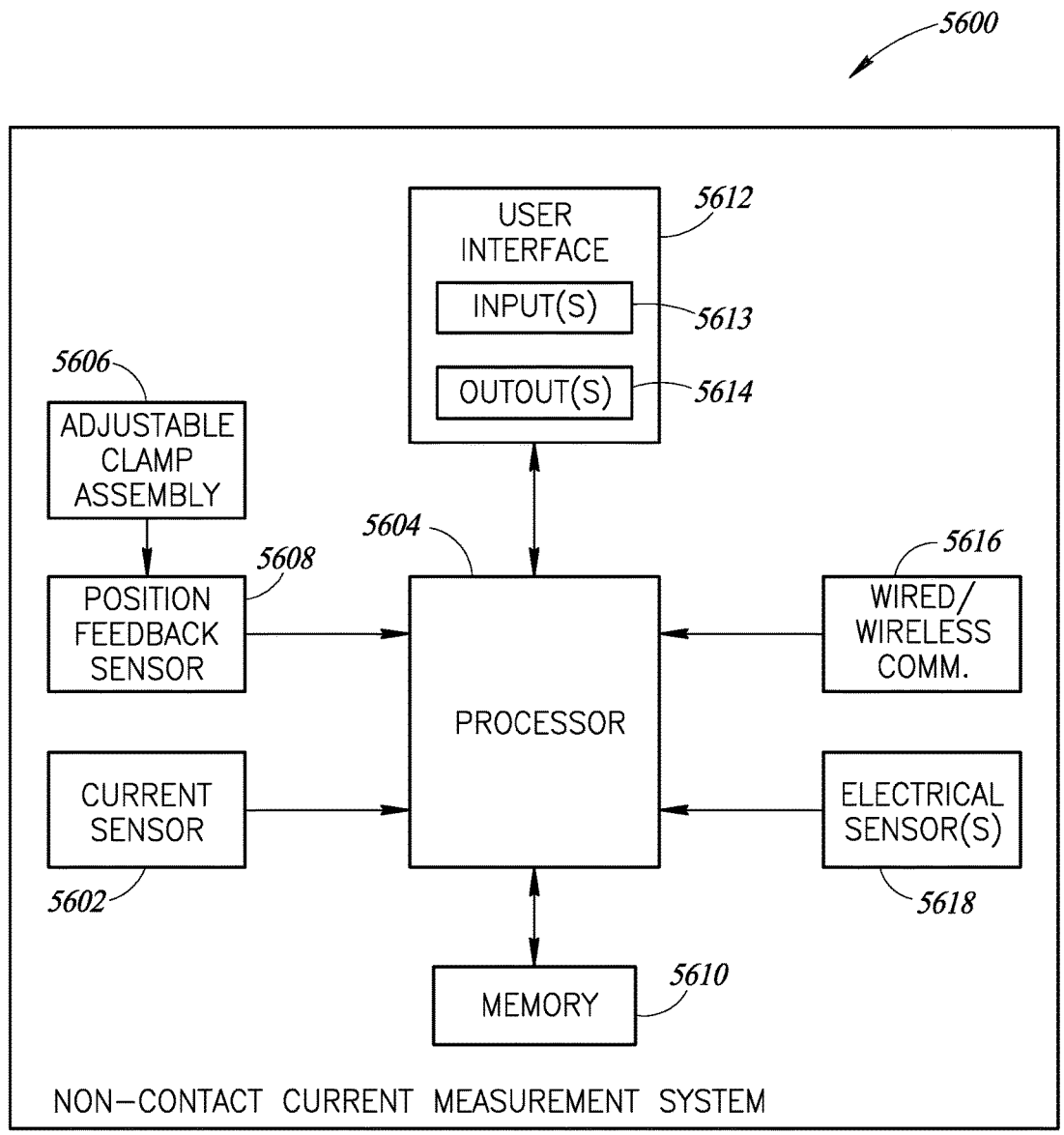
FIG. 48 is a schematic block diagram of a non-contact current measurement system, according to one illustrated implementation.

FIG. 48 is a schematic block diagram of a non-contact current measurement system or instrument 5600 which provides non-contact current measurement functionality. The non-contact current measurement system 5600 may be similar or identical to any of the non-contact current measurement systems discussed herein.

The non-contact current measurement system 5600 includes a current sensor 5602 (e.g., magnetic field sensor) communicatively coupled to a processor 5604. The non-contact current measurement system 5600 also includes an adjustable clamp assembly 5606, and a position feedback sensor 5608 operatively coupled to the adjustable clamp assembly and the processor 5604. In operation, the position feedback sensor 5608 generates a position feedback sensor signal indicative of the position of the adjustable clamp assembly 5606, and from the detected position, determines a diameter of an insulated wire clamped in the adjustable clamp assembly 5606, as discussed above. The processor 5604 receives the position feedback sensor signal from the position feedback sensor 5608.

The current sensor 5602 may be any suitable non-contact current sensor, such as a magnetic field sensor, Hall Effect sensor, etc. In operation, the current sensor 5602 generates a current sensor signal that is indicative of at least one characteristic of a current flowing through the insulated wire clamped in the adjustable clamp assembly 5606. For example, the at least one characteristic may include a magnitude of the current or a frequency of the current. In implementations wherein the current sensor 5602 is a magnetic field sensor, the current sensor may generate a magnetic field sensor signal that is indicative of a magnetic field produced by the current flowing through the insulated wire, which magnetic field may be analyzed by the processor 5604 to determine the at least one characteristic of the current flowing through the insulated wire.

The adjustable clamp assembly 5606 may be similar or identical to any of the adjustable clamp assemblies discussed herein. The position feedback sensor 5608 is operative to generate a position feedback sensor signal indicative of a clamp position of the adjustable clamp assembly 5606, which in turn is indicative of a diameter of the insulated wire clamped by the adjustable clamp assembly. The position feedback sensor 5608 may be any suitable position sensor including, but not limited to, a resistive sensor, a magneto-resistive sensor, a Hall Effect sensor, an optical sensor, etc.

The processor 5604 may include one or more logic processing units, such as one or more central processing units (CPUs), microprocessors, digital signal processors (DSPs), application-specific integrated circuits (ASICs), field programmable gate arrays (FPGAs), microcontrollers, other programmable circuits, combinations of the above, etc. Generally, the processor 5604 may serve as the computational center of the non-contact current measurement system 5600 by supporting the execution of instructions and reading and writing data to one or more storage devices, I/O interfaces, and communication systems.

The non-contact current measurement system 5600 may also include memory 5610 communicatively coupled to the processor 5604 which stores at least one of instructions or data thereon. The memory 5610 may include one or more solid state memories, for instance flash memory or solid state drive (SSD), which provide nonvolatile storage of computer-readable instructions, data structures, program modules and other data for the non-contact current measurement system 5600. Although not depicted, the non-contact current measurement system 5600 can employ other non-transitory computer- or processor-readable media, for example a hard disk drive, an optical disk drive, or memory card media drive.

The non-contact current measurement system 5600 may include a user interface 5612 which may include any number of inputs 5613 (e.g., buttons, dials, switches, touch sensor, touchscreen, trigger switches, selectors, rotary switches) and any number of outputs 5614 (e.g., display, LEDs, speakers, buzzers). Non-limiting examples of display devices include a liquid crystalline display (LCD) device, a light emitting diode (LED) device, and/or an organic light emitting diode (OLED) device. The user interface 5612 may include a touch screen, which may be any type of touch screen currently known or later developed. For example, the touch screen may be a capacitive, infrared, resistive, or surface acoustic wave (SAW) device. In implementations wherein the non-contact current measurement system 5600 includes a display, the display may presents readouts and/or waveforms indicative of at least one characteristic (e.g., magnitude, frequency) of the current flowing through the insulated wire under test.

In operation, the processor 5604 receives the sensor signals from the position feedback sensor 5608 and the current sensor 5602 to obtain clamp position and current measurements, respectively. As discussed above, the clamp position measurement is indicative of the diameter of the insulated wire under test, and the current sensor signal may be indicative of at least one characteristic (e.g., magnitude) of the current flowing through the insulated wire. As discussed above, the processor 5604 may utilize such measurements to determine at least one characteristic of the current flowing through the insulated wire under test, such as the magnitude and/or frequency of the current flowing through the insulated wire.

The processor 5604 may provide readouts of one or more of the measured or determined characteristics (e.g., current magnitude, current frequency, diameter of insulated wire), and may provide graphical representations of one or more characteristics. Such graphical representations may include waveforms, harmonic bar graphs, etc.

To communicate with one or more external processor-based devices, the non-contact current measurement system 5600 may include one or more wired and/or wireless communications interfaces 5616. Non-limiting examples of wireless communications interfaces include Wi-Fi®, Bluetooth®, Bluetooth® Low Energy, Zigbee®, 6LoWPAN®, Optical IR, wireless HART, etc. Non-limiting examples of wired communications interfaces include USB®, Ethernet, PLC, HART, MODBUS, FireWire®, Thunderbolt®, etc.

In addition to sending data to external device, in at least some implementations the non-contact current measurement system 5600 may receive at least one of data or instructions (e.g., control instructions) from an external device via the wired and/or wireless communications interface 5616.

In at least some implementations, the non-contact current measurement system 5600 may not include a display and instead may be used as a sensor to monitor electrical equipment remotely via an external processor-based device. Such processor-based device may include various types of devices, such as smartphones, tablet computers, laptop computers, wearable computers, servers, cloud computers, etc. The external processor-based device may include a display to present data gathered by the non-contact current measurement system 5600 over a period of time (e.g., minutes, hours, days, weeks).

In at least some implementations, the non-contact current measurement system may include one or more additional electrical sensors 5618 communicatively coupled to the processor 5604. Such electrical sensors 5618 may include a voltage sensor capable of sensing voltage, a resistance sensor capable of sensing resistance, a capacitive sensor capable of sensing capacitance, etc. In such implementations that include one or more additional sensors 5618, the non-contact current measurement system 5600 may function as a multimeter that provides a plurality of electrical characteristics (e.g., current, voltage, power, resistance, capacitance).

In at least some implementations, the electrical sensor 5618 may comprise a reference signal sensor that is operative to detect a thickness of the insulation of an insulated wire under test. Various example reference signal sensors are discussed above with reference to FIGS. 1A-15. In such implementations, the adjustable clamp assembly 5606 and position feedback sensor 5608 may be used to determine the overall diameter of an insulated wire, and the reference signal sensor 5618 may utilize a reference signal method, discussed above, to determine the thickness of the insulation of the insulated wire. Using the overall diameter of the insulated wire determined by the adjustable clamp assembly 5606 and position feedback sensor 5608, and the determined insulation thickness determined by the reference signal sensor 5618, the non-contact current measurement system may automatically determine the diameter of the conductor of the insulated wire, which is equal to the overall diameter of the insulated wire reduced by two times the determined insulation thickness. The determined diameter of the conductor may then be used in conjunction with the detected magnetic field to determine the magnitude of the current flowing through the insulated wire.

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one implementation, the present subject matter may be implemented via Application Specific Integrated Circuits (ASICs). However, those skilled in the art will recognize that the implementations disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

Those of skill in the art will recognize that many of the methods or algorithms set out herein may employ additional acts, may omit some acts, and/or may execute acts in a different order than specified. As an example, in at least some implementations a non-contact measurement system may not utilize a processor to execute instructions. For example, a non-contact measurement system may be hard-wired to provide some or all of the functionality discussed herein. Additionally, in at least some implementations a non-contact measurement system may not utilize a processor to cause or initiate the different functionality discussed herein.

In addition, those skilled in the art will appreciate that the mechanisms taught herein are capable of being distributed as a program product in a variety of forms, and that an illustrative implementation applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory.

The various implementations described above can be combined to provide further implementations. To the extent that they are not inconsistent with the specific teachings and definitions herein, U.S. Provisional Patent Application No. 62/421,124, filed Nov. 11, 2016, U.S. Nonprovisional patent application Ser. No. 15/345,256, filed Nov. 7, 2016, U.S. Nonprovisional patent application Ser. No. 15/412,891, filed Jan. 23, 2017, and U.S. Nonprovisional patent application Ser. No. 15/413,025, filed Jan. 23, 2017, are incorporated herein by reference, in their entirety.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A non-contact measurement system, comprising:
a housing comprising a front end;
a voltage sensor positioned proximate the front end of the housing that, in operation, senses a voltage in an insulated wire without galvanically contacting the insulated wire;
a current sensor positioned proximate the front end of the housing that, in operation, senses a current in the insulated wire without galvanically contacting the insulated wire; and
at least one processor positioned in the housing, the at least one processor operatively coupled to the voltage sensor and the current sensor, wherein in operation the at least one processor:
receives a voltage sensor signal from the voltage sensor obtained by the voltage sensor during a measurement time interval, the voltage sensor signal indicative of the voltage in the insulated wire;
receives a current sensor signal from the current sensor obtained by the current sensor during the measurement time interval, the current sensor signal indicative of the current in the insulated wire; and
determines at least one alternating current (AC) electrical parameter based at least in part on the received voltage sensor signal and current sensor signal;
an alignment feedback sensor operatively coupled to the at least one processor and positioned proximate a front end of a housing of the non-contact measurement system, in operation the alignment feedback sensor generates an alignment feedback sensor signal indicative of a present alignment of the insulated wire with respect to the voltage sensor and the current sensor; and
an indicator device operatively coupled to the at least one processor, wherein in operation the at least one processor receives the alignment feedback sensor signal from the alignment feedback sensor, and causes the indicator device to provide an alignment indication to a user of the non-contact measurement system based at least in part on the received alignment feedback sensor signal.

2. The non-contact measurement system of claim 1 wherein the current sensor comprises a magnetic field sensor.

3. The non-contact measurement system of claim 1 wherein the voltage sensor comprises one of a capacitive divider type voltage sensor, a reference signal type voltage sensor, or a multi-capacitor type voltage sensor.

4. The non-contact measurement system of claim 1 wherein the voltage sensor comprises a reference signal type voltage sensor that, in operation, senses a reference signal in the insulated wire without galvanically contacting the insulated wire, and
wherein the at least one processor receives the reference signal and determines at least one characteristic of the current flowing through the insulated wire based at least in part on the received reference signal.

5. The non-contact measurement system of claim 1 wherein the at least one AC electrical parameter comprises at least one of power, phase, frequency, harmonics, or energy.

6. The non-contact measurement system of claim 1 wherein in operation the at least one processor determines a plurality of AC electrical parameters based at least in part on the received voltage sensor signal and current sensor signal.

7. The non-contact measurement system of claim 1, further comprising a display operatively coupled to the at least one processor, in operation the at least one processor causes the display to present the at least one AC electrical parameter.

8. The non-contact measurement system of claim 7 wherein in operation the at least one processor causes the display to present at least one of a waveform or a graph associated with the at least one AC electrical parameter.

9. The non-contact measurement system of claim 1, further comprising a communications interface operatively coupled to the at least one processor, in operation the at least one processor sends, via the communications interface, data to at least one external device, the data associated with at least one of the voltage sensor signal, the current sensor signal, or the determined at least one AC electrical parameter.

10. The non-contact measurement system of claim 9 wherein the communications interface comprises a wireless communications interface operatively to wirelessly send the data to the at least one external device.

11. The non-contact measurement system of claim 9, further comprising:
at least one external device, comprising:
a display;
a communications interface that, in operation, receives the data sent by the communications interface of the non-contact measurement system; and
at least one processor operatively coupled to the display and the communications interface, in operation the at least one processor:
receives, via the communications interface, the data from the non-contact measurement system; and
causes the display to present the at least one AC electrical parameter.

12. The non-contact measurement system of claim 1 wherein the indicator device comprises at least one of a visual indicator device or an audible indicator device.

13. The non-contact voltage measurement system of claim 1 wherein the indicator device comprises at least one of a display or a plurality of lights, and in operation the at least one processor causes the indicator device to provide an alignment indication to the user that includes a plurality of colors, each of the plurality of colors corresponding to a different level of alignment of the insulated wire with respect to the voltage sensor and the current sensor.

14. The non-contact measurement system of claim 1 wherein in operation the at least one processor causes the indicator device to provide an indication of measurement accuracy based at least in part on the received alignment feedback sensor signal.

15. The non-contact measurement system of claim 1 wherein in operation the at least one processor causes the indicator device to provide an indication of an energized circuit proximate the insulated wire under test based at least in part on the received alignment feedback sensor signal.

16. A method of operating a non-contact measurement system to determine at least one alternating current (AC) electrical parameter in an insulated wire, the method comprising:

sensing, via a voltage sensor positioned in a housing of the non-contact measurement system, a voltage in the insulated wire during a measurement time interval without galvanically contacting the insulated wire;

sensing, via a current sensor positioned in the housing of the non-contact measurement system, a current in the insulated wire during the measurement time interval without galvanically contacting the insulated wire;

determining, via at least one processor positioned in the housing of the non-contact measurement system, at least one alternating current (AC) electrical parameter based at least in part on the sensed voltage and the sensed current;

receiving, from an alignment feedback sensor positioned proximate the front end, an alignment feedback sensor signal indicative of a present alignment of the insulated wire with respect to the voltage sensor and the current sensor; and causing an indicator device positioned on a surface of the housing of the non-contact measurement system to provide an alignment indication to a user of the non-contact measurement system based at least in part on the received alignment feedback sensor signal.

17. The method of claim 16 wherein sensing the voltage comprises sensing the voltage utilizing one of a capacitive divider type voltage sensor, a reference signal type voltage sensor, or a multi-capacitor type voltage sensor, and sensing the current comprises sensing the current utilizing a magnetic field sensor.

18. The method of claim 16 wherein determining at least one AC electrical parameter comprises determining at least one of power, phase, frequency, harmonics, or energy based at least in part on the sensed voltage and the sensed current.

19. The method of claim 16, further comprising:

presenting an indication of the at least one AC electrical parameter to a user of the non-contact measurement system.

20. A non-contact measurement system, comprising:

a housing comprising a front end;

a voltage sensor positioned proximate the front end that, in operation, senses a voltage in an insulated wire during a measurement time interval without galvanically contacting the insulated wire;

a current sensor positioned proximate the front end that, in operation, senses a current in the insulated wire during a measurement time interval without galvanically contacting the insulated wire;

an alignment feedback sensor positioned proximate the front end;

an indicator device positioned on a surface of the housing; and at least one processor positioned in the housing, the at least one processor communicatively coupled to the voltage sensor, the current sensor, the alignment feedback sensor, and the indicator device, wherein, in operation, the at least one processor:

determines at least one alternating current (AC) electrical parameter based at least in part on the sensed voltage and the sensed current;

receives an alignment feedback sensor signal from the alignment feedback sensor, the alignment feedback sensor indicative of a present alignment of the insulated wire with respect to the voltage sensor and the current sensor; and causes the indicator device to provide an alignment indication to a user of the non-contact measurement system based at least in part on the received alignment feedback sensor signal.

* * * * *